US011392048B2

(12) United States Patent
Shirato

(10) Patent No.: US 11,392,048 B2
(45) Date of Patent: Jul. 19, 2022

(54) EXPOSURE APPARATUS, FLAT PANEL DISPLAY MANUFACTURING METHOD, AND DEVICE MANUFACTURING METHOD

(71) Applicant: NIKON CORPORATION, Tokyo (JP)

(72) Inventor: Akinori Shirato, Sagamihara (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 16/797,602

(22) Filed: Feb. 21, 2020

(65) Prior Publication Data

US 2020/0192232 A1 Jun. 18, 2020

Related U.S. Application Data

(63) Continuation of application No. 15/763,819, filed as application No. PCT/JP2016/078842 on Sep. 29, 2016, now abandoned.

(30) Foreign Application Priority Data

Sep. 30, 2015 (JP) .............................. JP2015-194829

(51) Int. Cl.
*G03F 7/20* (2006.01)
*G01D 5/38* (2006.01)

(52) U.S. Cl.
CPC ........... *G03F 7/70775* (2013.01); *G01D 5/38* (2013.01); *G03F 7/70791* (2013.01)

(58) Field of Classification Search
CPC ............. G03F 7/70775; G03F 7/70616; G03F 7/70683; G03F 7/707; G03F 7/70716;
(Continued)

(56) References Cited

U.S. PATENT DOCUMENTS 5,610,715 A 3/1997 Yoshii et al.
5,729,331 A 3/1998 Tanaka et al.
(Continued)

FOREIGN PATENT DOCUMENTS

| JP | H07-270122 A | 10/1995 |
| TW | 201443579 A | 11/2014 |

(Continued)

OTHER PUBLICATIONS

English translation of WO2009/103743, published Aug. 27, 2009. (Year: 2009).*

(Continued)

*Primary Examiner* — Christina A Riddle
(74) *Attorney, Agent, or Firm* — Oliff PLC

(57) ABSTRACT

A liquid crystal exposure apparatus that irradiates a substrate held by a substrate holder which moves along an XY plane with an illumination light via an optical system while the substrate holder moves in the X-axis direction, has; a scale measured based on movement of the substrate holder in the X-axis direction, heads that measure the scale while relatively moving in the X-axis direction with respect to the scale, a plurality of scales arranged at mutually different positions in the X-axis direction measured based on movement of the substrate holder in the Y-axis direction, and a plurality of heads provided for each scale that measures the scales while relatively moving in the Y-axis direction with respect to the scales based on movement of the substrate in the Y-axis direction.

14 Claims, 36 Drawing Sheets

(58) Field of Classification Search
CPC .............. G03F 7/70725; G03F 7/70733; G03F 7/70758; G03F 7/70791; G03F 7/708; G03F 7/70808; G03F 7/70825; G03F 7/70833; G03F 7/7085; G01D 5/38
USPC .......... 355/52–55, 67–71, 72–77; 250/492.1, 250/492.2, 492.22, 493.1; 356/399–401, 356/614–622
See application file for complete search history.

(56) References Cited

U.S. PATENT DOCUMENTS

| | | | |
|---|---|---|---|
| 6,552,775 | B1 | 4/2003 | Yanagihara et al. |
| 6,639,686 | B1 | 10/2003 | Ohara |
| 6,761,482 | B2 | 7/2004 | Ueno |
| 2007/0223007 | A1 | 9/2007 | Klaver et al. |
| 2008/0030702 | A1 | 2/2008 | Kawamura |
| 2008/0094592 | A1 | 4/2008 | Shibazaki |
| 2008/0129762 | A1 | 6/2008 | Shiomi |
| 2009/0059194 | A1 | 3/2009 | Kanaya |
| 2009/0059198 | A1 | 3/2009 | Shibazaki et al. |
| 2009/0268178 | A1 | 10/2009 | Shibazaki |
| 2010/0018950 | A1 | 1/2010 | Aoki et al. |
| 2010/0068655 | A1 | 3/2010 | Moroe |
| 2010/0266961 | A1 | 10/2010 | Kawamura et al. |
| 2011/0026004 | A1* | 2/2011 | Van Eijk .............. G03B 27/58 355/72 |
| 2012/0057140 | A1 | 3/2012 | Aoki |
| 2012/0242969 | A1* | 9/2012 | Van Der Pasch ... G03F 7/70775 355/72 |
| 2015/0240886 | A1 | 8/2015 | Uehara et al. |
| 2015/0286147 | A1 | 10/2015 | Shibazaki |
| 2017/0108716 | A1* | 4/2017 | Shirato ................ G02F 1/1303 |

FOREIGN PATENT DOCUMENTS

| | | | | |
|---|---|---|---|---|
| WO | WO-2009103743 | A1 * | 8/2009 | ......... G01D 5/34746 |
| WO | 2014/054690 | A1 | 4/2014 | |
| WO | 2014/054692 | A1 | 4/2014 | |
| WO | WO-2014054690 | A1 * | 4/2014 | ......... H01J 37/3045 |
| WO | WO-2015147319 | A1 * | 10/2015 | ......... G02F 1/1303 |

OTHER PUBLICATIONS

Dec. 20, 2016 Written Opinion issued in International Patent Application PCT/JP2016/078842.
Dec. 20, 2016 International Search Report issued in International Patent Application PCT/JP2016/078842.
Aug. 21, 2019 Office Action issued in U.S. Appl. No. 15/763,819.
Mar. 1, 2019 Requirement for Restriction/Election issued in U.S. Appl. No. 15/763,819.
Jun. 30, 2020 Office Action issued in Taiwanese Patent Application No. 105131975.
Aug. 17, 2021 Office Action issued in Japanese Patent Application No. 2020-184460.

* cited by examiner

MASK STAGE SIDE

SUBSTRATE STAGE SIDE

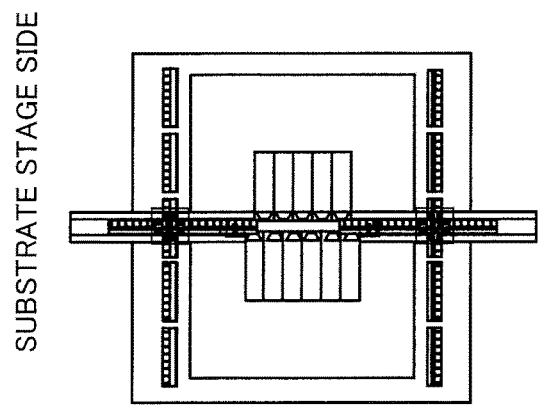
Fig. 29B MASK STAGE SIDE
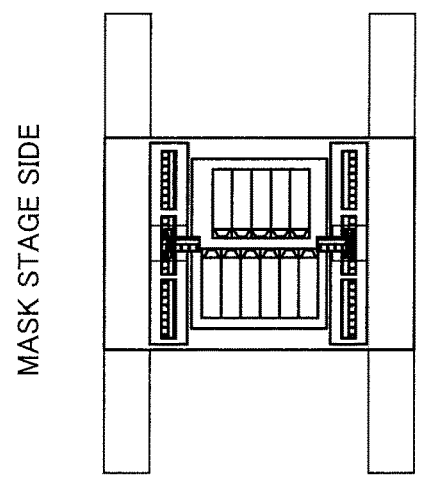
Fig. 29C SUBSTRATE STAGE SIDE
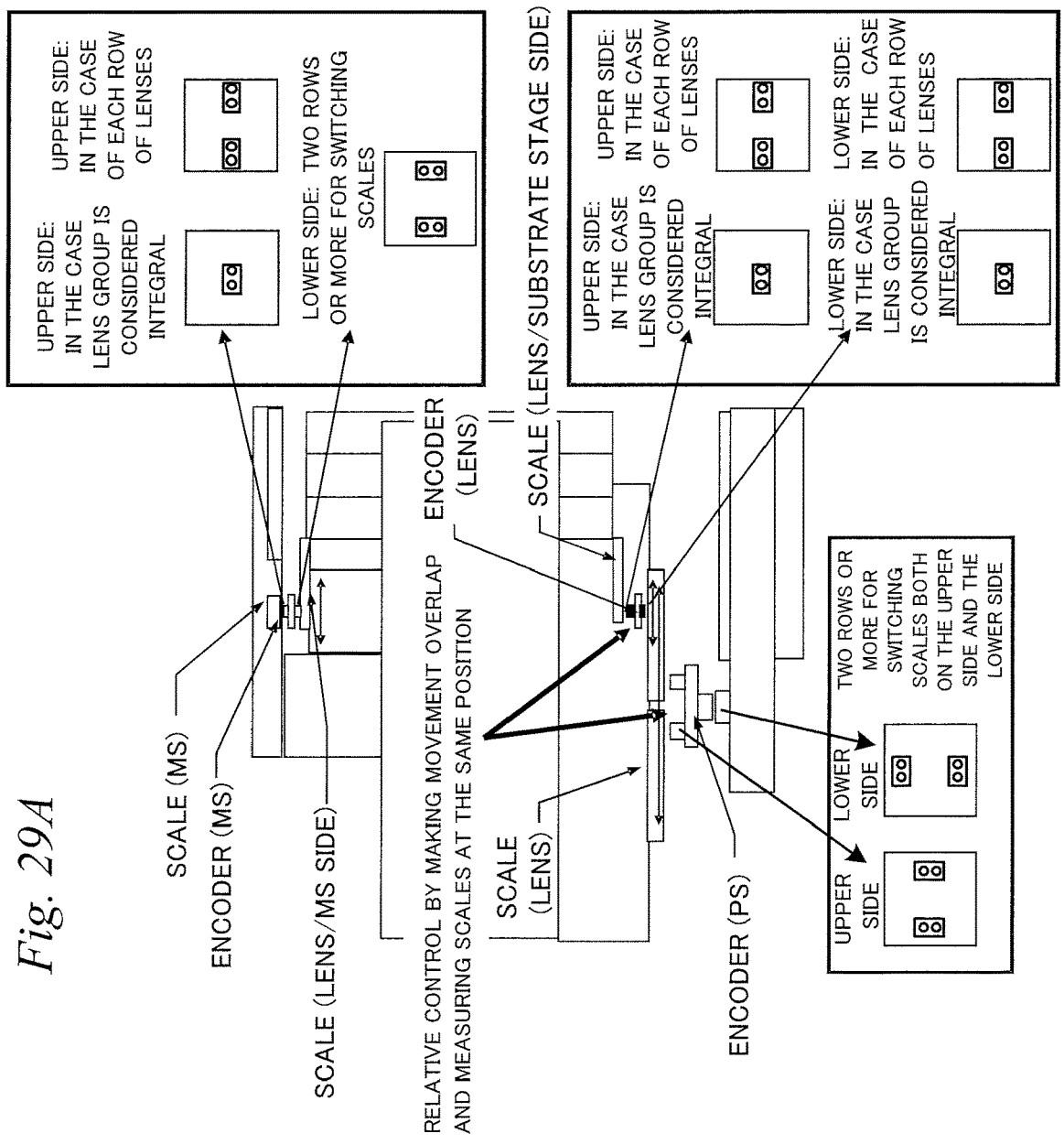
Fig. 29A

_US 11,392,048 B2_

EXPOSURE APPARATUS, FLAT PANEL DISPLAY MANUFACTURING METHOD, AND DEVICE MANUFACTURING METHOD

This is a Continuation of application Ser. No. 15/763,819 filed Aug. 31, 2018, which in turn is a PCT National Phase Application of PCT/JP2016/078842, filed Sep. 29, 2016, which claims the benefit of Japanese Patent Application No. 2015-194829, filed Sep. 30, 2015. The disclosures of the prior applications are hereby incorporated by reference herein in their entirety.

TECHNICAL FIELD

The present invention relates to exposure apparatuses, flat panel display manufacturing methods, and device manufacturing methods.

BACKGROUND ART

Conventionally, in a lithography process for producing electronic devices (micro-devices) such as a liquid crystal display device or a semiconductor device (such as an integrated circuit), exposure apparatuses are used such as an exposure apparatus of a step-and-scan method (a so-called scanning stepper (also called a scanner)) that transfers a pattern formed on a mask irradiated with an energy beam, while a mask (photomask) or a reticle (hereinafter collectively called a "mask") and a glass plate or a wafer (hereinafter collectively called a "substrate") are moved synchronously along a predetermined scanning direction (scan direction).

As this type of exposure apparatus, an exposure apparatus equipped with an optical interferometer system is known that obtains position information within a horizontal plane of a substrate subject to exposure using a bar mirror (long mirror) that a substrate stage device has (refer to PTL Here, in the case of obtaining position information of the substrate using the optical interferometer system, influence of the so-called air fluctuation cannot be ignored. While the influence of air fluctuation mentioned above can be reduced using an encoder system, due to the increasing size of substrates in recent years, it is becoming difficult to prepare a scale that can cover the entire moving range of the substrate.

CITATION LIST

Patent Literature

[PTL 1] U.S. Patent Application Publication No. 2010/0266961

SUMMARY OF INVENTION

According to a first aspect of the present invention, there is provided an exposure apparatus that irradiates an object held by a movable body which moves in a first direction and a second direction orthogonal to each other with an illumination light via an optical system, while the movable body is moving in the first direction, comprising: a first measured section measured based on movement of the movable body in the first direction; a first measuring section measuring the first measured section while relatively moving in the first direction with respect to the first measured section, based on movement of the movable body in the first direction; a plurality of second measured sections arranged at different positions in the first direction, being measured based on movement of the movable body in the second direction; and a plurality of second measuring sections arranged at each of the plurality of second measured sections that measures the second measured sections while relatively moving in the second direction with respect to the second measured section, based on movement of the movable body in the second direction.

According to a second aspect of the present invention, there is provided an exposure apparatus that irradiates an object held by a movable body which moves in a first direction and a second direction orthogonal to each other with an illumination light via an optical system, while the movable body is moving in the first direction, comprising: a plurality of measured sections arranged at positions different in the first direction measured based on movement of the movable body in the second direction to obtain position information in the second direction of the movable body; and a plurality of measuring sections provided at each of the plurality of measured sections that measures the measured sections while relatively moving in the second direction with respect to the measured section, based on movement of the object in the second direction.

According to a third aspect of the present invention, there is provided an exposure apparatus that irradiates an object held within a plane including a first direction and a second direction orthogonal to each other movable in the first direction and the second direction with an illumination light via an optical system, while the object is moved in the first direction, comprising: a plurality of measured sections arranged at positions different in the first direction measured based on movement of the object in the second direction to obtain position information in the second direction of the object; and a plurality of measuring sections provided at each of the plurality of measured sections that measures the measured sections while relatively moving in the second direction with respect to the measured section, based on movement of the object in the second direction.

According to a fourth aspect of the present invention, there is provided an exposure apparatus that irradiates an object held by a movable body which moves in a first direction and a second direction orthogonal to each other with an illumination light via an optical system, while the movable body is moving in the first direction, comprising: a first measured section measured based on movement of the movable body in the first direction; and a first measuring section measuring the first measured section while relatively moving in the first direction with respect to the first measured section, based on movement of the movable body in the first direction when being arranged facing the first measured section, wherein the first measuring section includes a plurality of first measuring sections that moves in the second direction based on movement of the movable body in the second direction and is arranged facing the first measured section at different positions in the second direction.

According to a fifth aspect of the present invention, there is provided an exposure apparatus that irradiates an object held by a movable body which moves in a first direction and a second direction orthogonal to each other with an illumination light via an optical system, while the movable body is moving in the first direction, comprising: a plurality of first measured sections arranged at different positions in the second direction, being measured based on movement of the movable body in the first direction; and a plurality of first measuring sections that measures the first measured sections while relatively moving in the first direction with respect to the first measured sections, based on movement of the movable body in the first direction, at a position to measure the plurality of first measured sections.

According to a sixth aspect of the present invention, there is provided an exposure apparatus that irradiates an object held by a movable body which moves in a first direction and a second direction orthogonal to each other with an illumination light via an optical system, while the movable body is moving in the first direction, comprising: a measured section measured based on movement of the movable body in the first direction; and a measuring section measuring the measured section while relatively moving in the first direction with respect to the measured section, based on movement of the movable body in the first direction when being arranged facing the measured section, wherein the measured section is movable to a first position and a second position different from each other in the second direction, and the measuring section includes a first measuring section arranged facing the measured section which has moved to the first position, and a second measuring section arranged facing the measure section which has moved to the second position.

According to a seventh aspect of the present invention, there is provided a making method of a flat panel display, comprising: exposing the object using the exposure apparatus according to any one of the first one to sixth aspects, and developing the object which has been exposed.

According to an eighth aspect of the present invention, there is provided a device manufacturing method, comprising: exposing the object using any one of the exposure apparatus according to any one of the first to sixth aspects; and developing the object which has been exposed.

BRIEF DESCRIPTION OF DRAWINGS

FIGS. 29A to 29C are views showing a concrete example of a relative position measurement system between the substrate encoder system and the mask encoder system, based on the second concept (No. 2).

DESCRIPTION OF EMBODIMENTS

First Embodiment

Hereinafter, a first embodiment will be described, using FIGS. 1 to 17B.

Figure 1:
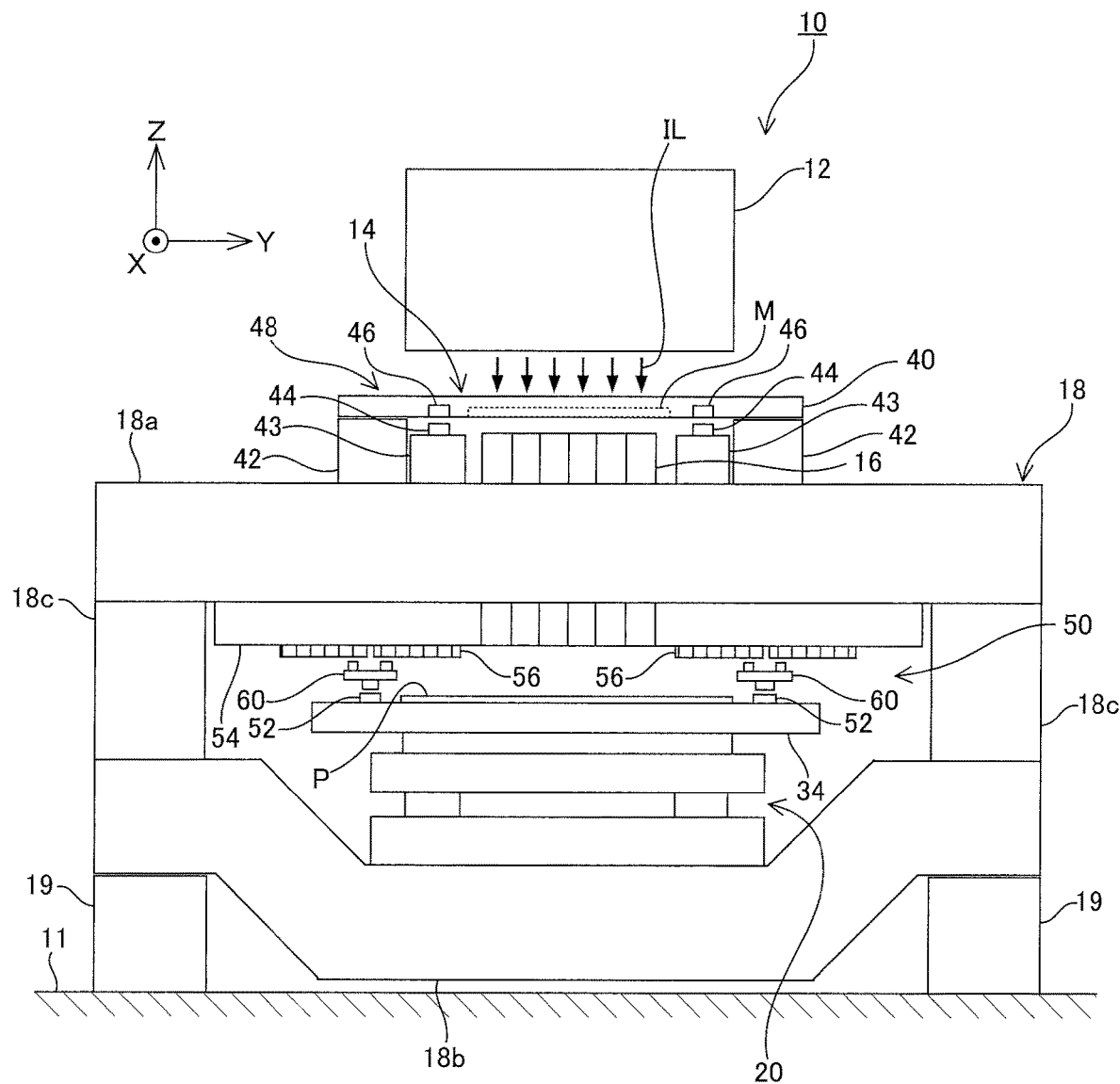
FIG. 1 is a view schematically showing a structure of a liquid crystal exposure apparatus according to a first embodiment.

FIG. 1 schematically shows a structure of a liquid crystal exposure apparatus 10 according to the first embodiment. Liquid crystal exposure apparatus 10 is a projection exposure apparatus of a step-and-scan method, or a so-called scanner whose exposure target is a rectangular (square-shaped) glass substrate P (hereinafter simply referred to as substrate P) used in, for example, a liquid crystal display device (flat panel display) or the like.

Liquid crystal exposure apparatus 10 has an illumination system 12, a mask stage device 14 that holds a mask M on which a circuit pattern and the like is formed, a projection optical system 16, an apparatus main section 18, a substrate stage device 20 that holds substrate P whose surface (a surface facing a +Z side in FIG. 1) is coated with a resist (sensitive agent), a control system for these parts and the like. In the description below, a direction in which mask M and substrate P are relatively scanned with respect to projection optical system 16 at the time of exposure will be described as an X-axis direction, a direction orthogonal to the X-axis within a horizontal plane will be described as a Y-axis direction, a direction orthogonal to the X-axis and the Y-axis will be described as a Z-axis direction, and rotation directions around the X-axis, the Y-axis, and the Z-axis will be described as θx, θy, and θz directions, respectively. Also, positions in the X-axis, the Y-axis, and the Z-axis directions will each be described as an X position, a Y position, and a Z position, respectively.

Illumination system 12 is structured similarly to the illumination system disclosed in, for example, U.S. Pat. No. 5,729,331 and the like. Illumination system 12 irradiates mask M with a light emitted from a light source not shown (e.g., a mercury lamp) serving as an exposure illumination light (illumination light) IL, via parts not shown such as a reflection mirror, a dichroic mirror, a shutter, a wavelength selection filter, and various kinds of lenses. As illumination light IL, light such as an i-line (wavelength 365 nm), a g-line (wavelength 436 nm), or an h-line (wavelength 405 nm) (or a synthetic light of the i-line, the g-line, and the h-line described above) is used.

Mask stage device 14 includes a mask holder 40 that holds mask M by vacuum chucking, a mask driving system 91 (not illustrated in FIG. 1, refer to FIG. 7) that drives mask holder 40 in a scanning direction (the X-axis direction) in predetermined long strokes as well as finely drive mask holder 40 appropriately in the Y-axis direction and the θz direction, and a mask position measurement system that obtains position information (including rotation amount information in the θz direction; the same hereinafter) of mask holder 40 within the XY plane. Mask holder 40 consists of a frame shaped member in which an opening section in a rectangular shape in a planar view is formed, as is disclosed in, for example, U.S. Patent Application Publication No. 2008/0030702. Mask holder 40 is mounted on a pair of mask guides 42 fixed to an upper mount section 18a, which is a part of apparatus main section 18, via an air bearing (not shown). Mask drive system 91 includes a linear motor (not shown).

The mask position measurement system is equipped with a mask encoder system 48 including a pair of encoder head units 44 (hereinafter simply referred to as a head unit 44) fixed to an upper mount section 18a via an encoder base 43, and a plurality of encoder scales 46 (overlapping in a depth direction of the page surface in FIG. 1, refer to FIG. 2A) arranged at a lower surface of mask holder 40 corresponding to the pair of head units 44 described above. The structure of mask encoder system 48 will be described in detail later in the description.

Projection optical system 16 is placed below mask stage device 14. Projection optical system 16 is a so-called multi-lens projection optical system having a structure similar to the projection optical system disclosed in U.S. Pat. No. 6,552,775 and the like, and is equipped with a plurality of (11 in the embodiment; refer to FIG. 2A) optical systems which forms an upright normal image with a double telecentric equal magnifying system.

In liquid crystal exposure apparatus 10, when an illumination area on mask M is illuminated with illumination light IL from illumination system 12, by the illumination light having passed mask M, a projection image (partial upright image) of the circuit pattern of mask M within the illumination area is formed on an irradiation area (exposure area) of the illumination light on substrate P conjugate with the illumination area, via projection optical system 16. And, by substrate P being relatively moved in the scanning direction with respect to the exposure area (illumination light IL) along with mask M being relatively moved in the scanning direction with respect to the illumination area (illumination light IL), scanning exposure of a shot area on substrate P is performed, and the pattern formed on mask M is transferred onto the shot area.

Apparatus main section 18 supports mask stage device 14 described above and projection optical system 16, and is installed on a floor 11 of a clean room via a plurality of vibration isolation devices 19. Apparatus main section 18 is structured similarly to the apparatus main section disclosed in U.S. Patent Application Publication No. 2008/0030702, and has upper mount section 18a (also called an optical surface plate) that supports projection optical system 16 described above, a lower mount section 18b where substrate stage device 20 is arranged, and a pair of middle mount sections 18c.

Substrate stage device 20 is a device used to position substrate P with high precision with respect to projection optical system 16 (exposure light IL), and moves substrate P in predetermined strokes along the horizontal plane (the X-axis direction and the Y-axis direction), along with finely moving substrate P in directions of six degrees of freedom. While the structure of substrate stage device 20 is not limited in particular, a stage device of a so-called coarse/fine movement structure is preferably used, including a gantry type two-dimensional coarse movement stage and a fine movement stage finely moved with respect to the two-dimensional coarse movement stage, as is disclosed in U.S. Patent Application Publication No. 2008/129762, U.S. Patent Application Publication No. 2012/0057140 and the like.

Substrate stage device 20 is equipped with a substrate holder 34. Substrate holder 34 consists of a plate-like member having a rectangular shape in a planar view, and substrate P is mounted on its upper surface. Substrate holder 34 is moved in the X-axis direction and/or the Y-axis direction with respect to projection optical system 16 in predetermined long strokes and is also finely moved in directions of six degrees of freedom, by a plurality of linear motors (e.g., voice coil motors) structuring a part of a substrate drive system 93 (not shown in FIG. 1, refer to FIG. 7).

Figure 7:
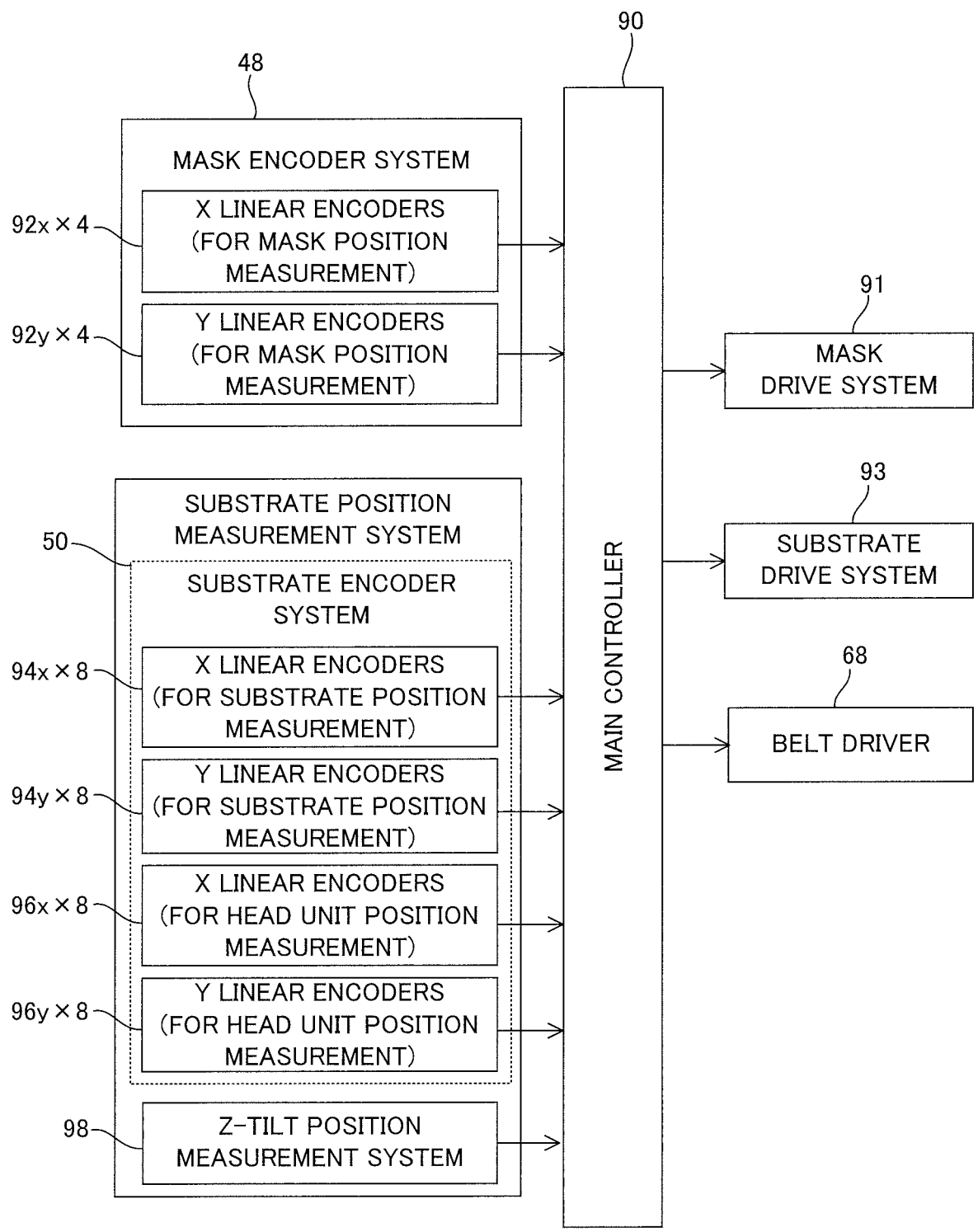
FIG. 7 is a block diagram showing an input/output relation of a main controller that mainly structures a control system of the liquid crystal exposure apparatus.

Also, liquid crystal exposure apparatus 10 has a substrate position measurement system for measuring position information of substrate holder 34 (namely, substrate P) in directions of six degrees of freedom. The substrate position measurement system includes a Z tilt position measurement system 98 for acquiring position information of substrate P in the Z-axis, the θx, and θy directions (hereinafter referred to as Z tilt direction), and a substrate encoder system 50 for acquiring position information of substrate P in the XY plane, as is shown in FIG. 7. While the structure of Z tilt position measurement system 98 is not limited in particular, a measurement system can be used that obtains position information of substrate P in the Z tilt direction with apparatus main section 18 (lower mount section 18b) serving as a reference, using a plurality of sensors attached to a system including substrate holder 34, as is disclosed in U.S. Patent Application Publication No. 2010/0018950 and the like. The structure of substrate encoder system 50 will be described later in the description.

Next, the structure of mask encoder system 48 will be described, using FIGS. 2A and 2B. As is typically shown in FIG. 2A, in areas on the +Y side and the −Y side of mask M (more specifically, an opening section not shown for housing mask M) in mask holder 40, a plurality of encoder scales 46 (hereinafter will be simply referred to as scales 46) is placed. Note that to facilitate understanding, while the plurality of scales 46 are illustrated in a solid line placed on the upper surface of mask holder 40, the plurality of scales 46 are actually placed at the lower surface side of mask holder 40 so that the Z position of the lower surface of each of the plurality of scales 46 coincides with the Z position of the lower surface (pattern surface) of mask M, as is shown in FIG. 1.

In mask holder 40 of the embodiment, in the areas on the +Y side and the −Y side of the mounting area of mask M, three scales 46 are arranged in the X-axis direction at a predetermined spacing. That is, mask holder 40 has a total of six scales 46. Each of the plurality of scales 46 is substantially identical, except for the point that the scales are arranged symmetrically in the vertical direction of the page surface on the +Y side and the −Y side of mask M. Scale 46 consists of a plate-shaped (strip-shaped) member rectangular in a planar view extending in the X-axis direction, made of quartz glass. Mask holder 40 is formed of ceramics, and the plurality of scales 46 is fixed to mask holder 40.

Figure 2A:
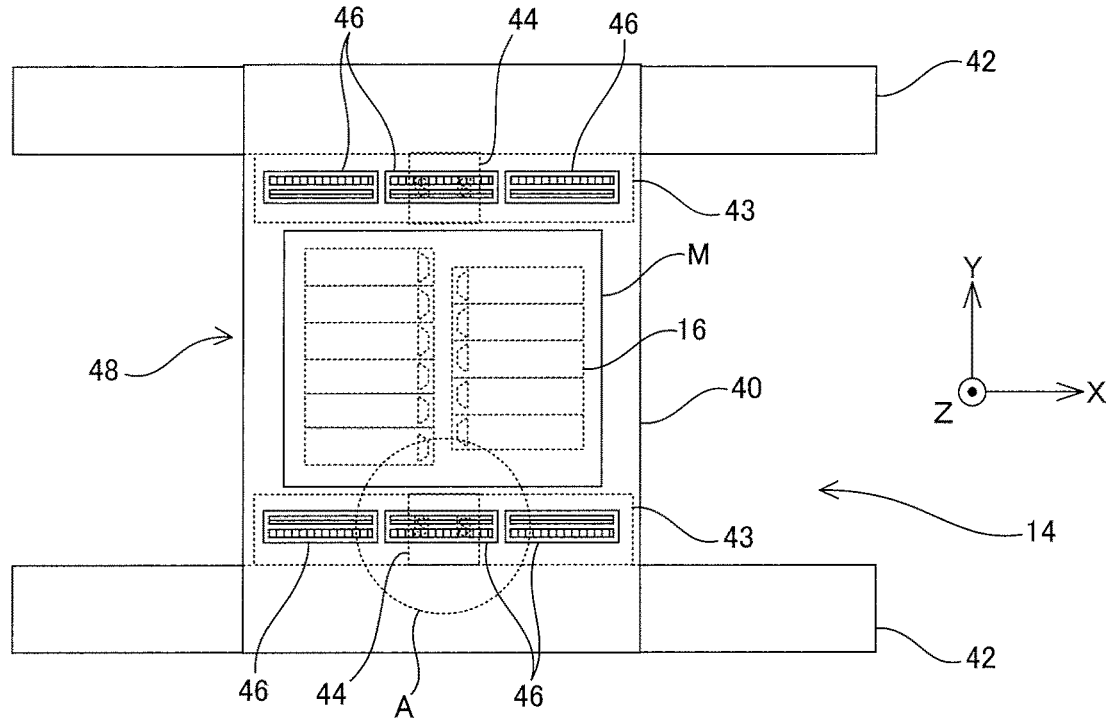
FIG. 2A is a view schematically showing a structure of a mask encoder system that the liquid crystal exposure apparatus in FIG. 1 is equipped with, and FIG. 2B is an enlarged view of a part of the mask encoder system (part A in FIG. 2A).
Figure 2B:
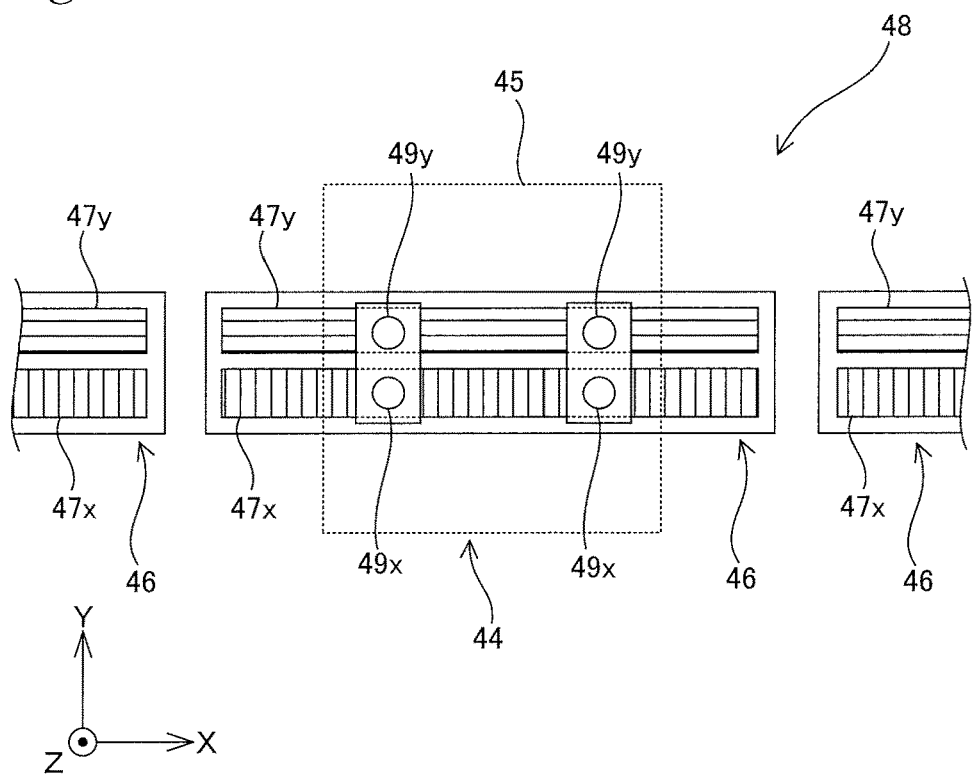

As is shown in FIG. 2B, on the lower surface (a surface facing the −Z side in the embodiment) of scale 46 at an area on one side in the width direction (the −Y side in FIG. 2B), an X scale 47x is formed. Also, on the lower surface of scale 46 at an area on the other side in the width direction (the +Y side in FIG. 2B), a Y scale 47y is formed. X scale 47x is structured by a reflective diffraction grating (an X grating) having a plurality of grid lines (one-dimensional gratings) extending in the Y-axis direction formed at a predetermined pitch in the X-axis direction (the X-axis direction serving as a periodic direction). Similarly, Y scale 47y is structured by a reflective diffraction grating (a Y grating) having a plurality of grid lines (one-dimensional gratings) extending in the X-axis direction formed at a predetermined pitch in the Y-axis direction (the Y-axis direction serving as a periodic direction). In X scale 47x and Y scale 47y of the embodiment, the plurality of grid lines is formed at a spacing of 10 nm or less. Note that in FIGS. 2A and 2B, for convenience of illustration, the spacing (pitch) between the grids is shown much wider than the actual spacing. The same applies to other drawings as well.

Also, as is shown in FIG. 1, a pair of encoder bases 43 is fixed on the upper surface of upper mount section 18a. The pair of encoder bases 43 is placed so that one of the pair is at the −X side of mask guide 42 on the +X side, and the other is at the +X side of mask guide 42 on the −X side (that is, placed in the area between the pair of mask guides 42). Also, a part of projection optical system 16 described above is arranged in between the pair of encoder bases 43. Encoder base 43, as is shown in FIG. 2A, consists of a member extending in the X-axis direction. Encoder head unit 44 (hereinafter simply referred to as head unit 44) is fixed in the center in the longitudinal direction to each of the pair of encoder bases 43. That is, head unit 44 is fixed to apparatus main section 18 (refer to FIG. 1), via encoder base 43. Since the pair of head units 44 is substantially identical, except for the point that the head units are arranged symmetrically in the vertical direction of the page surface on the +Y side and the −Y side of mask M, the description below is on only one of the head units (on the −Y side).

As is shown in FIG. 2B, head unit 44 has a unit base 45 consisting of a plate-shaped member having a rectangular shape in a planar view. Fixed to unit base 45 are a pair of X heads 49x arranged separately to each other in the X-axis direction and a pair of Y heads 49y arranged separately to each other in the X-axis direction. That is, mask encoder system 48 has a total of four X heads 49x, as well as a total of four Y heads 49y. Note that in FIG. 2B, while one of X head 49x and one of Y head 49y are housed together in a housing and the other of X head 49x and the other of Y head 49y are housed together in another housing, the pair of X heads 49x and the pair of Y heads 49y may each be arranged independently. Also, in FIG. 2B, to facilitate understanding, while the pair of X heads 49x and the pair of Y heads 49y are illustrated to be arranged above (the +Z side of) scale 46, the pair of X heads 49x is actually arranged below X scale 47x and the pair of Y heads 49y is actually arranged below Y scale 47y (refer to FIG. 1).

The pair of X heads 49x and the pair of Y heads 49y are fixed to unit base 45 so that the distance between the pair of X heads 49x and the distance between the pair of Y heads 49y do not change due to vibration or the like. Also, unit base 45 itself is also formed of a material whose coefficient of thermal expansion is lower than scale 46 (or is about the same as scale 46), so that the distance between the pair of X heads 49x and the distance between the pair of Y heads 49y do not change due to temperature change or the like.

X head 49x and Y head 49y are encoder heads of a so-called diffraction interference method as is disclosed in, for example, U.S. Patent Application Publication No. 2008/0094592 that irradiate corresponding scales (X scale 47x, Y scale 47y) with measurement beams, and by receiving the beams from the scales, supply displacement amount information of mask holder 40 (namely mask M; refer to FIG. 2A) to main controller 90 (refer to FIG. 7). That is, in mask encoder system 48, four X heads 49x and X scale 47x (differs depending on the X position of mask holder 40) facing the X heads 49x structure four X linear encoders 92x (not shown in FIG. 2B, refer to FIG. 7) for obtaining position information of mask M in the X-axis direction, and four Y heads 49y and Y scale 47y (differs depending on the X position of mask holder 40) facing the Y heads 49y structure four Y linear encoders 92y (not shown in FIG. 2B, refer to FIG. 7) for obtaining position information of mask M in the Y-axis direction.

Main controller 90, as is shown in FIG. 7, obtains position information of mask holder 40 (refer to FIG. 2A) in the X-axis direction and the Y-axis direction, based on an output of four X linear encoders 92x and four Y linear encoders 92y, at a resolution of, for example, 10 nm or less. Also, main controller 90 obtains θz position information (rotation amount information) of mask holder 40, based on an output of at least two of the four X linear encoders 92x (or four Y linear encoders 92y). Main controller 90 controls the position in the XY plane of mask holder 40 using mask drive system 91, based on position information within the XY plane of mask holder 40 obtained from measurement values of mask encoder system 48 described above.

Here, as is shown in FIG. 2A, in mask holder 40 as is described above, in each of the areas on the +Y side and the −Y side of mask M, three scales 46 are arranged in the X-axis direction at a predetermined spacing.

And, in mask stage device 14 of the embodiment, as is shown in FIG. 2B, the spacing between each of the pair of X heads 49x and the pair of Y heads 49y that one head unit 44 has is set larger than scales 46 adjacent to each other. This allows at least one head of the pair of X heads 49x to constantly face X scale 47x and at least one head of the pair of Y heads 49y to constantly face Y scale 47y in mask encoder system 48. Accordingly, mask encoder system 48 can supply position information of mask holder 40 (refer to FIG. 2A) to main controller 90 (refer to FIG. 7) without the position information being cut off.

To describe this specifically, in the case mask holder 40 (refer to FIG. 2A) moves to the +X side, mask encoder system 48 goes through; a first state (the state shown in FIG. 2B) in which the pair of heads 49x both face X scale 47x on the +X side of the adjacent pair of X scales 47x, a second state in which X head 49x on the −X side faces an area between the above adjacent pair of X scales 47x (facing neither of the X scales 47x) and X head 49x on the +X side faces X scale 47x on the +X side, a third state in which X head 49x on the −X side faces X scale 47x on the −X side and X head 49x on the +X side faces X scale 47x on the +X side, a fourth state in which X head 49x on the −X side faces X scale 47x on the −X side and X head 49x on the +X side faces an area between a pair of X scales 47x (facing neither of the X scales 47x), and a fifth state in which the pair of heads 49x both face X scale 47x on the −X side, in the order described above. Accordingly, at least one of the X heads 49x constantly faces X scale 47x.

Main controller 90 (refer to FIG. 7), in the first state, the third state, and the fifth state described above, obtains X position information of mask holder 40, based on an average value of the output of the pair of X heads 49x. Also, main controller 90, in the second state described above, obtains X position information of mask holder 40, based on only the output of X head 49x on the +X side, and in the fourth state described above, obtains X position information of mask holder 40, based on only the output of X head 49 on the −X side. Accordingly, measurement values of mask encoder system. 48 are not cut off.

More specifically, with mask encoder system 48 of the embodiment, in order to avoid the measurement values of mask encoder system 48 from being cut off, a linkage process is performed on the output of the heads when the state moves between the first, the third and the fifth states described above, namely the state in which both heads of the pair face the scale and the output is supplied from each of the heads of the pair, and the second and the fourth states, namely the state in which only one of the heads of the pair faces the scale and the output is supplied from only one of the heads of the pair. The linkage process of the heads will be described below, using FIGS. 16A to 16E. Note that to simplify the description, in FIGS. 16A to 16E, a two-dimensional grating (grating) is to be formed on scale 46. Also, the outputs of each of the heads 49X and 49Y are to be ideal values. Also, in the description below, while the linkage process of the pair of X heads 49X that are adjacent (to be referred to as $49X_1$ and $49X_2$ for convenience) will be described, a similar linkage process is performed also on the pair of Y heads 49Y that are adjacent (to be referred to as $49Y_1$ and $49Y_2$ for convenience).

Figure 16A:
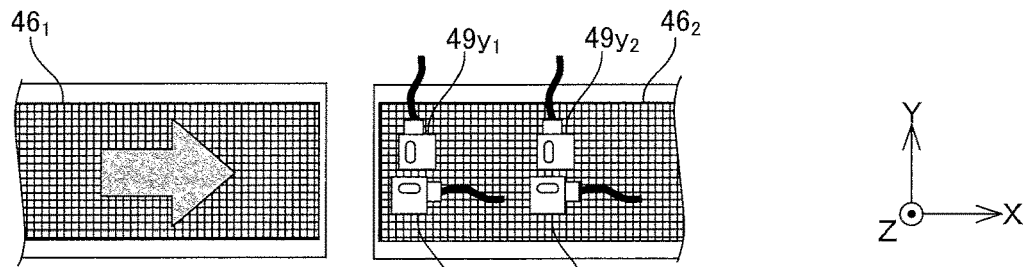
FIGS. 16A to 16E are views (No. 1 to No. 5) used to explain a linkage process of head outputs in the mask encoder system and the substrate encoder system.
Figure 16B:
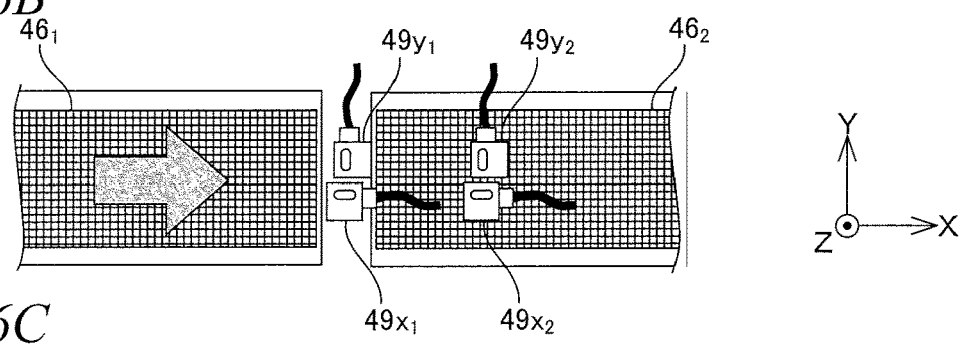

As is shown in FIG. 16A, in the case each of the pair of X heads $49X_1$ and $49X_2$ obtain X position information of mask holder 40 (refer to FIG. 2A) using, of the pair of scales 46 that are adjacent (referred to as $46_1$ and $46_2$ for convenience), scale $46_2$ on the +X side, the pair of X heads $49X_1$ and $49X_2$ both output X coordinate information. Here, the outputs of the pair of X heads $49X_1$ and $49X_2$ become the same value. Next, because X head $49X_1$ moves outside the measurement range of scale $46_2$ when mask holder 40 is moved in the +X direction as is shown in FIG. 16B, the output of X head $49X_1$ is invalidated before X head $49X_1$ moves outside the measurement range. Accordingly, the X position information of mask holder 40 is obtained based only on the output of X head $49X_2$.

Figure 16C:
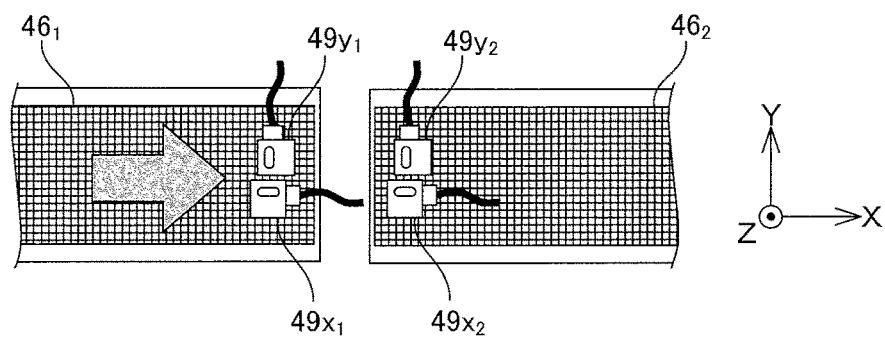

Also, when mask holder 40 (refer to FIG. 2A) is moved further in the +X direction as is shown in FIG. 16C, X head $49X_1$ faces scale $46_1$ on the −X side. While X head $49X_1$ outputs the X position information of mask holder 40 immediately after measurement becomes possible using scale $46_1$, because counting is resumed from an undefined value (or zero) for the output of X head $49X_1$, the output cannot be used for calculating the X position information of mask holder 40. Accordingly, in this state, linkage process of each of the outputs of the pair of X heads $49X_1$ and $49X_2$ becomes required. As the linkage process, specifically, a process is performed to correct the output of X head $49X_1$ regarded as an undefined value (or zero) using the output of X head $49X_2$ (so that the output becomes the same value as that of X head $49X_2$). The linkage process is completed before mask holder 40 further moves in the +X direction and X head $49X_2$ moves outside the measurement range of scale $46_2$, as is shown in FIG. 16D.

Figure 16D:
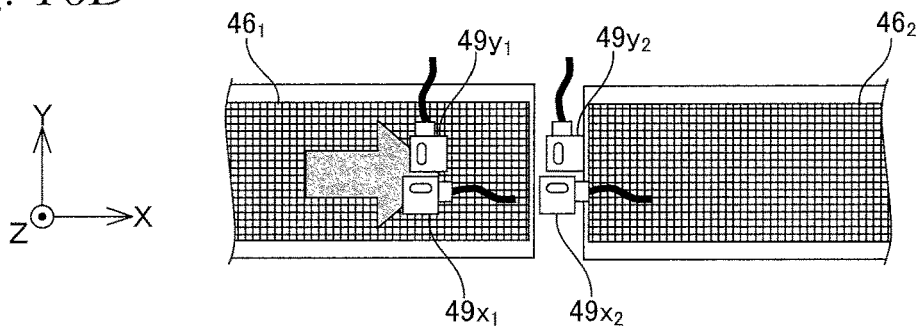
Figure 16E:
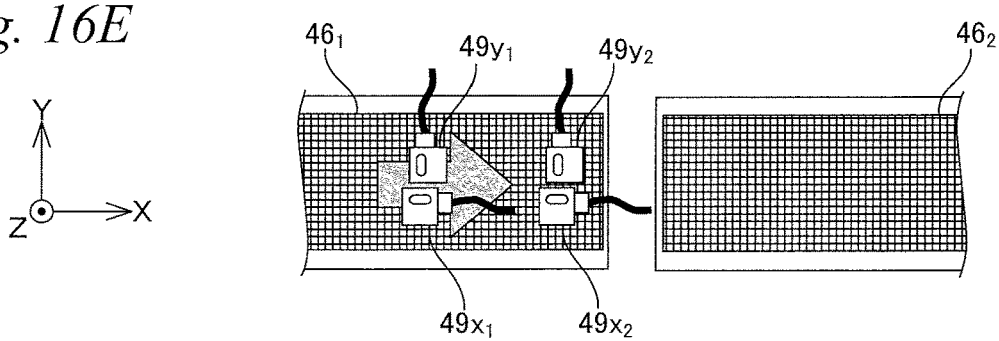

Similarly, as is shown in FIG. 16D, in the case X head $49X_2$ moves outside the measurement range of scale $46_2$, the output of X head $49X_2$ is invalidated before X head $49X_2$ moves outside the measurement range. Accordingly, the X position information of mask holder 40 (refer to FIG. 2A) is obtained based only on the output of X head 49$X_1$. Then, the linkage process using the output of X head 49$X_1$ is performed with respect to X head 49$X_2$, immediately after mask holder 40 is moved further in the +X direction and measurement becomes possible with each of the pair of X heads 49$X_1$ and 49$X_2$ using scale 46$_1$ as is shown in FIG. 16E. Hereinafter, the X position information of mask holder 40 is obtained, based on the outputs of each of the pair of X heads 49$X_1$ and 49$X_2$.

Next, a structure of substrate encoder system 50 will be described. Substrate encoder system 50, as is shown in FIG. 1, is equipped with a plurality of encoder scales 52 (overlapping in the depth of the page surface in FIG. 1, refer to FIG. 3A) arranged at substrate stage device 20, a plurality of (two, in the embodiment) encoder bases 54 fixed to the lower surface of upper mount section 18a, a plurality of encoder scales 56 fixed to the lower surfaces of encoder bases 54, and a plurality of (two for one encoder base 54, in the embodiment) encoder head units 60 (hereinafter simply referred to as head units 60). Note that since the two encoder bases 54 are overlapping in a depth direction of the page surface (the X-axis direction) in FIG. 1, encoder base 54 on the −X side is hidden in the depth side of the page surface of encoder base 54 on the +X side. Similarly, the two head units 60 corresponding to encoder base 54 on the −X side are hidden in the depth side of the page surface of the two head units 60 corresponding to encoder base 54 on the +X side.

The plurality of (two) encoder bases 54 is arranged at positions different from each other in the X-axis direction. In FIG. 3A, the two encoder bases 54 are arranged separately in the X-axis direction. In the embodiment, by providing one each of the two encoder bases 54 at two lens modules (a first lens module structured by five projection lenses on the right side and a second lens module structure by six projection lenses on the left side in FIG. 3A) structuring projection optical system 16, the two encoder bases 54 are arranged separately.

Note that the arrangement of the two encoder bases is not limited to this. For example, each of the encoder bases 54 is preferably arranged at a position near the projection center (the center of the entire illumination light emitted from the first lens module and the second lens module) of projection optical system 16 to reduce Abbe error of the encoder system consisting of scale 56 provided on each of the encoder bases 54 and head unit 60 for measuring the scales. In the case of FIG. 3A, when the two encoder bases 52 are moved approaching each other in the X-axis direction toward the center of the projection area of projection optical system 16 in FIG. 3A, one of the encoder base 54 is arranged at a position partly overlapping (in the X-axis direction) the emitting area of illumination light from the first lens module, and the other of the encoder base 54 is arranged at a position partly overlapping (in the X-axis direction) the emitting area of illumination light from the second lens module. For example, in the case encoder bases 54 are closest to each other, the encoder bases will be in a state in contact with each other in the X-axis direction.

As is shown modeled in FIG. 3A, in substrate stage device 20 of the embodiment, in each of the areas on the +Y side and on the −Y side of substrate P, four encoder scales 52 (hereinafter simply referred to as scales 52) are arranged at a predetermined spacing in the X-axis direction. That is, substrate stage device 20 has a total of eight scales 52. Each of the plurality of scales 52 is substantially identical, except for the point that the scales are arranged symmetrically in the vertical direction of the page surface on the +Y side and the −Y side of substrate P. Scale 52, similarly to scale 46 (each refer to FIG. 2A) of mask encoder system 48 described above, consists of a rectangular plate-shaped (strip-shaped) member in a planar view extending in the X-axis direction, made of quartz glass.

Note that in the embodiment, while the case is described when the plurality of scales 52 is fixed to the upper surface of substrate holder 34, the position arranged of the plurality of scales 52 is not limited to this, and for example, may be arranged separately (however, moving integrally with substrate holder 34 in directions of six degrees of freedom) on the outer side of substrate holder 34 in a state with a predetermined gap between substrate holder 34.

Figure 3B:
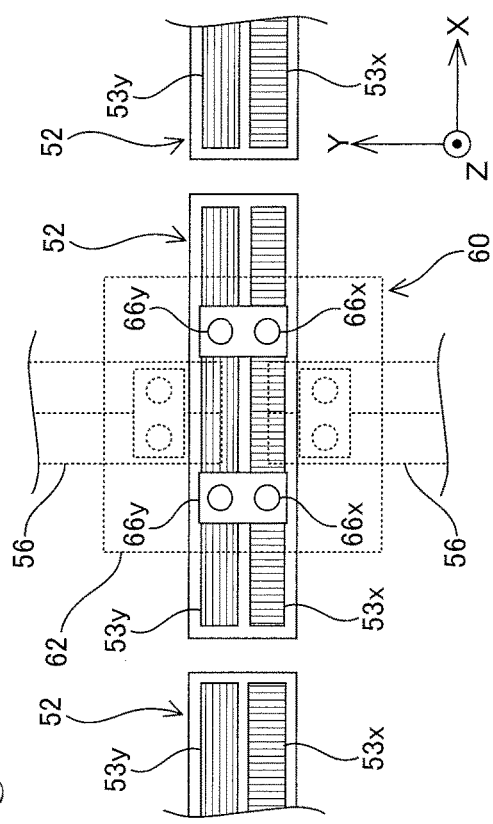
FIG. 3A is a view schematically showing a structure of a substrate encoder system that liquid crystal exposure apparatus in FIG. 1 is equipped with, and FIGS. 3B and 3C are enlarged views of a part of the substrate encoder system (section B in FIG. 3A).

As shown in FIG. 3B, X scales 53x are formed on one side (the −Y side in FIG. 3B) of the width direction in areas on the upper surface of scales 52. Also, Y scales 53y are formed on the other side (the +Y side in FIG. 3B) of the width direction in areas on the upper surface of scales 52. Since the structure of X scales 53x and Y scales 53y is the same as X scales 47x and Y scales 47y (each refer to FIG. 2B) formed on scales 46 (each refer to FIG. 2A) of mask encoder system 48 described above, the description thereabout will be omitted.

Referring back to FIG. 3A, the two encoder bases 54 (and the corresponding two head units 60) are arranged separately in the X-axis direction. Since the structure of the two encoder bases 54 is substantially the same except for the point that the arrangement is different, in the description below, one of the encoder base 54 and the pair of head units 60 corresponding to encoder base 54 will be described.

Figure 3A:
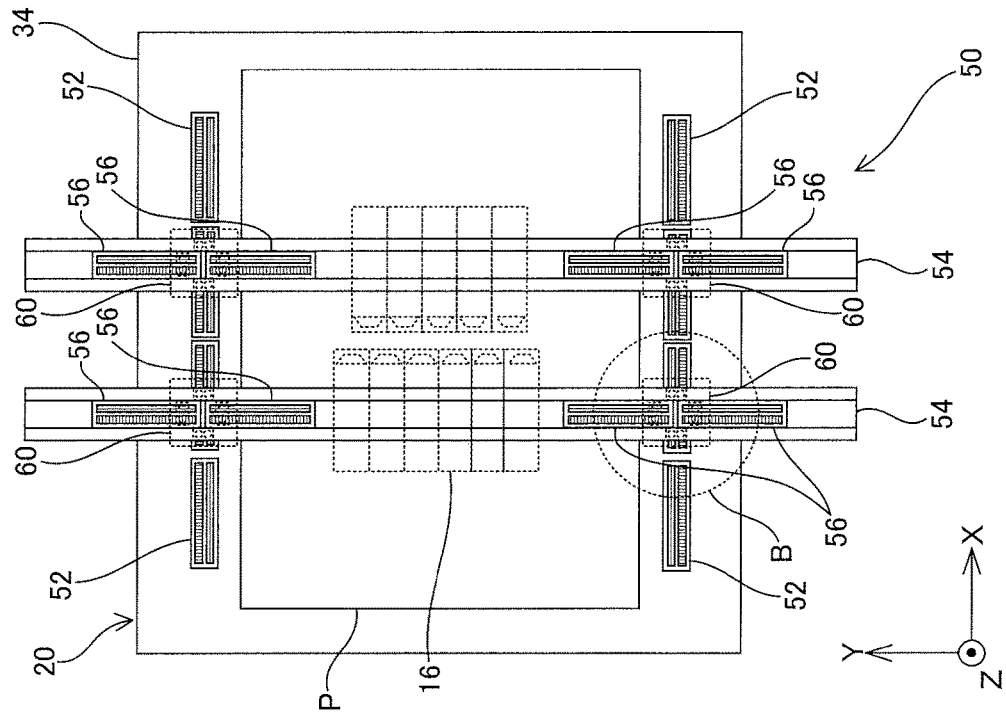
Figure 4:
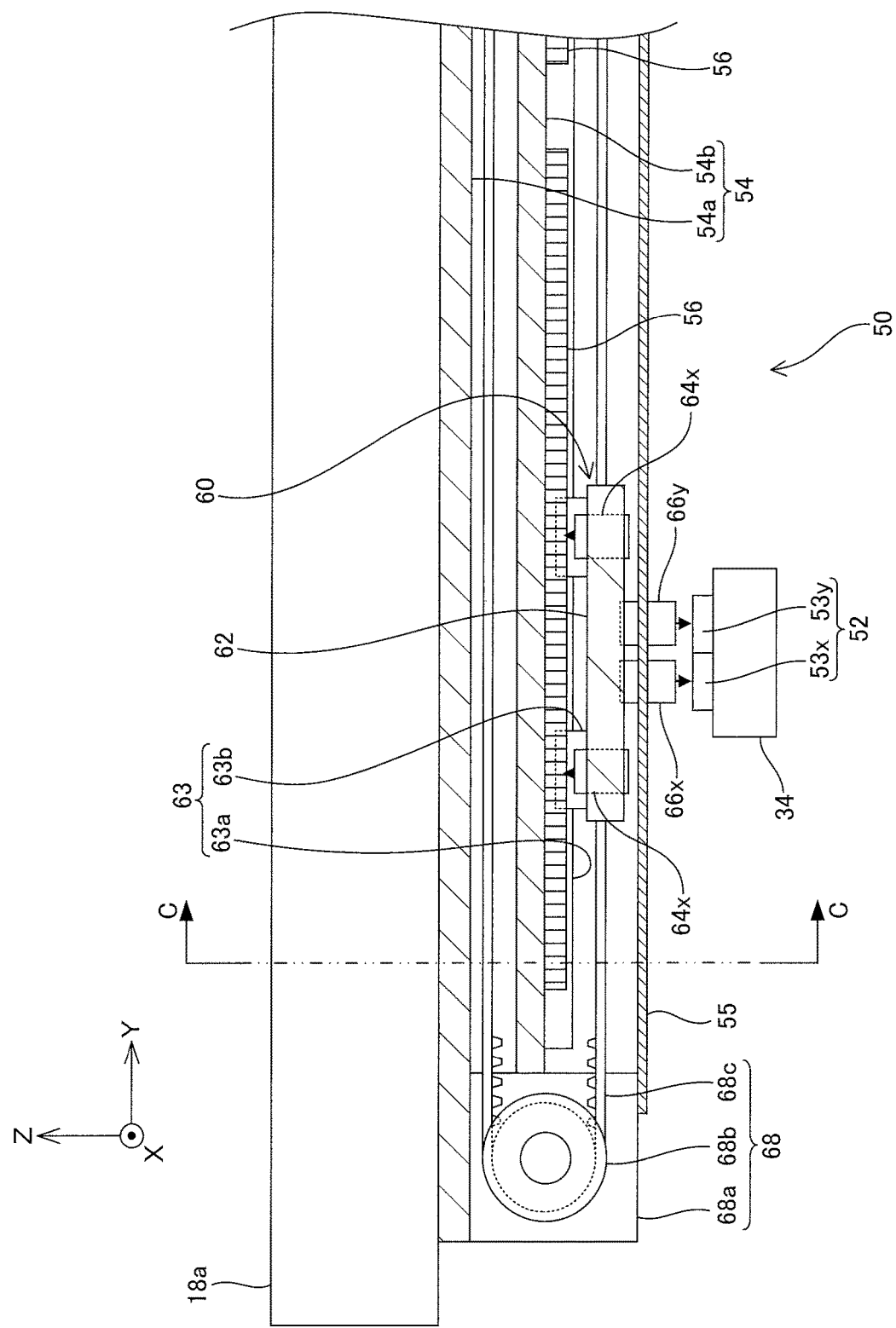
FIG. 4 is a side view of a head unit that the substrate encoder system has.
Figure 5:
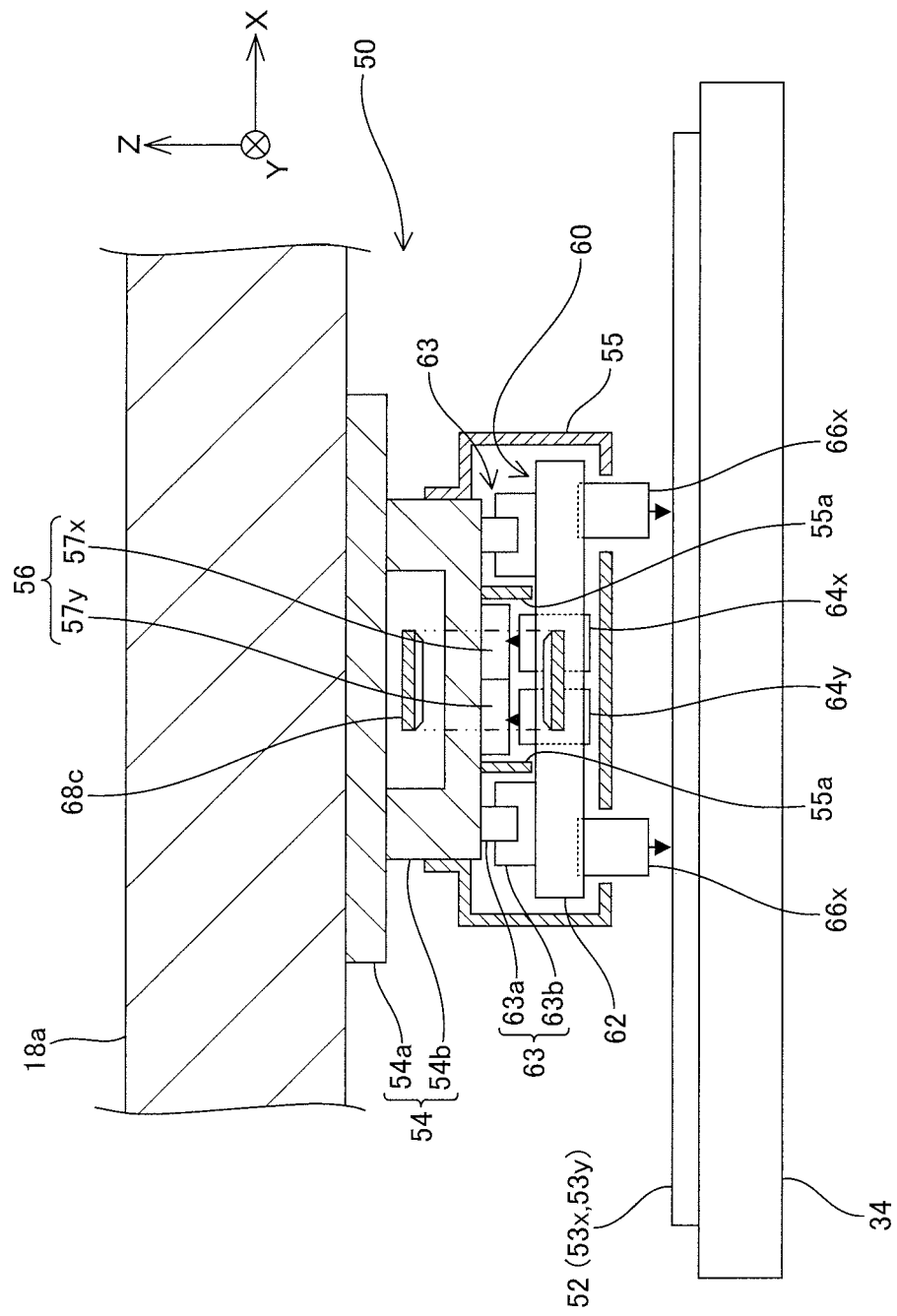
FIG. 5 is a sectional view of line C-C in FIG. 4.

Encoder base 54, as it can be seen from FIGS. 4 and 5, is equipped with a first section 54a, which consists of a plate-like member extending in the Y-axis direction fixed to the lower surface of upper mount section 18a, and a second section 54b, which consists of a member having a U-shaped XZ section extending in the Y-axis direction fixed to the lower surface of the first section 54a, and as a whole, is formed in a cylindrical shape extending in the Y-axis direction. In the embodiment, as is shown in FIG. 3A, while the X positions of the two encoder bases 54 partly overlap the X position of projection optical system 16, encoder bases 54 and projection optical system 16 are arranged mechanically separate (in a non-contact state). Note that encoder bases 54 may also be arranged separately on the +Y side and the −Y side of projection optical system 16. To the lower surface of encoder base 54, a pair of Y linear guides 63a is fixed, as is shown in FIG. 5. Each of the pair of Y linear guides 63a consists of a member extending in the Y-axis direction, and is placed parallel to each other at a predetermined spacing in the X-axis direction.

To the lower surface of encoder base 54, a plurality of encoder scales 56 (hereinafter simply referred to as scales 56) are fixed. In the embodiment, scales 56 are placed, as shown in FIG. 1, with two scales in the area further to the +Y side than projection optical system 16, and two scales in the area further to the −Y side of projection optical system 16, and with the scales arranged separately in the Y-axis direction. That is, four scales 56 are fixed to encoder base 54 in total. Scales 56, consisting of plate-like (strip-shaped) members with a rectangular-shape in a planar view extending in the Y-axis direction, are made of quartz glass, similarly to scales 52 arranged on substrate stage device 20. Note that to facilitate understanding, although FIG. 3A illustrates the plurality of scales 56 in a solid line placed on the upper surface of encoder base 54, the plurality of scales 56 is actually placed at the lower surface side of encoder base 54, as is illustrated in FIG. 1.

Figure 3C:
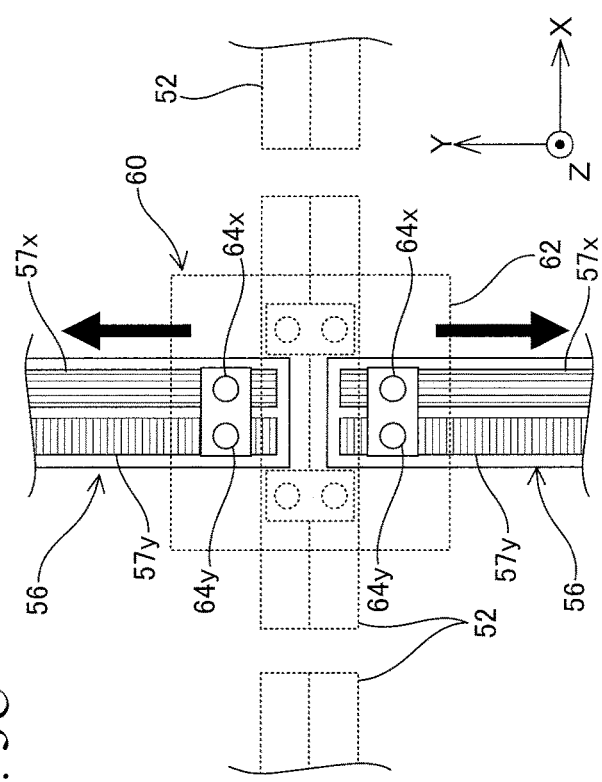

As shown in FIG. 3C, X scales 57x are formed in areas on one side (the +X side in FIG. 3C) in the width direction at the lower surface of scales 56. Also, Y scales 57y are formed in areas on the other side (the −X side in FIG. 3C) in the width direction at the lower surface of scales 56. Since the structure of X scales 57x and Y scales 57y is the same as X scales 47x and Y scales 47y (each refer to FIG. 2B) formed on scales 46 (each refer to FIG. 2A) of mask encoder system 48 described above, the description thereabout will be omitted.

Referring back to FIG. 1, the two head units 60 are arranged apart in the Y-axis direction below encoder base 54. Since each of the two head units 60 is substantially the same except for the point that the units are placed symmetrically in the lateral direction of the page surface in FIG. 1, hereinafter only one of the units (at the −Y side) will be described. Head unit 60, as it can be seen from FIG. 4, is equipped with Y slide table 62, a pair of X heads 64x, a pair of Y heads 64y (not shown in FIG. 4 because of being hidden behind the pair of X heads 64x in the depth of the page surface, refer to FIG. 3C), a pair of X heads 66x (one of the X heads 66x is not shown in FIG. 4, refer to FIG. 3B), a pair of Y heads 66y (one of the Y heads 66y is not shown in FIG. 4, refer to FIG. 3B), and a belt driver 68 for moving Y slide table 62 in the Y-axis direction. In the embodiment, while Y slide table 62 and belt driver 68 are provided at the lower surface of upper mount section 18a of apparatus main section 18 (refer to FIG. 4), Y slide table 62 and belt driver 68 may be provided at middle mount section 18c.

Y slide table 62, which consists of a plate-like member having a rectangular-shape in a planar view, is placed below encoder base 54 via a predetermined clearance with respect to encoder base 54. Also, the Z position of Y slide table 62 is set to be on the +Z side than that of substrate holder 34 which substrate stage device 20 has (each refer to FIG. 1), regardless of the Z tilt position of substrate holder 34.

To the upper surface of Y slide table 62, as shown in FIG. 5, a plurality of Y slide members 63b (two (refer to FIG. 4) with respect to one Y linear guide 63a) is fixed that engages with the above Y linear guide 63a in a freely slidable manner in the Y-axis direction via a rolling body not shown (for example, a plurality of balls of a circulation type). Y linear guide 63a and Y slide member 63b corresponding to Y linear guide 63a structure a mechanical Y linear guide device 63, as is disclosed in, for example, U.S. Pat. No. 6,761,482, and Y slide table 62 is guided straightforward in the Y-axis direction with respect to encoder base 54, via the pair of Y linear guide devices 63.

Belt driver 68, as shown in FIG. 4, is equipped with a rotary driver 68a, a pulley 68b, and a belt 68c. Note that belt driver 68 can be arranged independently for driving slide table 62 at the −Y side and for driving slide table 62 at the +Y side (not shown in FIG. 4, refer to FIG. 3A), or the pair of Y slide tables 62 may be moved integrally by a single belt driver 68.

Rotary driver 68a, which is fixed to encoder base 54, is equipped with a rotary motor (not shown). The number of rotation and the rotation direction of the rotary motor are controlled by main controller 90 (refer to FIG. 7). Pulley 68b is rotationally driven around an axis parallel to the X-axis by rotary driver 68a. Also, although it is not illustrated, belt driver 68 has another pulley which is arranged separately in the Y-axis direction with respect to pulley 68b described above and is attached to encoder base 54 in a state freely rotatable around the axis parallel to the X-axis. Belt 68c has one end and the other end connected to Y slide table 62, along with having two places at the mid portion in the longitudinal direction of the belt wound around the above pulley 68b and the another pulley (not shown), in a state where a predetermined tension is given to the pulleys. A part of belt 68c is inserted into encoder base 54, for example, to suppress adhesion and the like of dust from belt 68c on scales 52 and 56. Y slide table 62 is pulled by belt 68c and moves back and forth with predetermined strokes in the Y-axis direction, by pulley 68b being rotationally driven.

Main controller 90 (refer to FIG. 7) synchronously drives, as appropriate, one of the head units 60 (the +Y side) below two scales 56 arranged further to the +Y side than projection optical system 16, and the other of the head units 60 (the −Y side) below two scales 56 placed further to the −Y side than projection optical system 16, with predetermined strokes in the Y-axis direction. Note that although belt driver 68 including toothed pulley 68b and toothed belt 68c is used as an actuator for moving Y slide table 62, the present embodiment is not limited to this, and a friction wheel device including a pulley without teeth and a belt may also be used. Also, the flexible member that pulls Y slide table 62 is not limited to a belt, and may also be members such as a rope, a wire, or a chain. Also, the kind of actuator for moving Y slide table 62 is not limited to belt driver 68, and may be other drivers such as a linear motor or a feed screw device.

Each of X head 64x, Y head 64y (not shown in FIG. 4, refer to FIG. 5), X head 66x, and Y head 66y is an encoder head of the so-called diffraction interference method similar to X head 49x and Y head 49y (each refer to FIG. 2B) that mask encoder system 48 described above has, and is fixed to Y slide table 62. Now, in head unit 60, the pair of Y heads 64y, the pair of X heads 64x, the pair of Y heads 66y, and the pair of X heads 66x are fixed to Y slide table 62, so that the distance between the heads of each pair does not change due to vibration or the like. Also, Y slide table 62 itself is formed of a material having a thermal expansion coefficient lower than scales 52 and 56 (or equal to scales 52 and 56), so that the distance does not change between the heads of each pair; the pair of Y heads 64y, the pair of X heads 64x, the pair of Y heads 66y, and the pair of X heads 66x due to, for example, temperature change.

Figure 6:
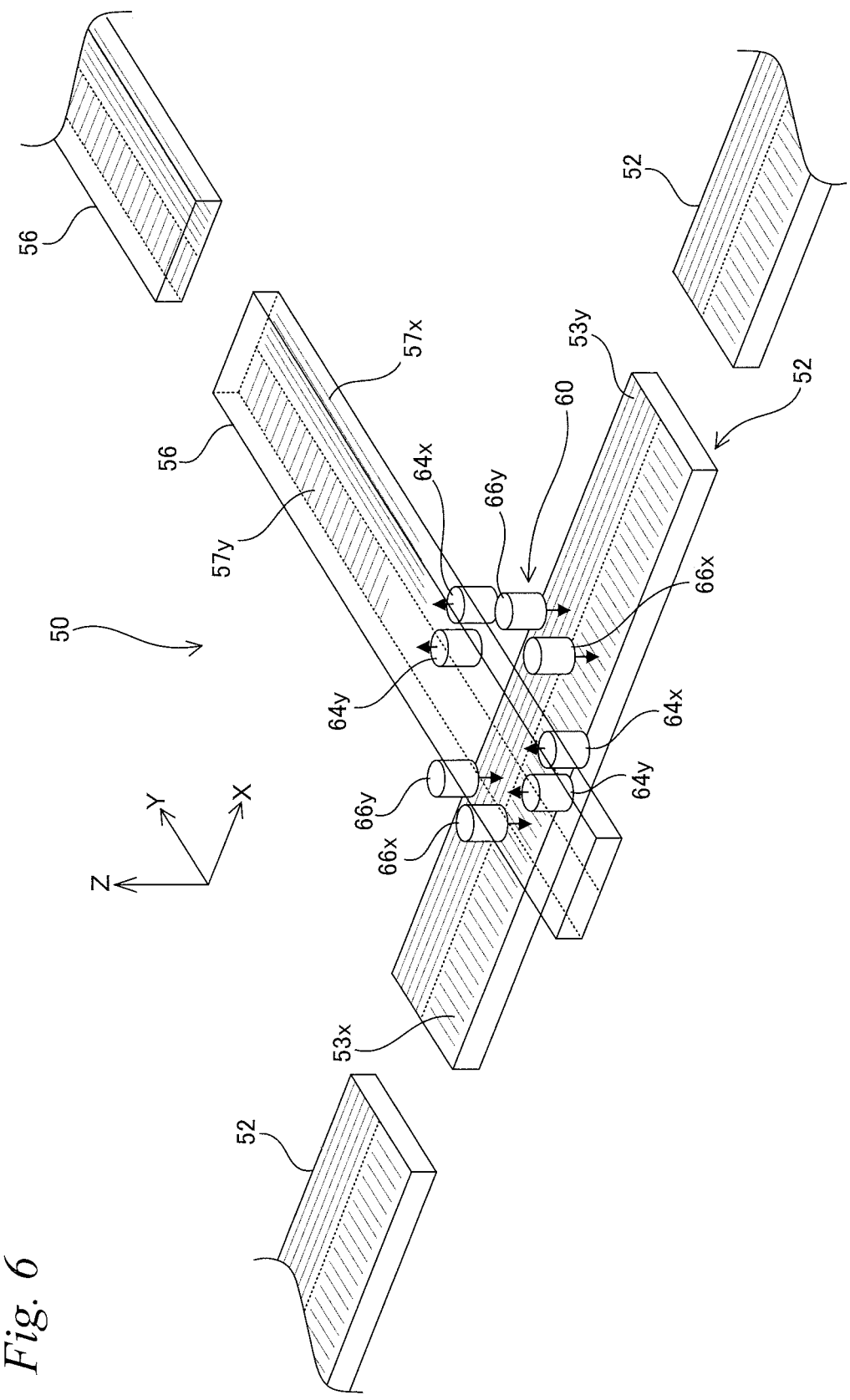
FIG. 6 is a conceptual diagram of the substrate encoder system.

As is shown in FIG. 6, two places (two points) separate from each other in the Y-axis direction on X scale 57x are irradiated with measurement beams from the pair of X heads 64x, and two places (two points) separate from each other in the Y-axis direction on Y scale 57y are irradiated with measurement beams from the pair of Y heads 64y. Substrate encoder system 50 supplies information on displacement quantity of Y slide table 62 (not shown in FIG. 6; refer to FIGS. 4 and 5) to main controller 90 (refer to FIG. 7) by receiving beams from the scales corresponding to the above X heads 64x and Y heads 64y.

That is, in substrate encoder system 50, eight (2×4) X heads 64x and X scales 57x (differ according to the Y position of Y slide table 62) facing the X heads 64x structure eight X linear encoders 96x (not shown in FIG. 6; refer to FIG. 7) used for acquiring position information in the Y-axis direction of each of the four Y slide tables 62 (that is, four head units 60 (refer to FIG. 1)), and eight (2×4) Y heads 64y and Y scales 57y (differ according to the Y position of Y slide table 62) facing the Y heads 64y structure eight Y linear encoders 96y (not shown in FIG. 6; refer to FIG. 7) used for acquiring position information in the Y-axis direction of each of the four Y slide tables 62.

Main controller 90 obtains position information in the X-axis direction and the Y-axis direction of each of the four head units 60 (refer to FIG. 1) at a resolution of, for example, 10 nm or less, based on the output of the eight X linear encoders 96x and eight Y linear encoders 96y, as is shown in FIG. 7. Also, main controller 90 obtains θz position information (rotation quantity information) of head unit 60, based on outputs of two X linear encoders 96x (or two Y linear encoders 96y) corresponding to one head unit 60. Main controller 90 controls the position of head unit 60 within the XY plane using belt driver 68, based on the position information of each of the four head units 60 within the XY plane.

Now, as is shown in FIG. 3A, at encoder base 54, two scales 56 are placed at a predetermined spacing in the Y-axis direction in areas at the +Y side and −Y side of projection optical system 16, as is described above.

Similarly to mask encoder system 48 described above, also in substrate encoder system 50, the spacing between each of the heads of the pair of X heads 64x and each of the heads of the pair of Y heads 64y that one head unit 60 has is set wider than the spacing between the adjacent scales 56, as shown in FIG. 3C. This allows at least one head of the pair of X heads 64x to constantly face X scale 57x and at least one head of the pair of Y heads 64y to constantly face Y scale 57y in substrate encoder system 50. Substrate encoder system 50, therefore, is able to obtain position information of Y slide table 62 (head unit 60) without interrupting the measurement values. Accordingly, linkage process (refer to FIGS. 16A to 16E) of the output of the heads similar to that of the output of the heads of mask encoder system 48 described above is also performed here.

Also, as shown in FIG. 6, two places (two points) separate from each other in the X-axis direction on X scale 53 are irradiated with measurement beams from the pair of X heads 66x, and two places (two points) separate from each other in the X-axis direction on Y scale 53y are irradiated with measurement beams from the pair of Y heads 66y. Substrate encoder system 50 supplies information on displacement quantity of substrate holder 34 (not shown in FIG. 6; refer to FIG. 1) to main controller 90 (refer to FIG. 7), by receiving beams from the scales corresponding to the above X heads 66x and Y heads 66y.

That is, in substrate encoder system 50, eight (2×4) X heads 66x and X scales 53x (different depending on the X position of substrate holder 34) facing X heads 66x structure eight X linear encoders 94x (not shown in FIG. 6; refer to FIG. 7) for obtaining positional information of substrate P in the X-axis direction, and eight (2×4) Y heads 66y and Y scale 53y (different depending on the X position of substrate holder 34) facing Y heads 66y structure eight Y linear encoders 94y (not shown in FIG. 6; refer to FIG. 7) for obtaining position information of substrate P in the Y-axis direction.

Main controller 90, as shown in FIG. 7, obtains position information of substrate holder 34 (refer to FIG. 1) in the X-axis direction and the Y-axis direction with respect to apparatus main section 18 (refer to FIG. 1) at a resolution of, for example, 10 nm or less, based on the outputs of the eight X linear encoders 94x and the eight Y linear encoders 94y, and the outputs of the eight X linear encoders 96x and the eight Y linear encoders 96y (that is, the position information of the four head units 60 in the XY plane). In other words, main controller 90 obtains position information in the X-axis direction of substrate P mounted on substrate holder 34, based on the output of X linear encoder 94x for measuring the position of the substrate holder in the X direction when substrate holder 34 moves in the X direction and the output of X linear encoder 96x for measuring the position of head unit 60 in the X direction. Also, main controller 90 obtains position information in the Y-axis direction of substrate P mounted on substrate holder 34, based on the output of Y linear encoder 94y and the output of Y linear encoder 96y for measuring the Y direction position of head unit 60 moved in the Y direction synchronously with the movement of substrate holder 34 in the Y direction. Also, main controller 90 obtains θz position information (rotation quantity information) of substrate holder 34, based on at least two outputs of the eight X linear encoders 94x (or eight Y linear encoders 94y). Main controller 90 controls the position of substrate holder 34 within the XY plane using substrate drive system 93, based on position information of substrate holder 34 within the XY plane acquired from the measurement values of the above substrate encoder system 50.

Also, as is shown in FIG. 3A, at substrate holder 34, four scales 52 are arranged which are placed at a predetermined spacing in the X-axis direction in each of the areas at the +Y side and the −Y side of substrate P as is described above.

Similarly to the mask encoder system 48 described above, the spacing between each head of the pair of X heads 66x and each head of the pair of Y heads 66y that one head unit 60 has is set wider than the spacing between the adjacent scales 52, as shown in FIG. 3B. This allows at least one head of the pair of X heads 66x to constantly face X scale 53x and at least one head of the pair of Y heads 66y to constantly face Y scale 53y in substrate encoder system 50. Accordingly, substrate encoder system 50 is able to obtain position information of substrate holder 34 (refer to FIG. 3A) without interrupting the measurement values. Accordingly, linkage process (refer to FIGS. 16A to 16E) of the output of the heads similar to that of the output of the heads of mask encoder system 48 described above is also performed here.

Also, of the total of 16 heads facing downward (eight X heads 66x and eight Y heads 66y) in substrate encoder system 50 of the embodiment, spacing between each of the heads and spacing between each of the scales are set so that at least three heads constantly face either of the scales. This allows a state to be maintained in which position information in directions of three degrees of freedom (X, Y, θz) within the horizontal plane of substrate holder 34 can be obtained constantly during the exposure operation.

Referring back to FIG. 5, a dust-proof cover 55 consists of a member extending in the Y-axis direction that has a U-shape XZ section, and a second section 54b of encoder base 54 and Y slide table 62 are inserted, via a predetermined clearance, in between a pair of opposing surfaces. At the lower surface of dust-proof cover 55, openings are formed through which X heads 66x and Y head 66y pass. This suppresses adhesion of dust generated from parts such as Y linear guide device 63 and belt 68c on scales 52. Also, a pair of dust-proof plates 55a (not shown in FIG. 4) is fixed to the lower surface of encoder base 54. Scales 56 are placed between the pair of dust-proof plates 55a, which suppress adhesion of dust generated from parts such as Y linear guide device 63 on scales 56.

FIG. 7 is a block diagram showing an input/output relation of main controller 90, which mainly structures a control system of liquid crystal exposure apparatus 10 (refer to FIG. 1) and has overall control over each section. Main controller 90, which includes a work station (or a microcomputer) or the like, has overall control over each section of liquid crystal exposure apparatus 10.

In liquid crystal exposure apparatus 10 (refer to FIG. 1) having the structure described above, under the control of main controller 90 (refer to FIG. 7), a mask loader not shown performs loading of mask M onto mask stage device 14, and a substrate loader not shown performs loading of substrate P onto substrate stage device 20 (substrate holder 34). Main controller 90 then executes alignment measurement (detection of a plurality of alignment marks on substrate P) using an alignment detection system not shown, and then, when the alignment measurement has been completed, sequentially performs an exposure operation of a step-and-scan method on a plurality of shot areas set on substrate P.

Next, an example of an operation of mask stage device 14 and substrate stage device 20 at the time of exposure operation will be described, using FIGS. 8A to 15B. Note that, in the description below, while the case of setting four shot areas on one substrate P (in the case of four pieces) will be described, the number and placement of the shot areas set on one substrate P can be appropriately changed.

Figure 8A:
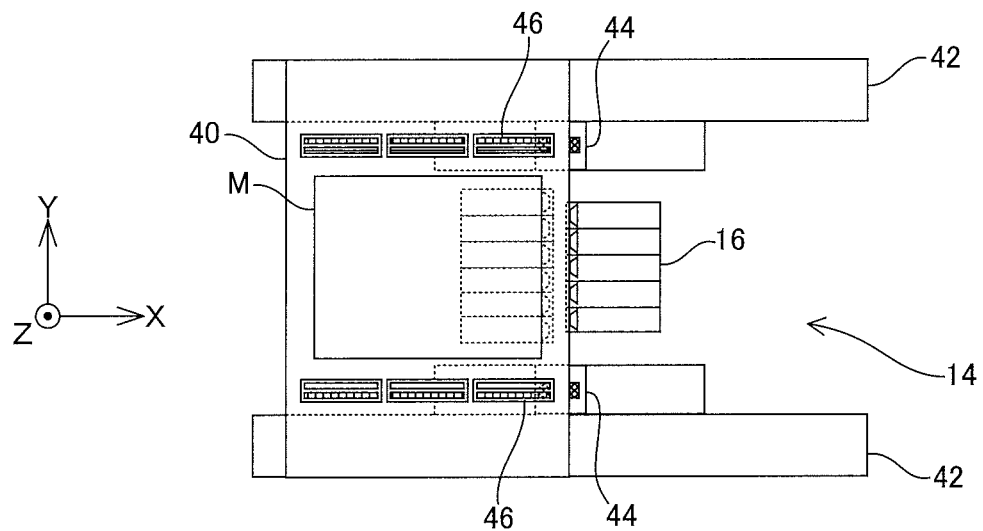
FIG. 8A is a view (No. 1) showing an operation of the mask encoder system at the time of exposure operation.
Figure 8B:
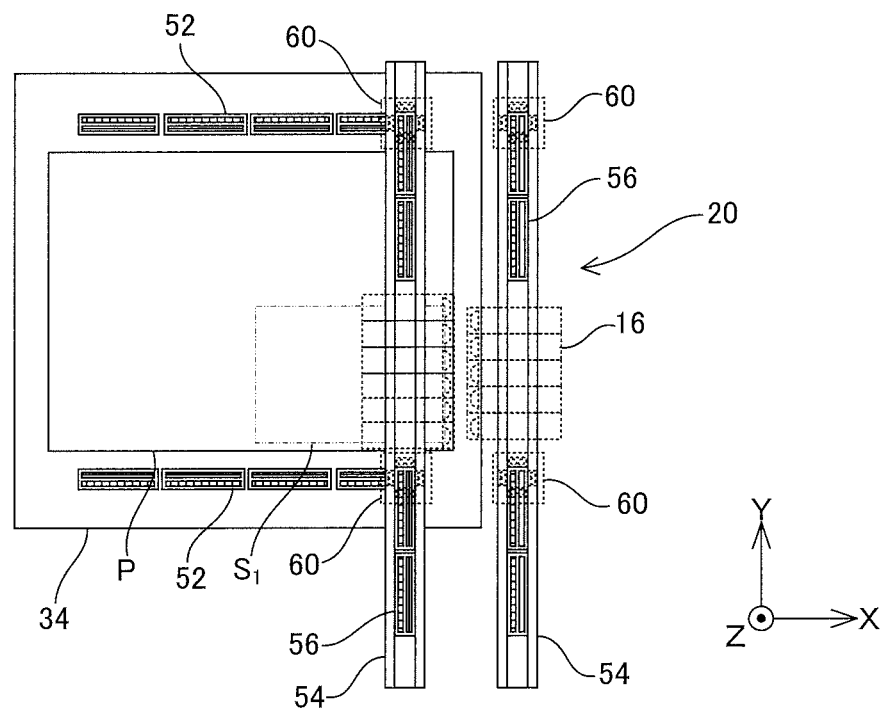
FIG. 8B is a view (No. 1) showing an operation of the substrate encoder system at the time of exposure operation.

FIG. 8A shows mask stage device 14 which has completed alignment operation, and FIG. 8B shows substrate stage device 20 (members other than substrate holder 34 are not shown. The same applies to the description below) which has completed alignment operation. Exposure processing, as an example, is performed from a first shot area $S_1$ which is set at the −Y side and also the +X side of substrate P, as shown in FIG. 8B. In mask stage device 14, positioning of mask M is performed based on the output of mask encoder system 48 (refer to FIG. 7), so that the edge at the +X side of mask M is positioned slightly to the −X side than the illumination area (in the state shown in FIG. 8A, however, illumination light IL is not irradiated yet on mask M) of illumination light IL irradiated from illumination system 12 (refer to FIG. 1 for each section), as shown in FIG. 8A.

To be more specific, the edge at the +X side of mask M is placed to the −X side with respect to the illumination area, only by an entrance length necessary to perform scanning exposure at a predetermined speed (that is, acceleration distance necessary to reach the predetermined speed), and at the position, scales 46 are arranged so that the position of mask M can be measured with mask encoder system 48. Main controller 90 (refer to FIG. 7) also performs position control of mask holder 40 within a range in which at least three heads (three heads of four heads 49x and four heads 49y) do not move off (do not move outside the measurement range) of scales 46.

Also, in substrate stage device 20, positioning of substrate P is performed based on the output of substrate encoder system 50 (refer to FIG. 8), so that the edge at the +X side of the first shot area $S_1$ is positioned slightly to the −X side than the exposure area (in the state shown in FIG. 8B, however, illumination light IL is not irradiated yet on substrate P) on which illumination light IL (refer to FIG. 1) from projection optical system 16 is irradiated, as shown in FIG. 8B. To be more specific, the edge at the +X side of the first shot area $S_1$ of substrate P is placed to the −X side with respect to the exposure area, only by an entrance length necessary to perform scanning exposure at a predetermined speed (that is, acceleration distance necessary to reach the predetermined speed), and at the position, scales 52 are arranged so that the position of substrate P can be measured with substrate encoder system 50. Main controller 90 (refer to FIG. 7) also performs position control of substrate holder 34 within a range in which at least three heads (three heads of eight heads 66x and eight heads 66y) do not move off (do not move outside the measurement range) of scales 52.

Note that also when scanning exposure of the shot areas has been completed and mask M and substrate P are decelerated, scales 46 and 52 are arranged similarly so that mask encoder system 48 and substrate encoder system 50 can measure the position of mask M and substrate P, respectively, until mask M and substrate P has finished moving further by a deceleration distance necessary for deceleration to a predetermined speed from the speed at the time of scanning exposure. Alternatively, the position of mask M and substrate P may each be measured by measurement systems different from mask encoder system 48 and substrate encoder system 50, during at least one of the operations of acceleration and deceleration.

Figure 9A:
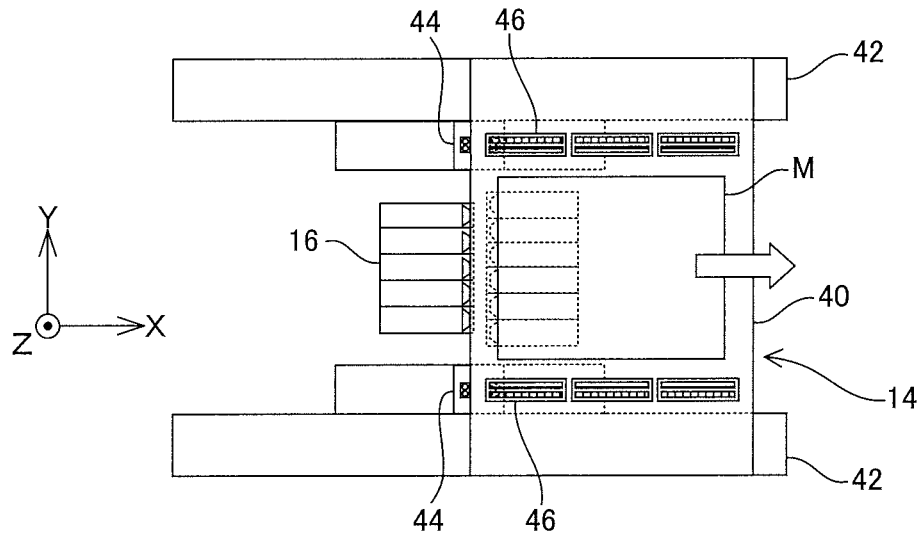
FIG. 9A is a view (No. 2) showing an operation of the mask encoder system at the time of exposure operation.
Figure 9B:
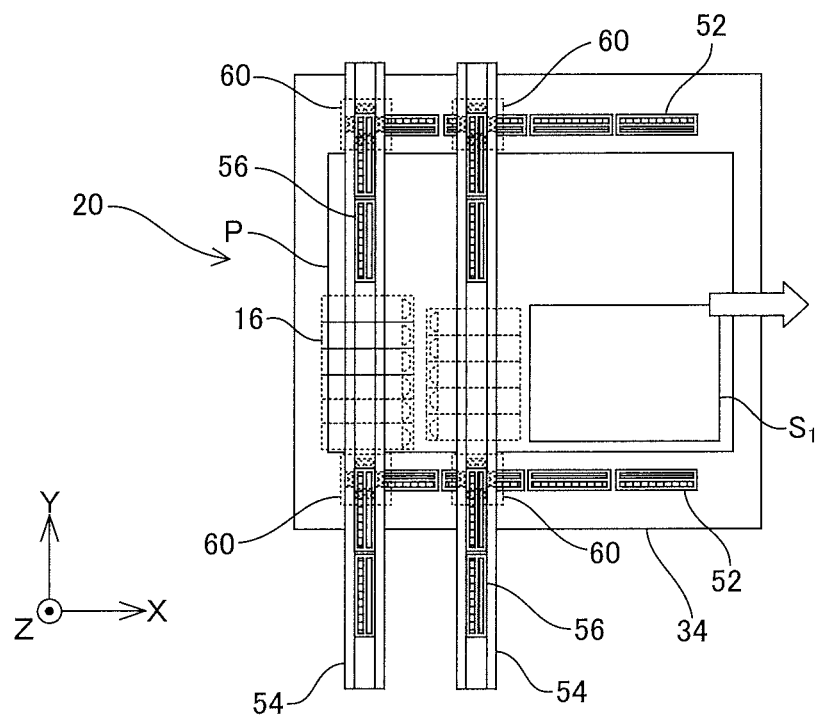
FIG. 9B is a view (No. 2) showing an operation of the substrate encoder system at the time of exposure operation.

Next, mask holder 40 is moved in the +X direction (acceleration, constant speed drive, and deceleration) as shown in FIG. 9A, and synchronously with mask holder 40, substrate holder 34 is moved in the +X direction (acceleration, constant speed drive, and deceleration) as shown in FIG. 9B. When mask holder 40 is moved, main controller 90 (refer to FIG. 7) performs position control of mask M based on the output of mask encoder system 48 (refer to FIG. 7) as well as perform position control of substrate P based on the output of substrate encoder system 50 (refer to FIG. 7). When substrate holder 34 is moved in the X-axis direction, the four head units 60 are to be in a stationary state. While mask holder 40 and substrate holder 34 are moved at a constant speed in the X-axis direction, illumination light IL (refer to FIG. 1 for each part) that has passed through mask M and projection optical system 16 is irradiated on substrate P, and by this operation, the mask pattern that mask M has is transferred to shot area $S_1$.

Figure 10A:
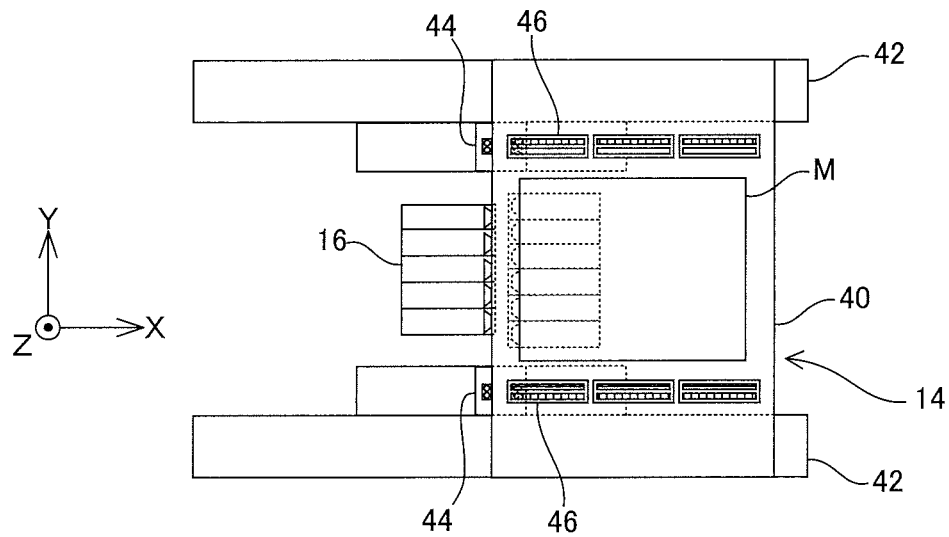
FIG. 10A is a view (No. 3) showing an operation of the mask encoder system at the time of exposure operation.
Figure 10B:
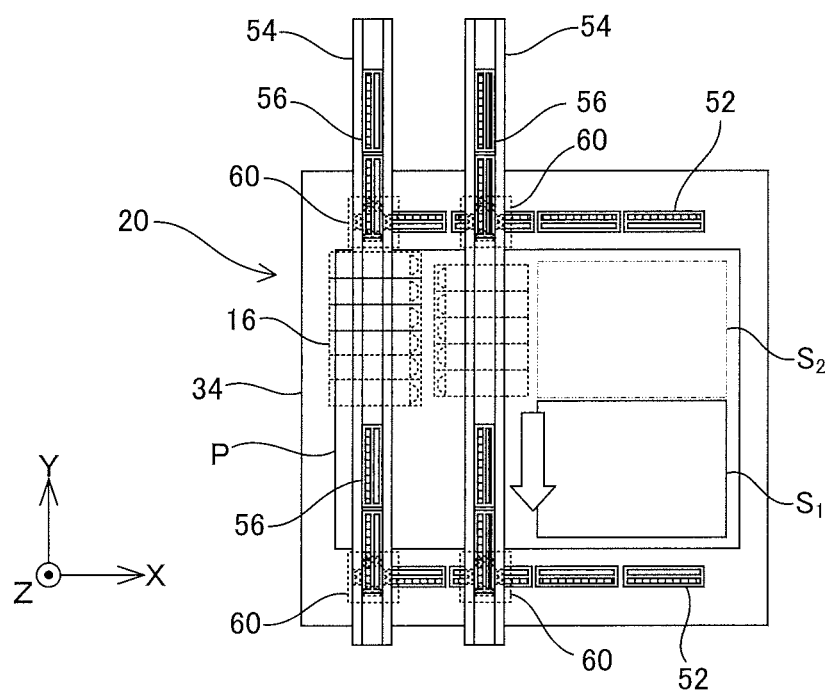
FIG. 10B is a view (No. 3) showing an operation of the substrate encoder system at the time of exposure operation.

When transfer of the mask pattern to the first shot area $S_1$ on substrate P has been completed, in substrate stage device 20, substrate holder 34 is moved (Y stepped) based on the output of substrate encoder system 50 (refer to FIG. 7) in the −Y direction by a predetermined distance (a distance almost half of the dimension in the width direction of substrate P), for exposure operation of a second shot area $S_2$ set at the +Y side of the first shot area $S_1$, as shown in FIG. 10B. In the above Y stepping operation of substrate holder 34, mask holder 40 is stationary in a state where the edge of mask M at the −X side is positioned slightly to the +X side than the illumination area (in the state shown in FIG. 10A, however, mask M is not illuminated), as shown in FIG. 10A.

In the above Y stepping operation of substrate holder 34, as shown in FIG. 10B, at substrate stage device 20, the four head units 60 are moved in the Y-axis direction synchronously with substrate holder 34. That is, main controller 90 (refer to FIG. 7) moves the four head units 60 in the Y-axis direction via the corresponding belt driver 68 (refer to FIG. 7) based on the output of Y linear encoder 94y and the output of Y linear encoder 96y (refer to FIG. 7) of substrate encoder system 50 (refer to FIG. 7), to move substrate holder 34 in the Y-axis direction to a target position via substrate drive system 93 (refer to FIG. 7) while maintaining a state in which at least one head of the plurality of heads 66y does not move off of scale 52 (a state in which at least one head does not move outside the measurement range). On this operation, main controller 90 moves the four head units 60 synchronously with substrate holder 34 (so that the four head units 60 follow substrate holder 34, namely, follow the movement of substrate P mounted on substrate holder 34 in the Y-axis direction (stepping direction)). Also, main controller 90 (refer to FIG. 7) performs position control (drive control in the Y-axis direction) of Y slide table 62 within a range in which at least one head of the plurality of heads 64x and 64y does not move off (does not move outside the measurement range) of scales 56.

Accordingly, each of the measurement beams irradiated from X heads 66x and Y heads 66y (each refer to FIG. 6) does not move off of X scales 53x and Y scales 53y (each refer to FIG. 6) regardless of the Y position (including when substrate holder 34 is moving) of substrate holder 34. In other words, the four head units 60 should move synchronously with substrate holder 34 in the Y-axis direction, at a degree in which each of the measurement beams irradiated from X heads 66x and Y heads 66y while substrate holder 34 is moved in the Y-axis direction (during the Y stepping operation) does not move away from X scales 53x and Y scales 53y, that is, at a degree in which measurement by the measurement beams from X heads 66x and Y heads 66y is not interrupted (measurement can be continued).

On this operation, movement of Y slide table 62 (X heads 64x, 66x, Y heads 64y, 66y) in the stepping direction may be started prior to substrate holder 34, before movement of substrate holder 34 in the stepping direction (the Y-axis direction) is started. This allows acceleration of each of the heads to be suppressed, and furthermore, allows tilt (inclining forward in the advancing direction) of each of the heads to be suppressed. Also, instead of this, movement of Y slide table 62 in the stepping direction may be started later than substrate holder 34.

Figure 11A:
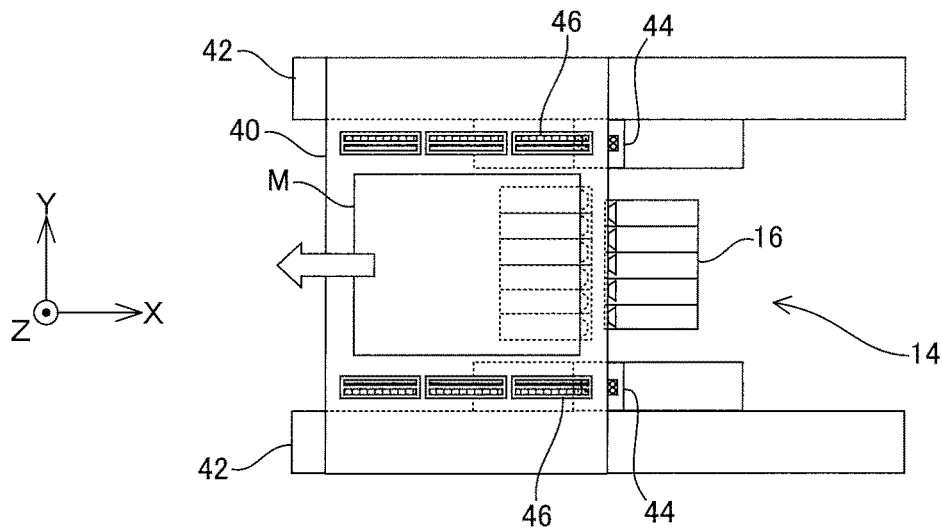
FIG. 11A is a view (No. 4) showing an operation of the mask encoder system at the time of exposure operation.
Figure 11B:
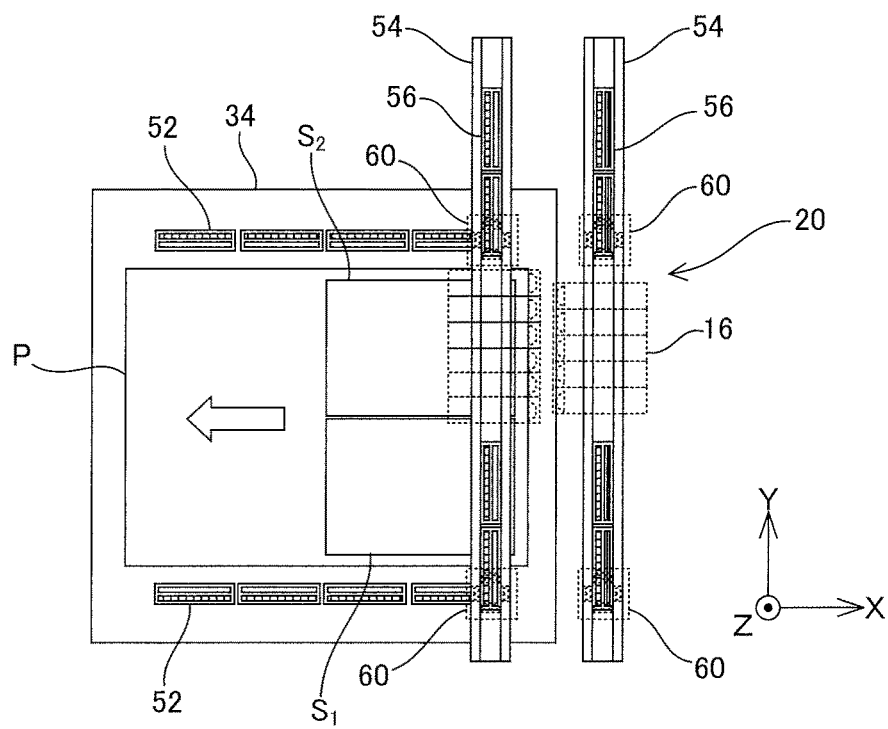
FIG. 11B is a view (No. 4) showing an operation of the substrate encoder system at the time of exposure operation.

When the Y stepping operation of substrate holder 34 is completed, as shown in FIG. 11A, mask holder 40 is moved in the −X direction based on the output of mask encoder system 48 (refer to FIG. 7), and synchronously with mask holder 40, as shown in FIG. 11B, substrate holder 34 is moved in the −X direction based on the output of substrate encoder system 50 (refer to FIG. 7). This allows the mask pattern to be transferred onto the second shot area $S_2$. The four head units 60 are to be in a stationary state also on this operation.

Figure 12A:
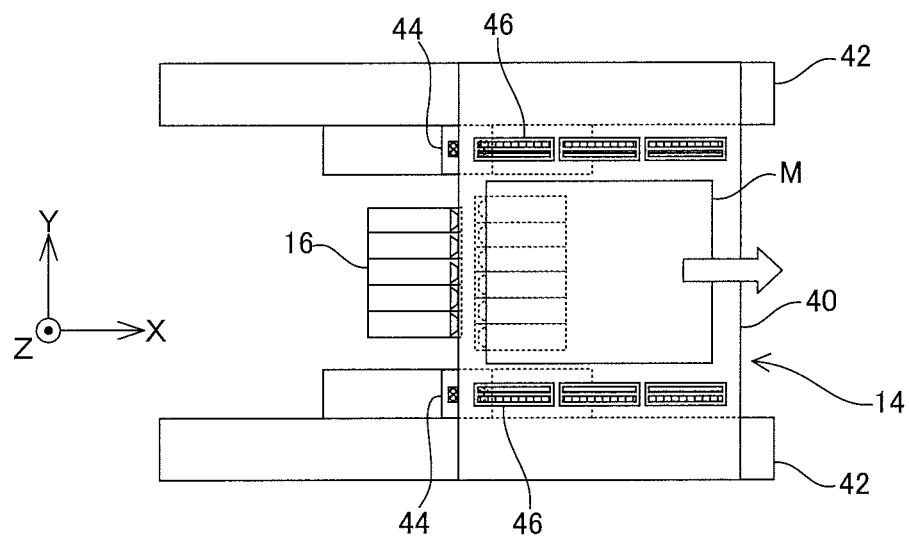
FIG. 12A is a view (No. 5) showing an operation of the mask encoder system at the time of exposure operation.
Figure 12B:
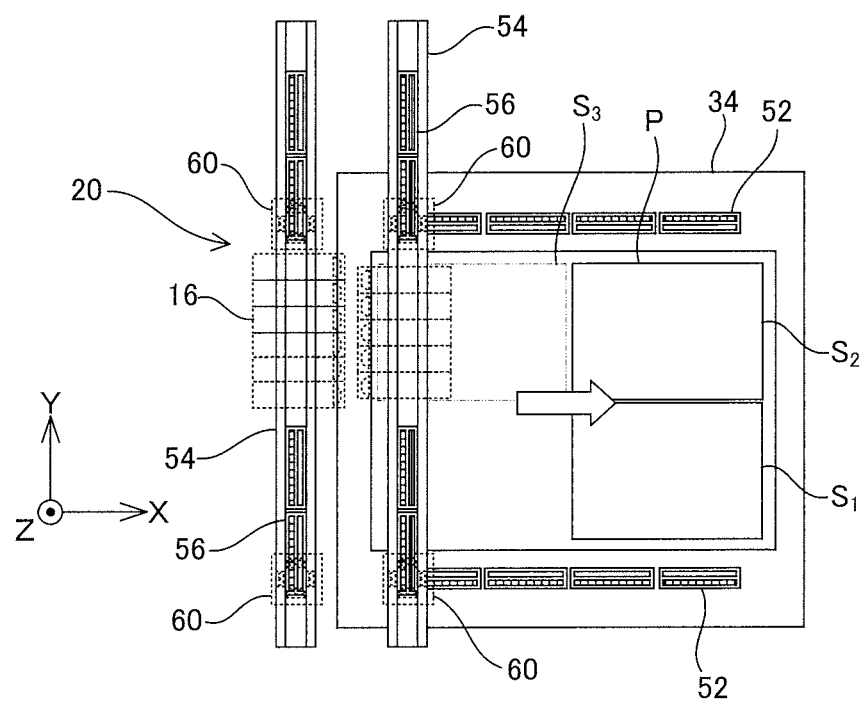
FIG. 12B is a view (No. 5) showing an operation of the substrate encoder system at the time of exposure operation.

When the exposure operation on the second shot area $S_2$ is completed, in mask stage device 14, positioning of mask M is performed based on the output of mask encoder system 48 (refer to FIG. 7), so that mask holder 40 is moved in the +X direction and the edge at the −X side of mask M is positioned slightly to the +X side than the illumination area, as shown in FIG. 12A. Also, in substrate stage device 20, positioning of substrate P is performed based on the output of substrate encoder system 50 (refer to FIG. 7), so that substrate holder 34 is moved in the +X direction and the edge at the −X side of a third shot area $S_3$ is positioned slightly to the +X side than the exposure area, for exposure operation of the third shot area $S_3$ set at the −X side of the second shot area $S_2$, as is shown in FIG. 12B. At the time of moving operations shown in FIGS. 12A and 12B of mask holder 40 and substrate holder 34, illumination light IL is not irradiated with respect to mask M (refer to FIG. 12A) and substrate P (refer to FIG. 12B) from illumination system 12 (refer to FIG. 1). That is, the moving operations shown in FIGS. 12A and 12B of mask holder 40 and substrate holder 34 are simply positioning operations (X stepping operations) of mask M and substrate P.

Figure 13A:
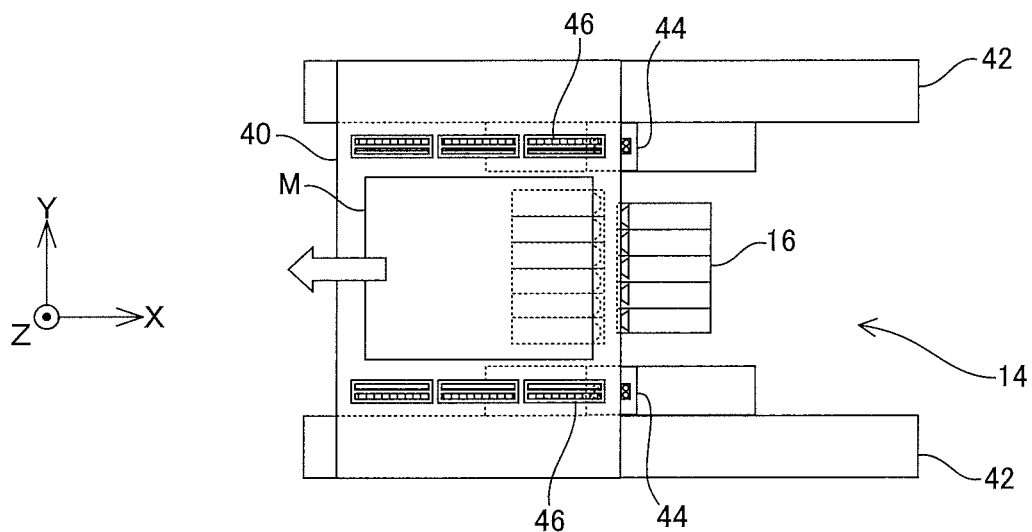
FIG. 13A is a view (No. 6) showing an operation of the mask encoder system at the time of exposure operation.
Figure 13B:
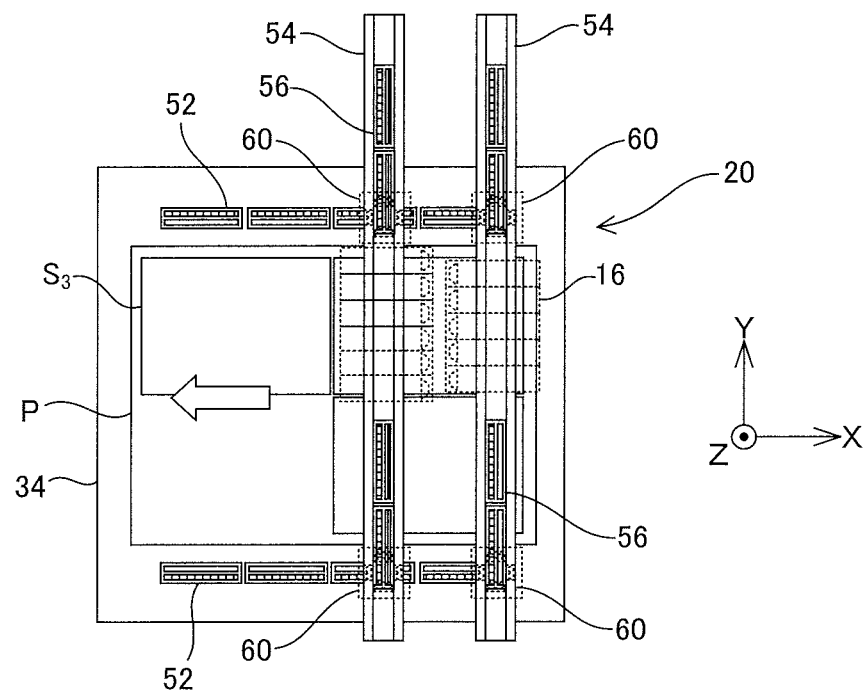
FIG. 13B is a view (No. 6) showing an operation of the substrate encoder system at the time of exposure operation.

When the X stepping operations of mask M and substrate P are completed, in mask stage device 14, as shown in FIG. 13A, mask holder 40 is moved in the −X direction based on the output of mask encoder system 48 (refer to FIG. 7), and synchronously with mask holder 40, as shown in FIG. 13B, substrate holder 34 is moved in the −X direction based on the output of substrate encoder system 50 (refer to FIG. 7). This allows the mask pattern to be transferred onto the third shot area $S_3$. The four head units 60 are to be in a stationary state also on this operation.

Figure 14A:
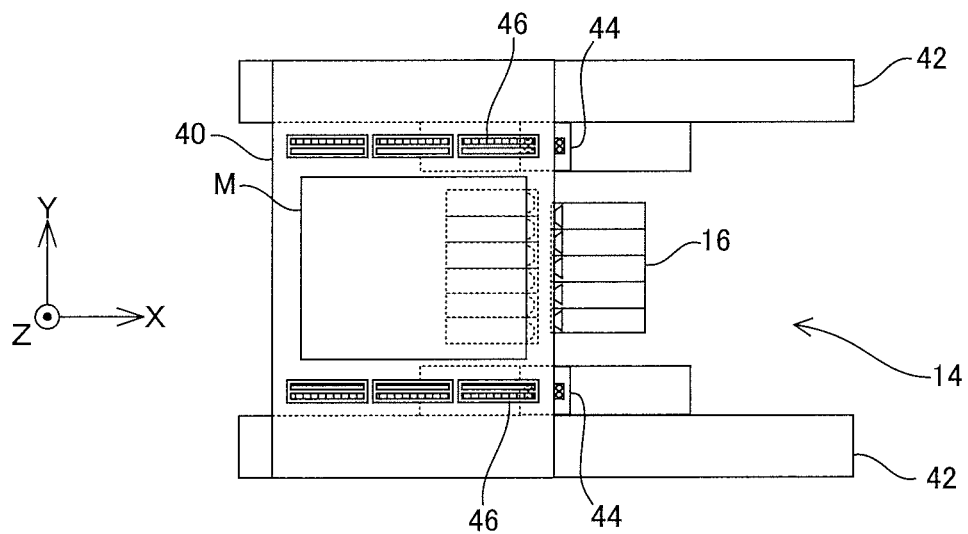
FIG. 14A is a view (No. 7) showing an operation of the mask encoder system at the time of exposure operation.
Figure 14B:
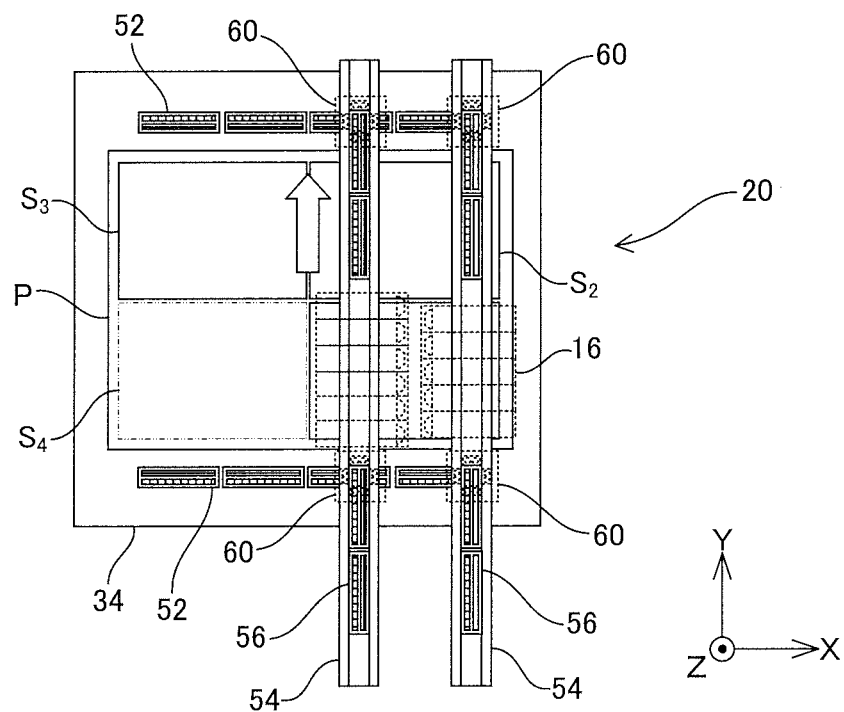
FIG. 14B is a view (No. 7) showing an operation of the substrate encoder system at the time of exposure operation.

When the exposure operation to the third shot area $S_3$ is completed, in substrate stage device 20, substrate holder 34 is moved (Y step drive) in the +Y direction by a predetermined distance for exposure operation of a fourth shot area $S_4$ set at the −Y side of the third shot area $S_3$, as is shown in FIG. 14B. On this operation, like the time of Y stepping operation of substrate holder 34 shown in FIG. 10B, mask holder 40 is to be in a stationary state (refer to FIG. 14A). The four head units 60 are also moved in the +Y direction synchronously with substrate holder 34 (so as to follow substrate holder 34).

Figure 15A:
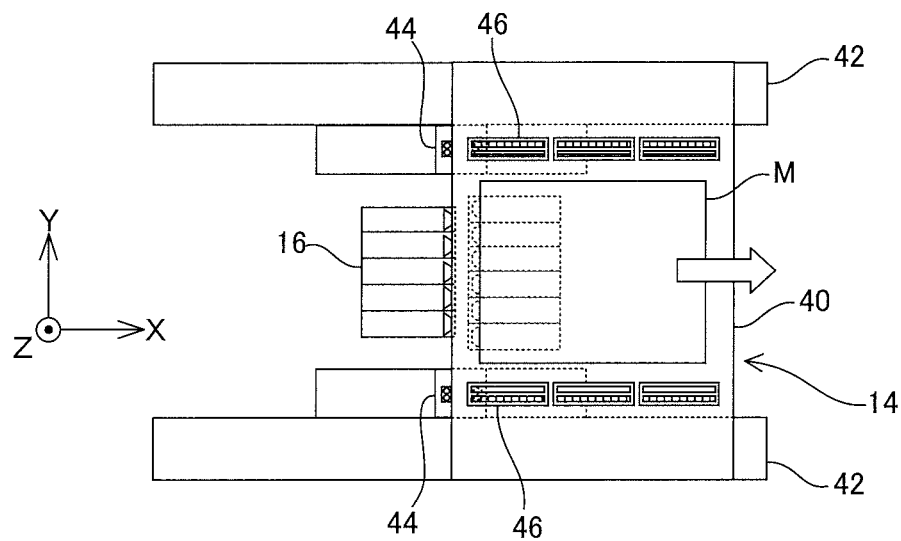
FIG. 15A is a view (No. 8) showing an operation of the mask encoder system at the time of exposure operation.
Figure 15B:
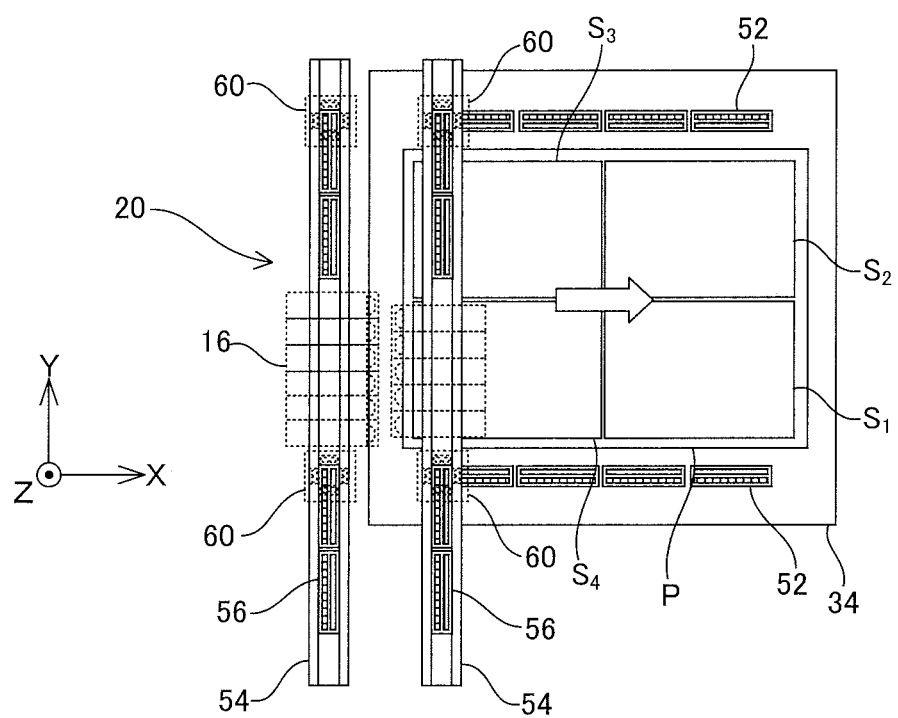
FIG. 15B is a view (No. 8) showing an operation of the substrate encoder system at the time of exposure operation.

When the Y stepping operation of substrate holder 34 is completed, as shown in FIG. 15A, mask holder 40 is moved in the +X direction based on the output of mask encoder system 48 (refer to FIG. 7), and synchronously with mask holder 40, as shown in FIG. 15B, substrate holder 34 is moved in the +X direction based on the output of substrate encoder system 50 (refer to FIG. 7). This allows the mask pattern to be transferred onto the fourth shot area $S_4$. The four head units 60 are to be in a stationary state also on this operation.

Figure 36:
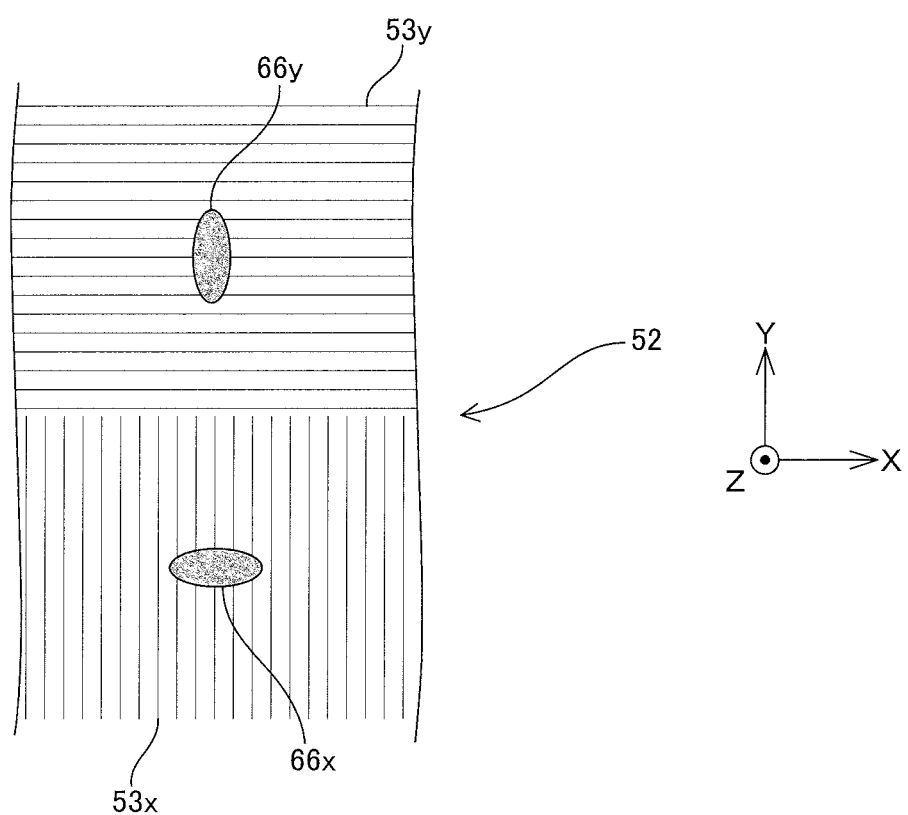
FIG. 36 is a view showing an irradiation point of a measurement beam on an encoder scale.

Here, as is described above, Y scale 53y has a plurality of grid lines extending in the X-axis direction. Also, as is shown in FIG. 36, an irradiation point 66y (the same code as the Y head is used for convenience) of the measurement beam from Y head 66y irradiated on Y scale 53y is elliptic, with the long axis direction being in the Y-axis direction. With Y linear encoder 94y (refer to FIG. 7), when Y head 66y and Y scale 53y are relatively moved in the Y-axis direction and the measurement beam crosses over the grid lines, the output from Y head 66y changes, based on phase change of □□ 1st order diffracted light from the irradiation point.

Meanwhile, main controller 90 (refer to FIG. 6) controls position (Y position) in the stepping direction of head unit 60 during the scanning exposure operation described above, so that Y head 66y that head unit 60 (refer to FIG. 4B) has does not cross over the plurality of grid lines forming Y scale 53y, that is, the output from Y head 66y does not change (the change remains zero), when substrate holder 34 is moved in the scanning direction (the X-axis direction).

Specifically, the Y position of Y head 66y is measured by a sensor having resolution higher than the pitch between the grid lines that structure Y scale 53, and just before the irradiation point of the measurement beam from Y head 66y crosses the grid lines (when the output of Y head 66y is about to change), the Y position of Y head 66y is controlled via a head unit drive system 86 (refer to FIG. 6). Note that this is not limited, and for example, in the case the output of Y head 66y changes by the measurement beam from Y head 66y crossing over the grid lines, by controlling the drive of Y head 66y according to the change, the change of the output from Y head 66y may be substantially canceled. In this case the sensor to measure the Y position of Y head 66y is not required.

When transfer of the mask pattern has been completed on the first shot area $S_1$ to the fourth shot area $S_4$ on substrate P in the manner described above, substrate P is exchanged at a predetermined substrate exchange position. Here, since the substrate exchange position in general is set at a position away from the position directly below projection optical system 16 so that projection optical system 16 does not interfere with the substrate exchange, when substrate holder 34 is moved to the substrate exchange position, a possibility occurs in which X head 66x and Y head 66y attached to head unit 60 move off of (a state no longer facing) scale 52 on substrate holder 34, cutting off the output of substrate encoder system 50. As a countermeasure for such a case, for example, a case may be considered of increasing the size of substrate holder 34 and arranging a longer scale 52 on substrate holder 34, or providing a scale (or a mark) used at the time of plate exchange at a place away from substrate holder 34. Also, a sub head used for substrate exchange may be arranged separately to measure a scale (or a mark) provided outside of substrate holder 34.

As is described so far, with liquid crystal exposure apparatus 10 according to the present embodiment, because mask encoder system 48 for acquiring the position information of mask M within the XY plane and substrate encoder system 50 for acquiring the position information of substrate P within the XY plane (refer to FIG. 1 for each system) each has a short optical path length of the measurement beams irradiated on the corresponding scales, the influence of air fluctuation can be reduced when compared to conventional interferometer systems. Therefore, the positioning accuracy of mask M and substrate P improves. Also, since the influence of air fluctuation is small, partial air-conditioning unit which is indispensable when using a conventional interferometer system can be omitted, which allows cost reduction.

Furthermore, in the case of using the interferometer system, large and heavy bar mirrors had to be equipped in mask stage device 14 and substrate stage device 20, however, with mask encoder system 48 and substrate encoder system 50 according to the present embodiment, the above bar mirrors will not be necessary. Therefore, each of the systems including mask holder 40 and the systems including substrate holder 34 becomes smaller and lighter, and the weight balance also is improved, which improves position controllability of mask M and substrate P. Also, places that require adjustment are less than the case using the interferometer system, which allows cost reduction of mask stage device 14 and substrate stage device 14, and furthermore improves maintainability. Adjustment at the time of assembly also becomes easy (or unnecessary).

Also, in substrate encoder system 50 according to the embodiment, since the system employs the structure of obtaining the Y position information of substrate P by moving the four head units 60 synchronously with (making the four head units follow) substrate P in the Y-axis direction, there is no need to place a scale extending in the Y-axis direction or to increase the width in the Y-axis direction of the scale extending in the X-axis direction at the substrate stage device 20 side (or no need to arrange a plurality of heads in the Y-axis direction at the apparatus main section 18 side). This can simplify the structure of the substrate position measurement system, which allows cost reduction.

Also, in mask encoder system 48 according to the present embodiment, since the system employs the structure of acquiring the position information of mask holder 40 in the XY plane while appropriately switching the output of the pair of adjacent encoder heads (X head 49x, Y head 49y) according to the X position of mask holder 40, the position information of mask holder 40 can be acquired without interruption, even if a plurality of scales 46 are arranged at a predetermined spacing (spaced apart from one another) in the X-axis direction. Accordingly, there is no need to prepare a scale having a length equal to the moving strokes of mask holder 40 (a length around three times of scale 46 of the present embodiment) in the system, which allows cost reduction, and this makes it suitable especially for liquid crystal exposure apparatus 10 that uses a large mask M as in the present embodiment. Similarly, also in substrate encoder system 50 according to the present embodiment, since a plurality of scales 52 are placed in the X-axis direction and a plurality of scales 56 are placed in the Y-axis direction each at a predetermined spacing, scales having a length equal to the moving strokes of substrate P do not have to be prepared, which makes it suitable for application in liquid crystal exposure apparatus 10 which uses a large substrate P.

Figure 17A:
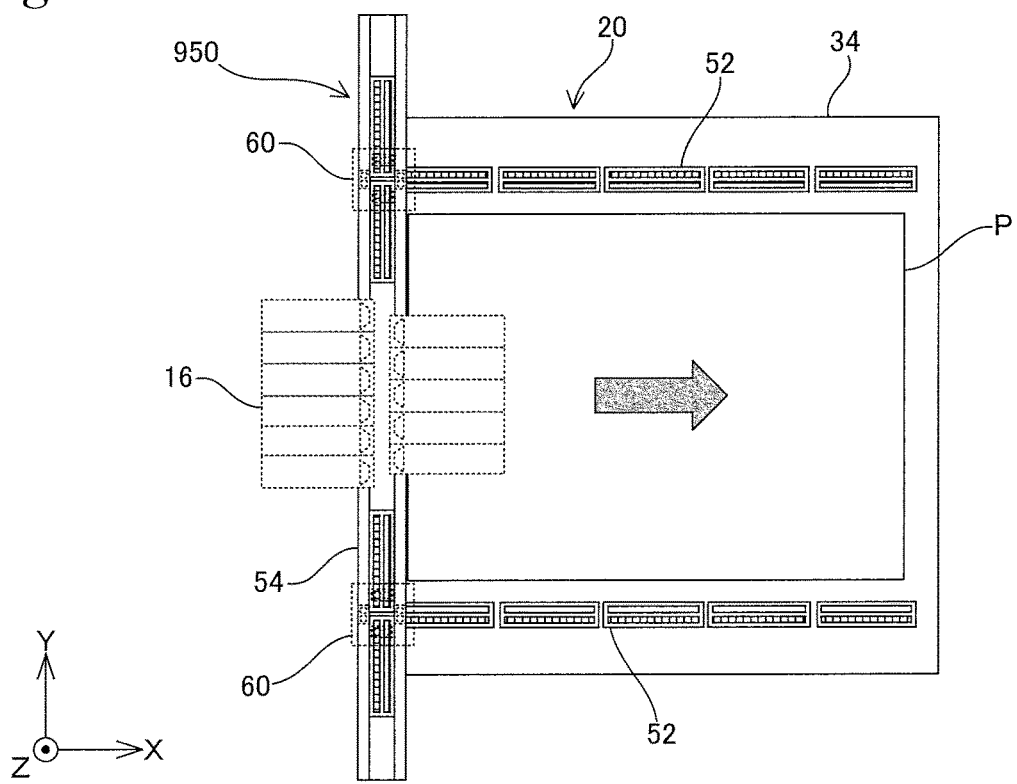
FIG. 17A is a view showing a substrate encoder system according to a comparative example.
Figure 17B:
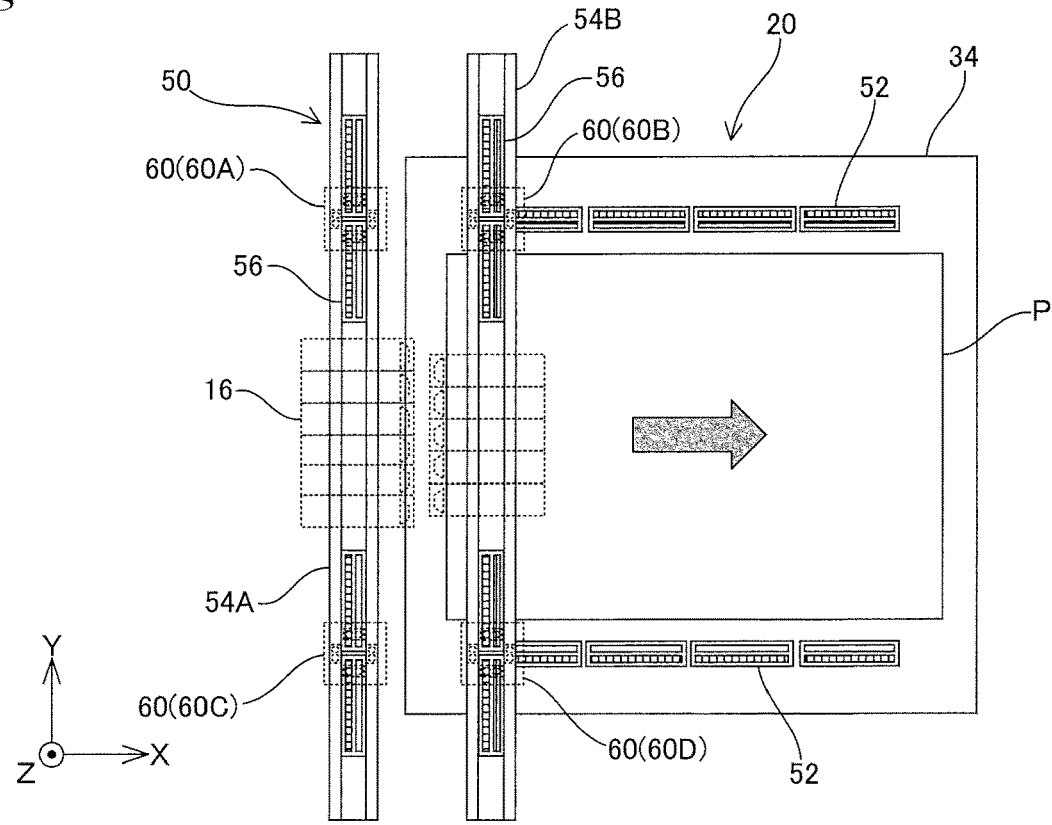
FIG. 17B is a view used to explain an effect of the substrate encoder system according to the embodiment.

Also, as in a substrate encoder system 950 according to a comparative example shown in FIG. 17A, since substrate encoder system 50 according to the embodiment shown in FIG. 17B is equipped with a plurality of (two) encoder units (an encoder unit consisting of encoder base 54A and head units 60A and 60B, and an encoder unit consisting of encoder base 54B and head units 60C and 60D) compared to the case when one encoder base (accordingly, two encoder heads 60) 54 is provided, the number of scales or the total length of the scales on substrate holder 34 can be reduced. This is because when two encoder units are equipped as in the embodiment, then the two encoder units can be used while switching between the two encoder units according to the movement of substrate holder 34 in the X-axis direction, even if the length of scales 52 is short as a whole. For example, in FIG. 17B, in the case there was only one encoder unit (the encoder unit consisting of encoder base 54A and head units 60A and 60B), while scale 52 has to be arranged at a measurement position of head unit 60A (directly below head unit 60A) to measure the position (X and Y positions) of substrate holder 34 in the state shown in FIG. 17B, in the embodiment, since another encoder unit (the encoder unit consisting of encoder base 54B and head units 60C and 60D) is arranged at a position where scale 52 can be measured, the length of scales 52 can be shortened as a whole as is illustrated. Note that to shorten the length of scales 52 as a whole as is illustrated (reduce the number of scales 52), allows substrate stage device 20 (refer to FIG. 1) to be smaller and lighter.

Second Embodiment

Next, a liquid crystal exposure apparatus according to a second embodiment will be described, using FIGS. 18A and 18B. Since the structure of the second embodiment is the same as the above first embodiment except for the point that the structure of substrate encoder system 150 is different, only the different points will be described below, and components having the same structure and function as the above first embodiment will have the same reference signs as the above first embodiment, and the descriptions thereabout will be omitted.

In substrate encoder system. 50 (refer to FIG. 3A) of the first embodiment described above, on each of the +Y side and the −Y side of projection optical system 16, a pair of head units 60 and encoder base 54 were arranged separately in the X-axis direction. Meanwhile, as is shown in FIG. 18A, substrate encoder system 150 according to the second embodiment is different on the point that in each of the +Y side (the upper half in FIG. 18, hereinafter also referred to as an "upper side") and the −Y side (the lower half in FIG. 18, hereinafter also referred to as a "lower side") of projection optical system 16, a pair of head units 60 (head units 60A and 60B forming a set, or head units 60C and 60D forming a set) and a pair of a row of scales 52 are arranged separately in the Y-axis direction.

Also, in substrate stage device 120 of the second embodiment, in each of the areas on the +Y side (upper side) and the −Y side (lower side) of substrate P on the upper surface of substrate holder 34, a plurality of rows of scales (52A to 52D) including five each of scales 46 arranged by a predetermined spacing (apart) in the X-axis direction are formed in a total of four rows; two rows each (52A and 52B forming two rows, or 52C and 52D forming two rows) separately in the Y-axis direction. Also, corresponding to the arrangement of the row of scales 52A to 52D arranged separately in the Y-axis direction, a plurality of head units 60 (60A to 60D) is arranged separately in the Y-axis direction. The pair of head units (60A and 60B, and 60C and 60D) is structured to move in the Y-axis direction synchronously with the movement in the Y-axis direction (Y stepping) of a substrate holder 134.

Figure 18A:
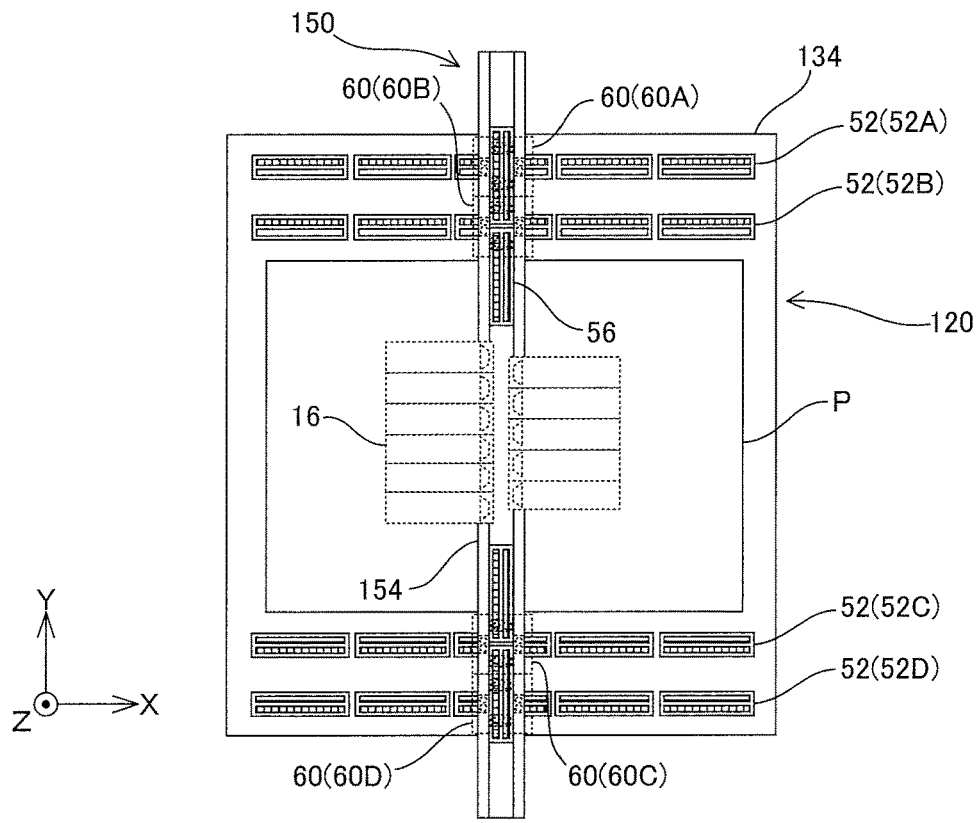
FIGS. 18A and 18B are views (No. 1 and No. 2) showing a substrate encoder system according to a second embodiment.
Figure 18B:
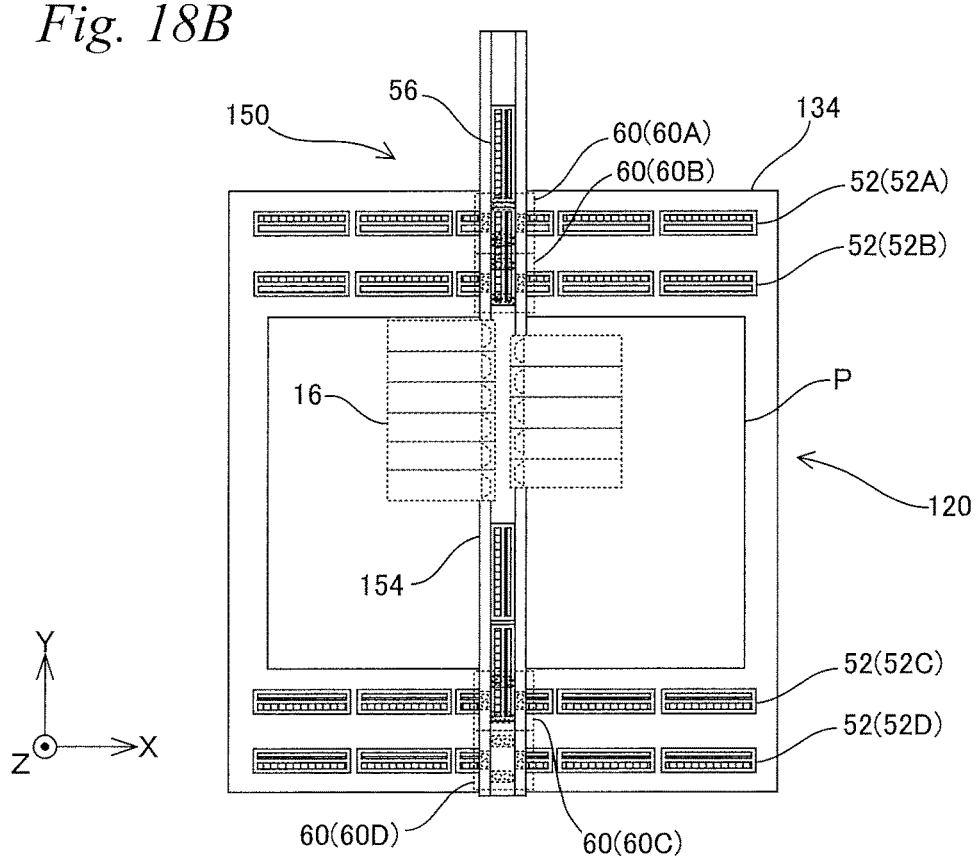

In substrate encoder system 150, as an example, as is shown in FIG. 18B, when substrate holder 134 is moved in the −Y direction from a state shown in FIG. 18A with respect to projection optical system 16, head unit 60D on the −Y side of the pair of head units 60C and 60D on the −Y side (lower side) moves into a state where head unit 60D is moved off of scale 56 on an encoder base 154. Therefore, when stepping movement of substrate holder 134 in the −Y direction is performed, switching control of the outputs of head unit 60 has to be performed so that measurement not depending on head unit 60D (measurement in which only head unit 60C is to be used on the lower side) can be performed, before head unit 60 D on the −Y side (lower side) moves off of scale 56 on encoder base 154.

Similarly, although it is not shown, when substrate holder 134 is moved in the +Y direction from the state shown in FIG. 18A with respect to projection optical system. 16, head unit 60A on the +Y side of the pair of head units 60A and 60B moves into a state where head unit 60A is moved off of scale 56 on encoder base 154. Therefore, when stepping movement of substrate holder 134 in the +Y direction is performed, switching control of the outputs of head unit 60 has to be performed so that measurement not depending on head unit 60A (measurement in which only head unit 60B is to be used on the upper side) can be performed, before head unit 60A moves off of scale 56 on encoder base 154.

According to the second embodiment, since the encoder system is equipped with a plurality of (two) head units (60A and 60B, and 60C and 60D) arranged in the Y-axis direction and rows of scales 52A to 52B on substrate holder 134 used together with the head units to perform measurement, the number of scales 56 on encoder base 154 can be decreased or the total length can be made shorter, regardless of the position of substrate holder 134 (substrate P) in the Y-axis direction. This is because when a combination of the head unit and row of scales (a set) as in the embodiment is equipped on each of the upper side and the lower side in the Y direction with projection optical system 16 in between, in a plurality of number of sets (two sets), then the sets used for measurement can be used while switching between the sets according to the movement of substrate holder 34 in the Y-axis direction, even if the length of scales 56 on encoder base 154 is short as a whole. For example, in FIG. 18B, in the case there was only one set (scale 52A and head unit 60A, and scale 52D and head unit 60D) arranged on the upper side and the lower side, while scale 56 on encoder base 154 has to be arranged at a measurement position of head unit 60D (directly below head unit 60D) to measure the position (X and Y positions) of substrate holder 34 in the state shown in FIG. 18B, in the embodiment, since another set (scale 54C and head unit 60C) is arranged at a position where scale 56 can be measured, the length of scales 56 can be shortened as a whole as is illustrated.

Note that making the length of scales 56 shorter as a whole as is illustrated (reducing the number of scales 56), since encoder base 154 is attached to upper mount section 18a (optical surface plate) as is shown in FIG. 1, in other words allows the length of upper mount section 18a in the Y-axis direction to be reduced.

Also, according to the second embodiment, since scale 52 on substrate holder 134 is prepared in a plurality of numbers on each of the sides in the Y direction (+Y side and −Y side) with projection optical system 16 in between, along with a plurality of head units 60 corresponding to the scales, when Y stepping of substrate holder 34 is performed, the movable range (movable range in the Y direction) of head units 60 moved in the Y direction following substrate holder 34 can be made shorter (smaller) than in the case when only one set is prepared on each of the sides. In other words, the movable range of head units 60 which is a movable body moved in the Y direction can be shortened, which can keep the movement of the movable body (head units 60) minimal and can suppress the movement from affecting an aspect of accuracy.

Note that the structure of each of the first and second embodiments described above is an example and can be appropriately changed. For example, in the first embodiment described above, while X encoder system 50 has a pair of Y slide tables 62 arranged separately in the X-axis direction on the +Y side and the −Y side of projection optical system 16, the number of Y slide tables 62 may be three or more, and to each of the three Y slide tables 62, a total of eight heads 64x, 64y, 66x, and 66y may be attached (that is, three or more head units 60 may be arranged at a predetermined spacing in the X-axis direction) similarly to the first embodiment described above. Also, in the first and second embodiments, the number of heads 66x and 66y attached to Y slide table 62 facing downward at a predetermined spacing in the X-axis direction may be three or more.

Also, in the first embodiment described above, since the pair of Y slide tables 62 is moved in the Y-axis direction synchronously, for example, the pair of Y slide tables 62 may be integrated into one Y slide table 62, and heads 66x and 66y facing downward may be arranged in a manner similar to that of the first embodiment described above at Y slide table 62. In this case, the drive system (encoder base 54) and measurement system (heads 64x and 64y facing upward) of one of the Y slide tables 62 can be omitted. Also, similarly in the second embodiment described above, Y slide tables 62 arranged on each of the +Y side and the −Y side of projection optical system 16 may be connected.

Figure 19A:
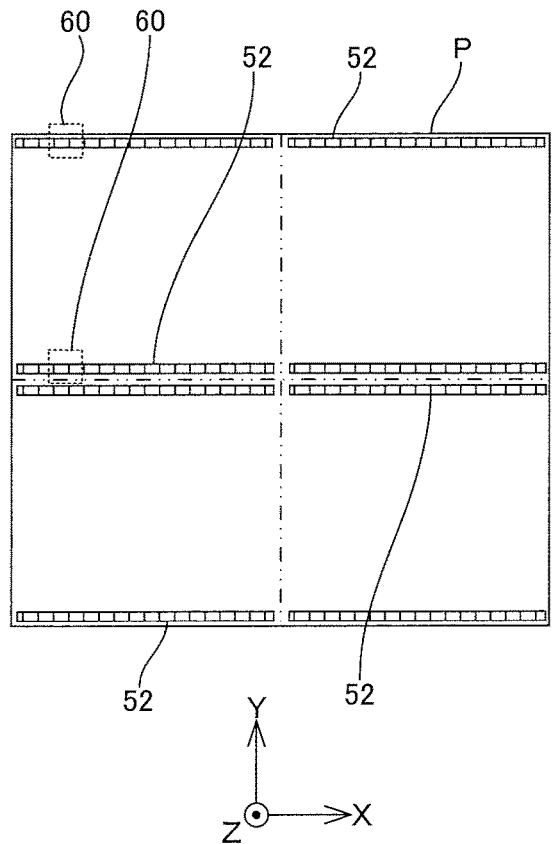
FIGS. 19A and 19B are views showing a substrate according to a first modified example and a second modified example.
Figure 19B:
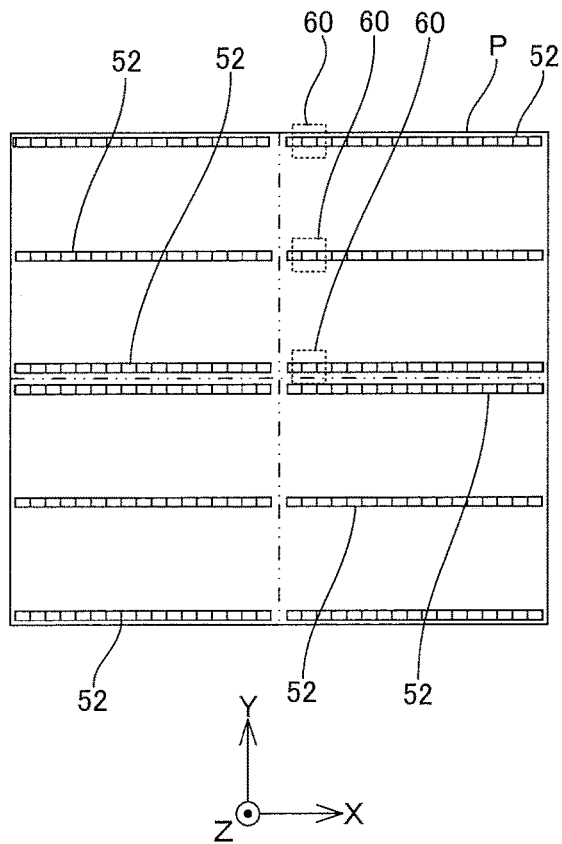
Figure 19C:
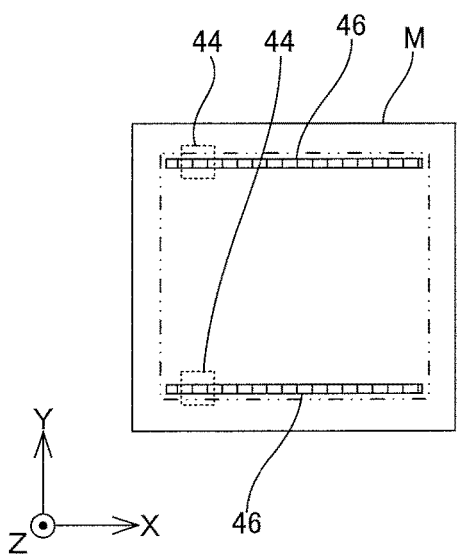
FIGS. 19C and 19D are views showing a mask according to the first modified example and the second modified example.
Figure 19D:
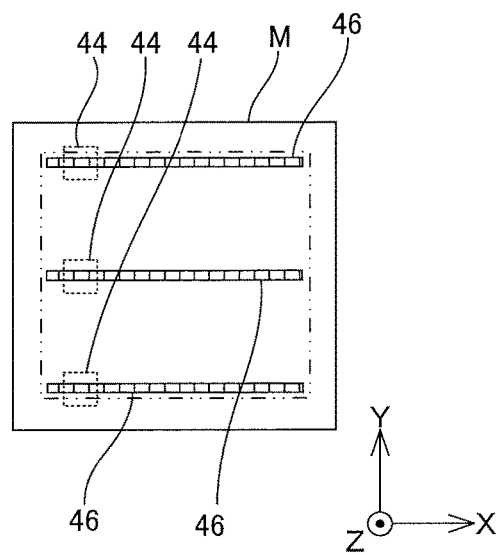

Also, in each of the embodiments described above, while scales 46 and 52 are attached to mask holder 48 and substrate holder 34, respectively, the embodiments are not limited to this, and scales 46 may be formed directly on mask M and scales 52 may be formed directly on substrate P. In substrate P shown in FIG. 19A, scales 52 are formed near the edge of shot areas (within the shot area, or in between shot areas), and in substrate P shown in FIG. 19B, adding to the areas near the edge of the shot areas, scales 52 are formed in areas where the pattern is not formed within the shot area. With such scales 52, a scale pattern can be formed in advance on mask M along with the device pattern, and the scale pattern can be formed on substrate P simultaneously with the transfer (exposure) operation of the device pattern onto substrate P. Accordingly, in the case of performing exposure operation from the second layer onward, position control of substrate P can be performed directly, using scales 52 formed on substrate P. Similarly, as is shown in FIGS. 19C and 19D, scales 46 may be formed directly on mask M. Also, as for the substrate encoder system, by arranging a plurality of head units 60 corresponding to the plurality of scales 52 formed within the shot area, position measurement of substrate P can be performed with pinpoint accuracy for each shot area subject to exposure, which improves position controllability. Also, a nonlinear component error can be obtained for each shot area using measurement results of the plurality of scales within the shot area, and by performing position control of substrate P at the time of exposure based on the error, overlay exposure accuracy can be improved. The point in which the plurality of head units 60 is moved by predetermined strokes in the Y-axis direction synchronously with the Y stepping operation of substrate P along with moving into a stationary state at the time of scanning exposure operation is the same as each of the embodiments described above.

Figure 20A:
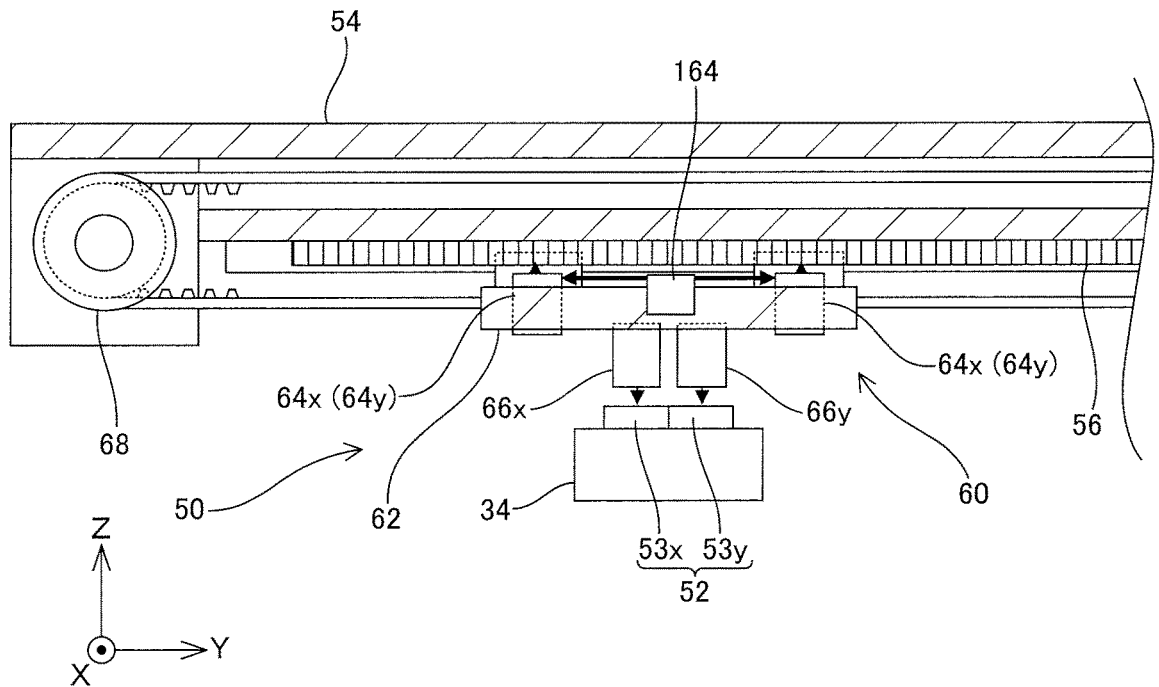
FIGS. 20A and 20B are views (No. 1 and No. 2) used to explain a structure of a measurement system for obtaining the distance between a pair of heads.
Figure 20B:
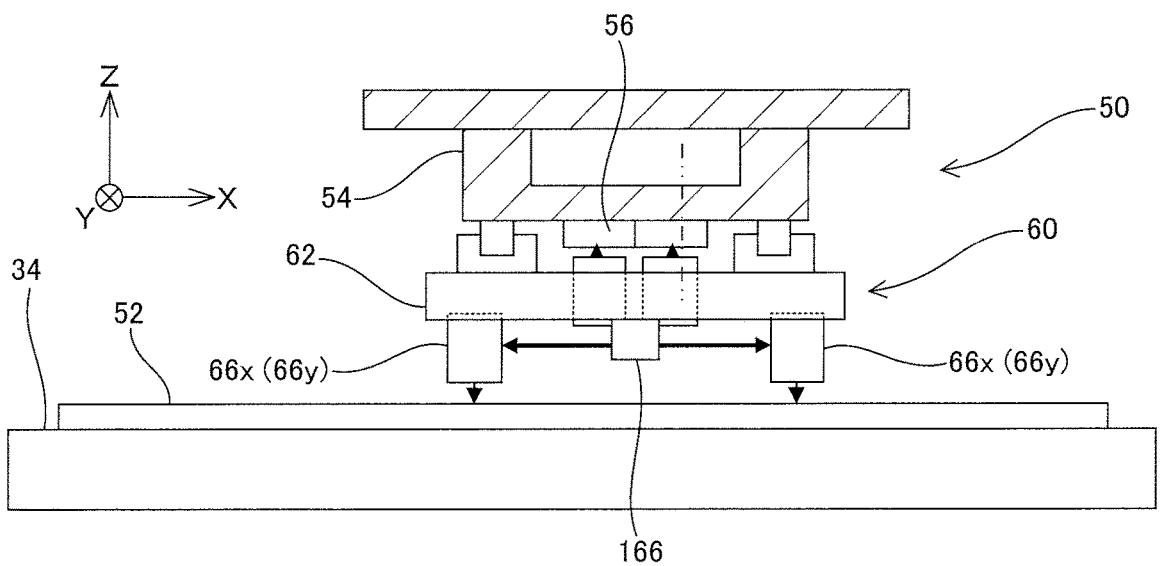

Also, as is shown in FIGS. 20A and 20B, the distance between the pair of encoder heads (namely, each of the pair of X heads 64x, the pair of X heads 66x, the pair of Y heads 64y, and the pair of Y heads 66y) that head unit 60 has may be measured by sensors 164 and 166, and the output of substrate encoder system 50 may be corrected using the measurement values. While the type of sensors is not limited in particular for sensors 164 and 166, for example, a laser interferometer or the like can be used. While linkage process is performed on the output of the pair of encoder heads as is described above in substrate encoder system 50, in this linkage process, preconditions are that the spacing in between the encoder heads of the pair is known and also invariable. Therefore, while Y slide table 62 to which each head is attached is formed, for example, by a material less affected by thermal expansion or the like, even if Y slide table 62 is deformed (spacing between encoder heads of a pair changes) by measuring the spacing between the encoder heads as in the modified example, position information of substrate P can be obtained with high accuracy. Similarly, in mask encoder system 48, the distance between the pair of encoder heads (namely, the pair of X heads 49x and the pair of Y heads 49y) may be measured, and the output of mask encoder system 48 may be corrected using the measurement values. The same applies also to heads 49x and 49y of mask encoder system 48. Also, relative positional relation may be measured for each of the heads (a pair of downward heads 66x and 66y, and a pair of upward heads 64x and 64y) that head unit 60 has (a total of eight heads in the embodiment), and the measurement values may be corrected.

Also, as is described above, a calibration operation may be performed in which the distance is measured as appropriate (for example, each time substrate exchange is performed) in the pair of encoder heads (namely, each of the pair of X heads 64x, the pair of X heads 66x, the pair of Y heads 64y, and the pair of Y heads 66y) that head unit 60 has. Also, other than a calibration point for performing the measurement of the spacing between heads described above, a calibration point may be provided for performing origin setting of each of the outputs of mask encoder system 48 and substrate encoder system 50. A positioning mark for performing origin setting may be placed on prolonged lines (outer side) of the plurality of scales 46 and 56, may be placed in between a pair of scales 46 and 52 which are adjacent, or may be formed within scales 46 and 52.

Figure 21A:
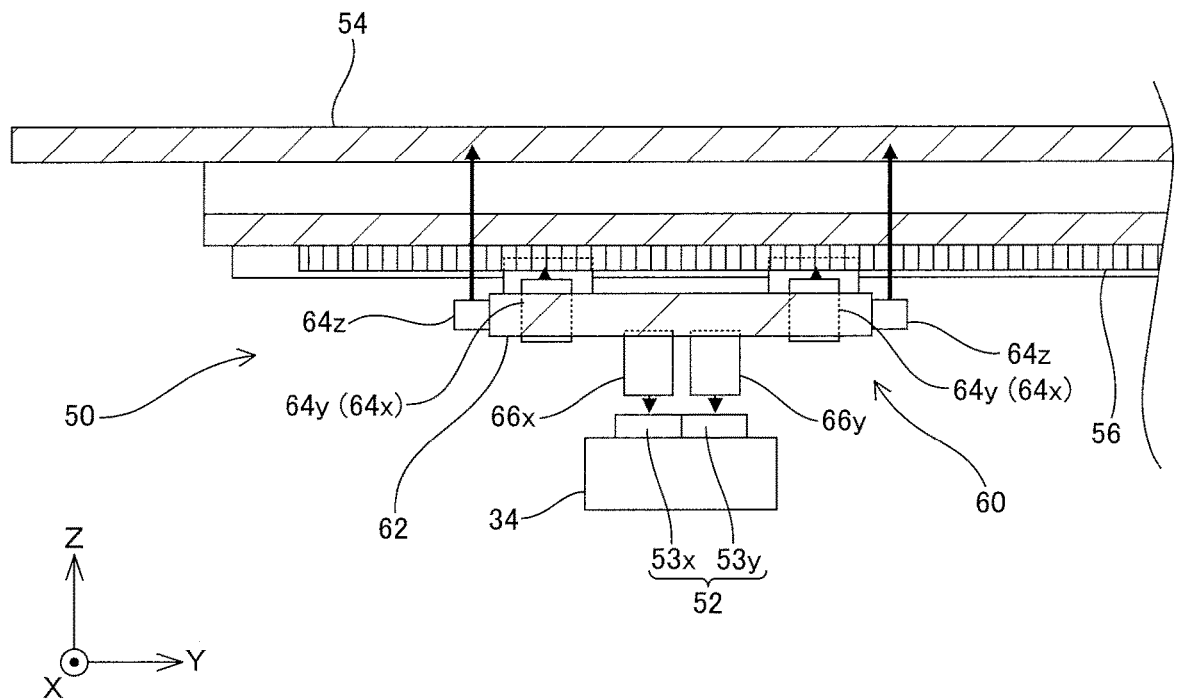
FIGS. 21A and 21B are views (No. 1 and No. 2) used to explain a structure of a measurement system for obtaining the tilt amount of a Y slide table.
Figure 21B:
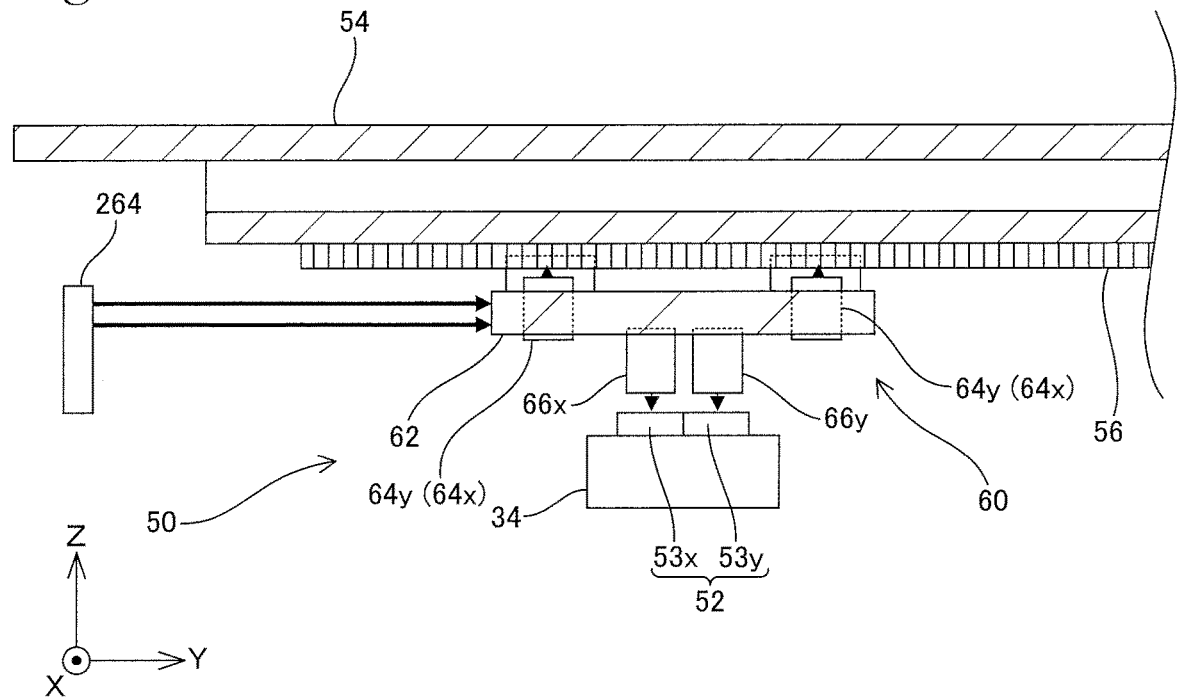

Also, tilt (tilt in the θx and θy directions) amount with respect to the horizontal plane of Y slide table 62 to which each of the encoder heads 64x, 64y, 66x, and 66y is attached may be obtained, and the output of substrate encoder system 50 may be corrected according to the tilt amount (namely, inclined amount of the optical axis of each of the heads 64x, 64y, 66x, and 66y). As the measurement system, as is shown in FIG. 21A, a measurement system can be used in which a plurality of Z sensors 64z is attached to Y slide table 62 and obtains tilt amount of Y slide table 62 with encoder base 54 (or upper mount section 18a) serving as a reference. Or, as is shown in FIG. 21B, a two-axis laser interferometer 264 may be provided to obtain the tilt amount (tilt amount in the θx and θy directions) and rotation amount (rotation amount in the θz direction) of Y slide table 62. Also, the tilt amount of each of the heads 64x, 64y, 66x, and 66y may be measured individually.

Figure 22A:
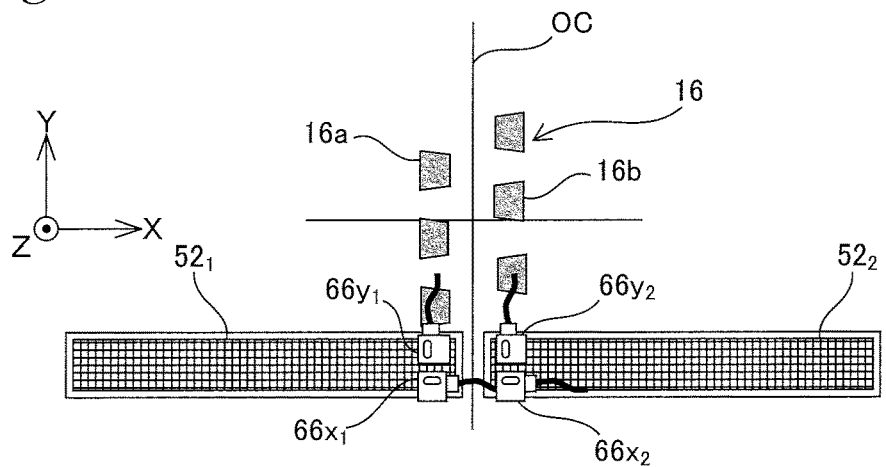
FIGS. 22A to 22C are views showing modified examples (No. 1 to No. 3) of arrangements of heads and scales.

Also, in the second embodiment described above, as is shown in FIG. 22A, X positions of X head $66X_1$ on the −X side and Y head $66Y_1$ on the −X side may be made to coincide with the X position of an optical system 16a of a plurality of optical systems structuring projection optical system 16 arranged on the −X side with respect to an axis OC parallel to the Y-axis passing through the optical center of projection optical system 16, along with the X positions of X head $66X_2$ on the +X side and Y head $66Y_2$ on the +X side may be made to coincide with the X position of an optical system 16b of the plurality of optical systems arranged on the +X side with respect to axis OC, that is, spacing between the pair of heads $66X_1$ and $66X_2$ and spacing between the pair of Y heads $66Y_1$ and $66Y_2$ may be made to coincide with the spacing between optical systems 16a and 16b. This can reduce Abbe error. Note that the spacing does not necessarily have to coincide with the spacing between optical systems 16a and 16b, and X head $66X_1$ and Y head $66Y_1$ on the −X side and X head $66X_2$ and Y head $66Y_2$ on the +X side may be arranged at an equal distance (symmetrically with respect to axis OC) with respect to axis OC. Also, in the first embodiment described above, by arranging the pair of head units 60 adjacent in the X-axis direction at an equal distance with respect to axis OC (symmetrically with respect to axis OC), Abbe error can be reduced. In this case as well, of the pair of head units 60 adjacent in the X-axis direction, heads 66x and 66y arranged on the inner side are preferably made to coincide with the X position of optical systems 16a and 16b.

Figure 22B:
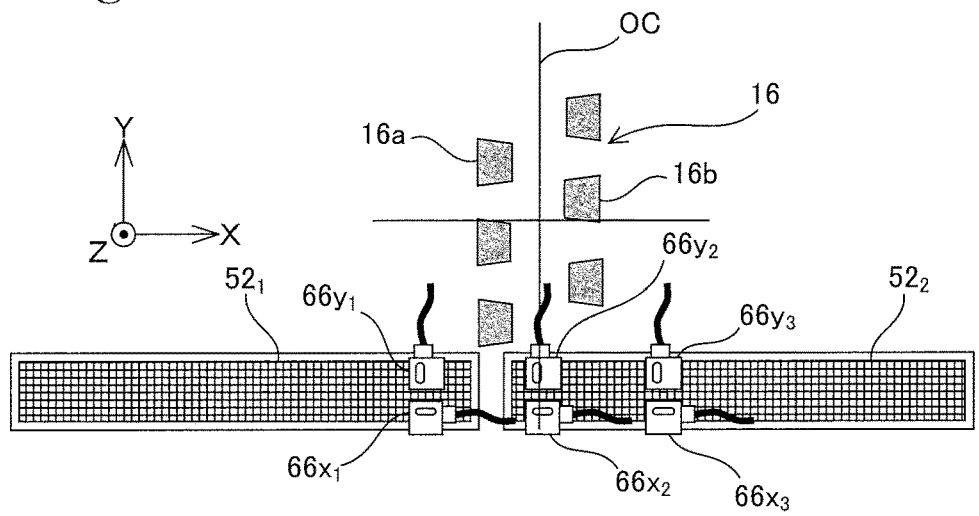

Also, as is shown in FIG. 22B, per one head unit 60 (refer to FIG. 18A), e.g., three X heads $66X_1$ to $66X_3$, and e.g., three Y heads $66Y_1$ to $66Y_3$ may be attached at a predetermined spacing (a distance longer than the spacing between adjacent scales $52_1$ and $52_2$) in the X-axis direction. In this case, X head $66X_2$ and Y head $66Y_2$ in the center are preferably arranged on axis OC. In this case, two heads constantly face the scale, which stabilizes position measurement accuracy in the θz direction.

Figure 22C:
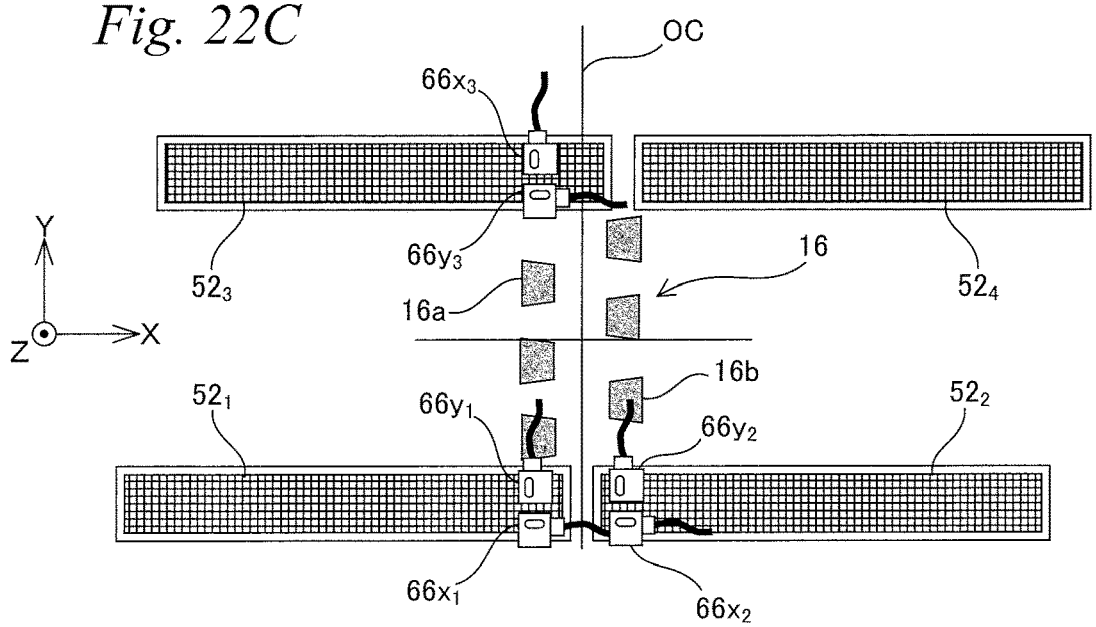

Also, as is shown in FIG. 22C, the X position of scales $52_1$ and $52_2$ on the +Y side and the X position of scales $52_3$ and $52_4$ on the −Y side (namely, position of the gap in between scales 52) may be shifted from each other so that X head $66X_3$ and Y head $66Y_3$ on the +Y side do not move off of the measurement range simultaneously with X head $66X_1$ and Y head $66Y_1$ (or X head $66X_2$ and Y head $66Y_2$) on the −Y side. In this case, one X head 66x and one Y head 66y on the +Y side can be omitted.

Figure 23A:
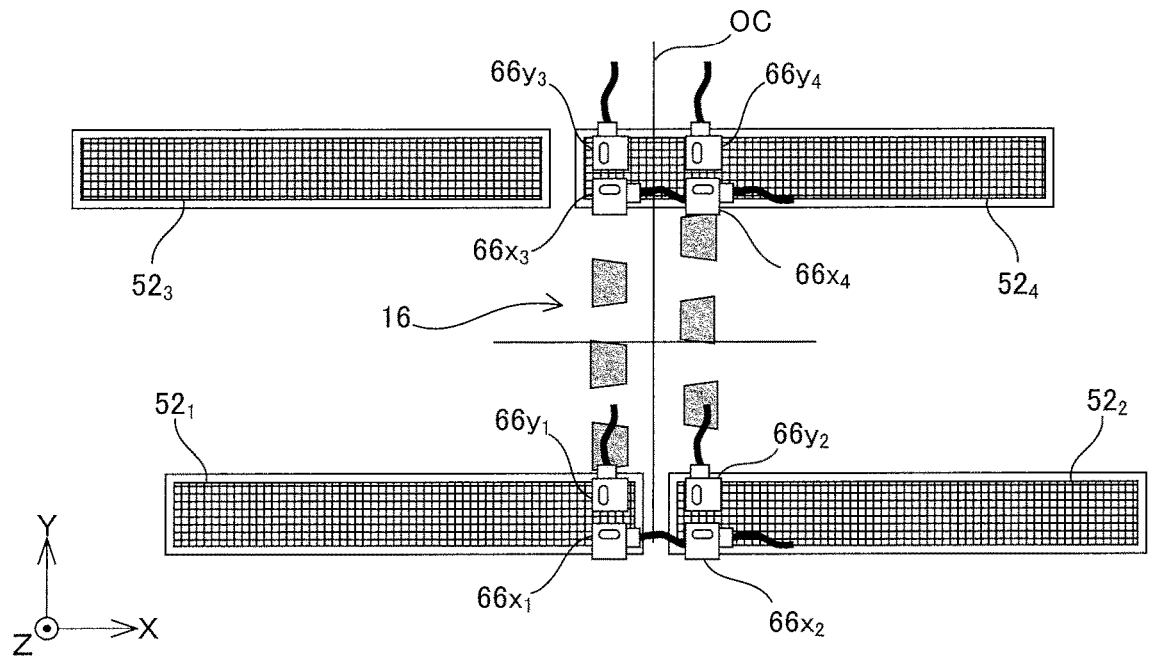
FIGS. 23A and 23B are views showing modified examples (No. 4 and No. 5) of arrangements of heads and scales.

Also, as is shown in FIG. 23A, the X position of scales $52_1$ and $52_2$ on the +Y side and the X position of scales $52_3$ and $52_4$ on the −Y side may be mutually shifted, so that X head $66X_3$ and Y head $66Y_3$ on the +Y side do not move off of the measurement range simultaneously with X head $66X_1$ and Y head $66Y_1$ on the −Y side, and also so that X head $66X_4$ and Y head $66Y_4$ on the +Y side do not move off of the measurement range simultaneously with X head $66X_2$ and Y head $66Y_2$ on the −Y side.

Figure 23B:
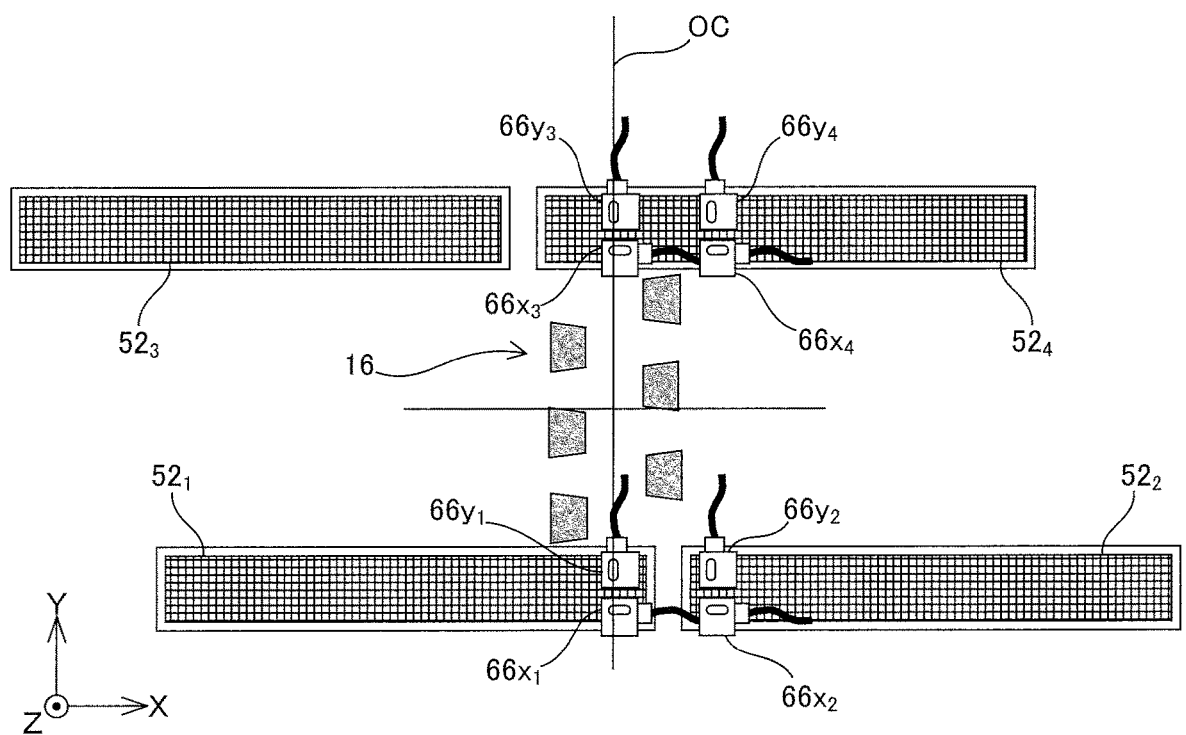

Also, as is shown in FIG. 23B, X head $66X_3$ and Y head $66Y_3$ on the +Y side may be arranged on axis OC. In this case as well, the X position of scales $52_1$ and $52_2$ on the +Y side and the X position of scales $52_3$ and $52_4$ on the −Y side should be mutually shifted, so that X head 66X$_2$ and Y head 66Y$_2$ on the −Y side do not move off of the measurement range simultaneously.

Figure 24A:
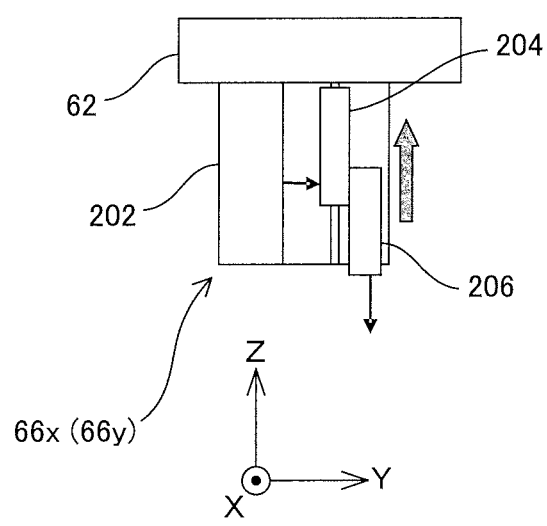
FIGS. 24A and 24B are views (No. 1 and No. 2) used to explain a structure of a vertical drive mechanism of encoder heads.
Figure 24B:
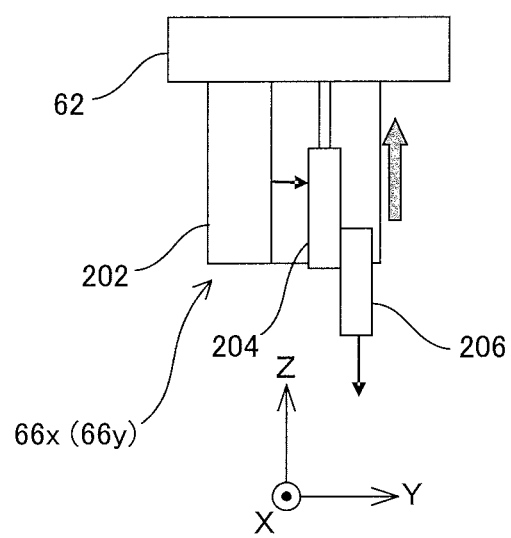

Also, as is shown in FIGS. 24A and 24B, Z drive mechanism may be provided at heads 66x and 66y facing downward that face scales 52 (refer to FIG. 1) attached to substrate holder 40. Heads 66x and 66y include a movable head 206 which is movable in the Z-axis direction. In the case Z change of substrate P with scale 52 is small and is known, movable head 206 is preferably moved vertically (e.g., moved following an auto focus operation of substrate P), synchronously with Z-axis/tilt-axis of substrate holder 40. Also, in the case Z change differs between substrate P and scale 52, heads 66x and 66y should have an auto focus function and movable head 206 is preferably moved vertically based on outputs of the auto focus function. Also, in the case errors that occur by moving movable head 206 in the Z-axis direction have a large influence, as the Z drive mechanism, an X interferometer 202 fixed to Y slide table 62 and a movable mirror 204 (movable head 206 is fixed to mirror 204) which can be moved in the Z-axis direction should be provided, so that deviation can be fed back.

Figure 25A:
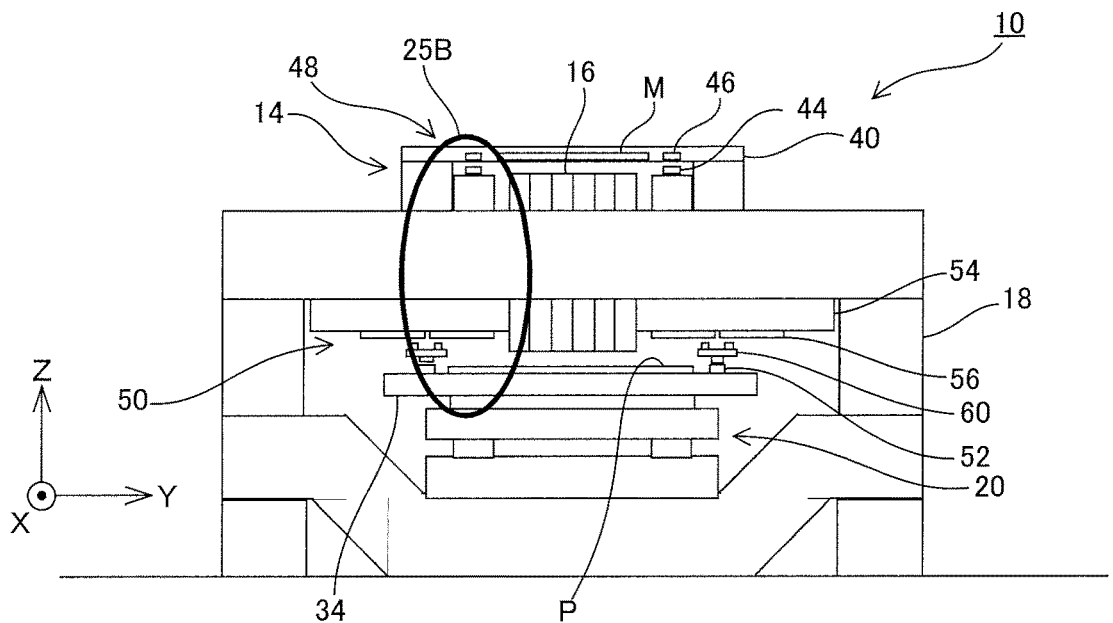
FIGS. 25A and 25B are views (No. 1 and No. 2) used to explain a first concept of a relative position measurement system between a substrate encoder system and a mask encoder system.
Figure 25B:
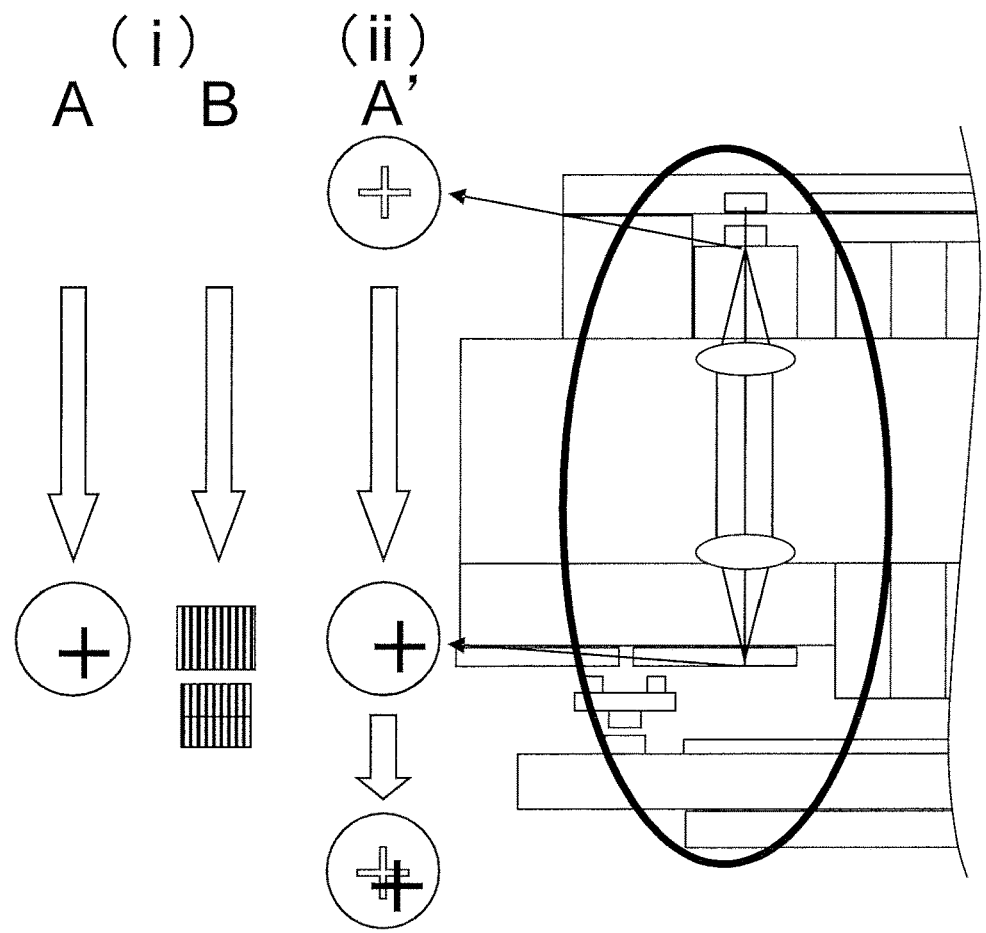

Also, a measurement system (relative position measurement system) may be provided that measures relative position between the encoder (mask encoder system 48) on the mask stage device 14 side and the encoder on the substrate stage 20 side (substrate encoder system 50). FIGS. 25A and 25B show schematic views of the relative position measurement system described above.

Figure 26:
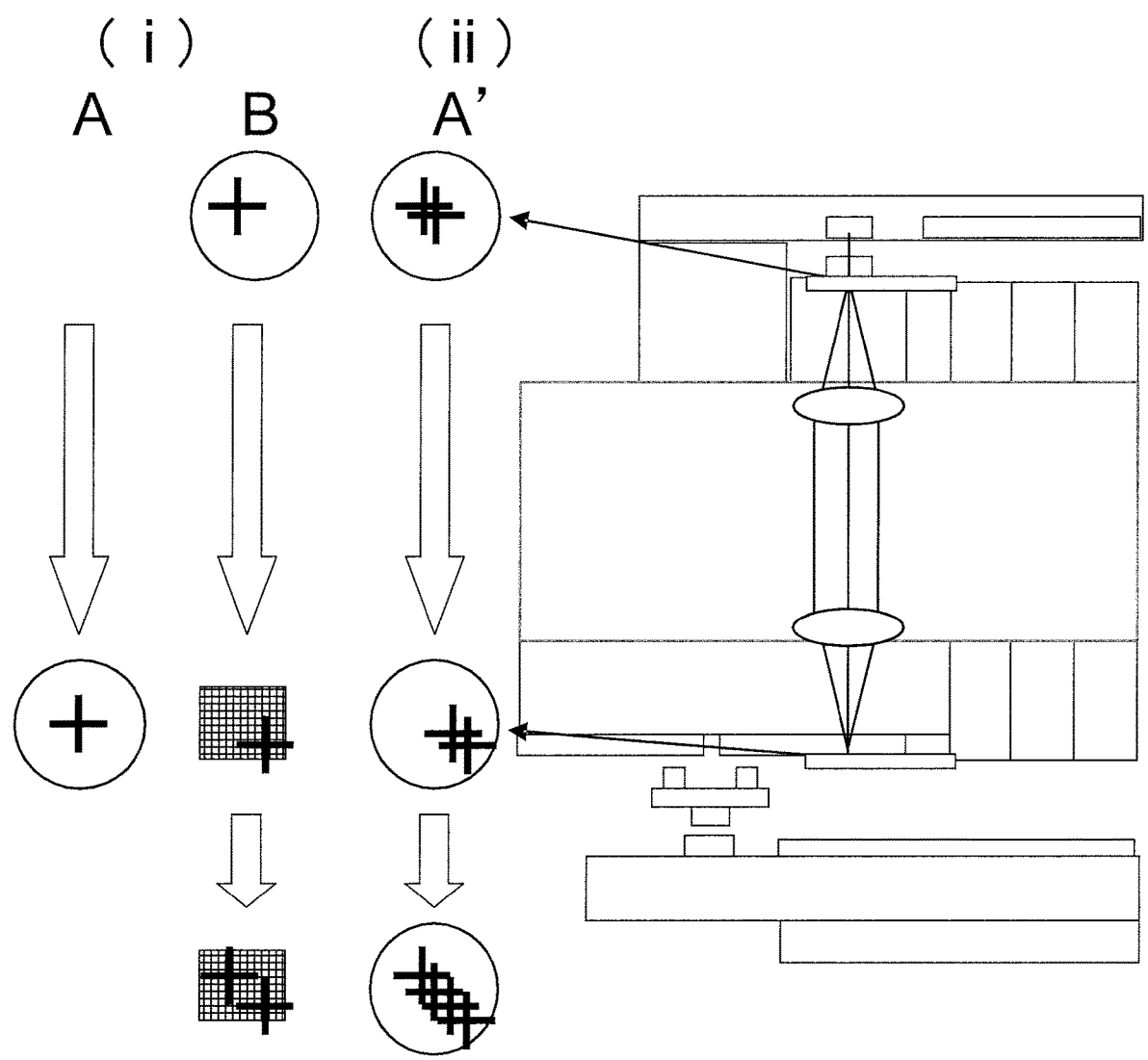
FIG. 26 is a view showing a concrete example of a relative position measurement system between the substrate encoder system and the mask encoder system, based on the first concept.

As the concept of the relative position measurement system, the system employs a structure of controlling the relative position between the encoder system on the mask stage device 14 side and the encoder system on the substrate stage device 20 side by observing a lens scale (or a reference mark) with a position sensor of the mask encoder system. As the sequence, (S1) after measuring the mask encoder and the scale with the position sensor, (S2) the encoder system on the substrate stage side is moved to measure the scale position (or the reference mark), and (S3) according to (S1) and (S2) described above, relative position of mask stage device 14 and substrate stage device 20 is controlled. To describe the operation specifically, i) after the mark of the lens scale (substrate stage side) is observed, ii) difference between the mask stage encoder and the lens scale (substrate stage side) is observed. In procedure i) described above, A: the reference mark is observed, along with, B: observing the lens scale (refer to (i) in FIG. 25B). Also, in procedure ii) described above, a mark is also arranged and observed on the mask stage side (refer to (ii) in FIG. 25B). As is shown in FIG. 26, a plate on which a reference mark is formed may be provided in projection optical system 16, and the mark formed on the plate may be observed.

Figure 27A:
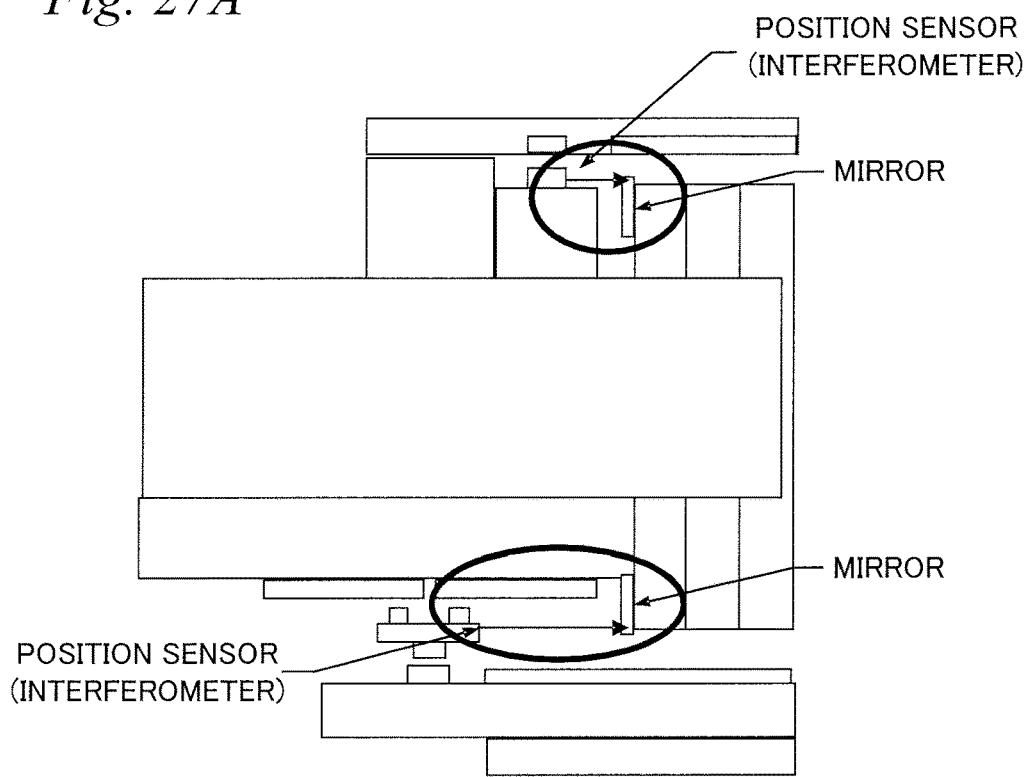
FIGS. 27A and 27B are views (No. 1 and No. 2) used to explain a second concept of a relative position measurement system between a substrate encoder system and a mask encoder system.
Figure 27B:
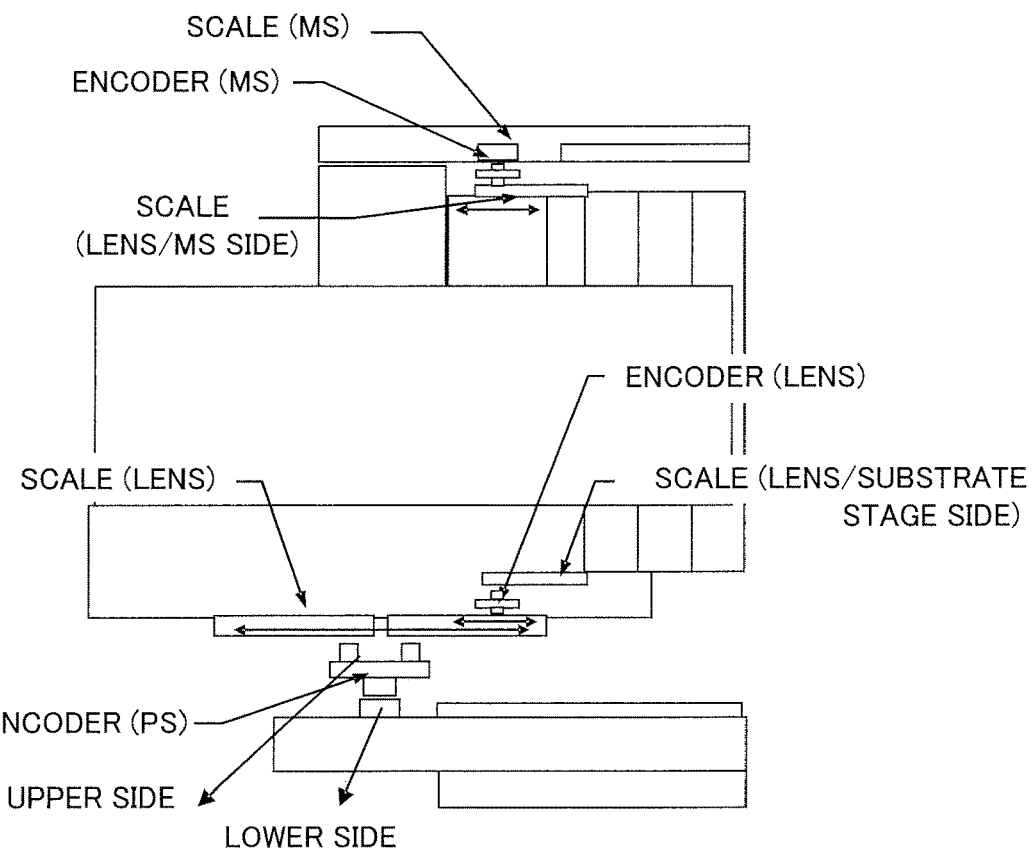
Figure 28A:
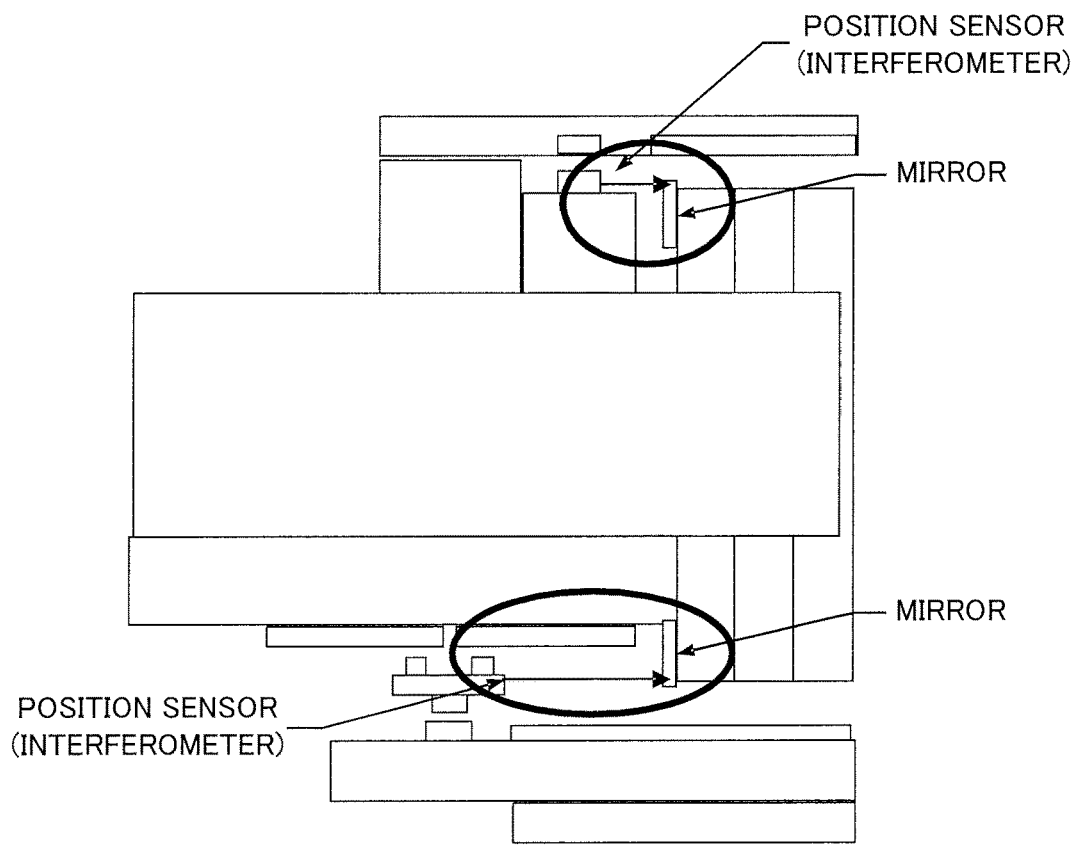
FIGS. 28A to 28C are views showing a concrete example of a relative position measurement system between the substrate encoder system and the mask encoder system, based on the second concept (No. 1).
Figure 28B:
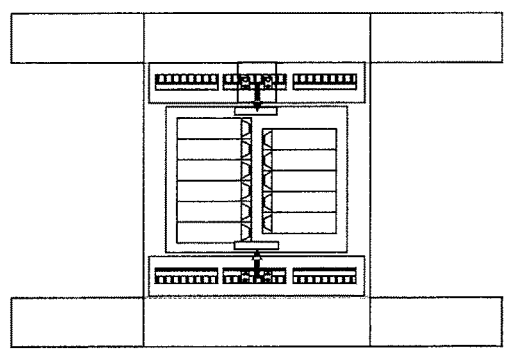
Figure 28C:
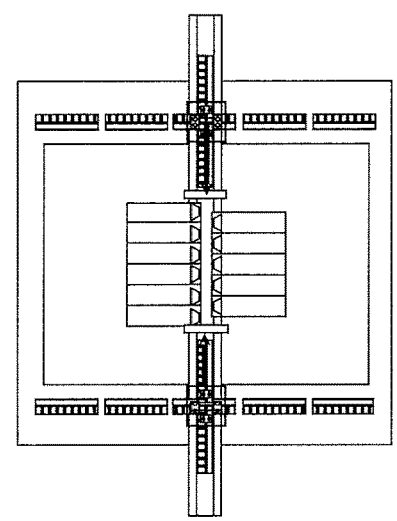

Also, as the relative position measurement system, aspects shown in FIGS. 27A and 27B can be employed. In the aspect shown in FIG. 27A, lens distance is measured by the position sensor of each of the encoders. Also, in the aspect shown in FIG. 27B, the distance between lenses is observed by each of the encoders (lens-mask stage side, and lens-plate stage side). Note that each of the encoders is movable. In the case of the aspects shown in FIGS. 27A and 27B, that is, in the case of a lens (image position) reference, while the structure can be constituted without the structures shown in FIGS. 25A to 26, the structure may be combined with the structures shown in FIGS. 25A to 26. Also, calibration of the relative position is preferably performed at the time of base line measurement (image position reference calibration such as lens calibration). FIGS. 28A to 28C are views showing details on the aspect shown in FIG. 27A described above, and FIGS. 29A to 29C are views showing details on the aspect shown in FIG. 27B described above.

Figure 30:
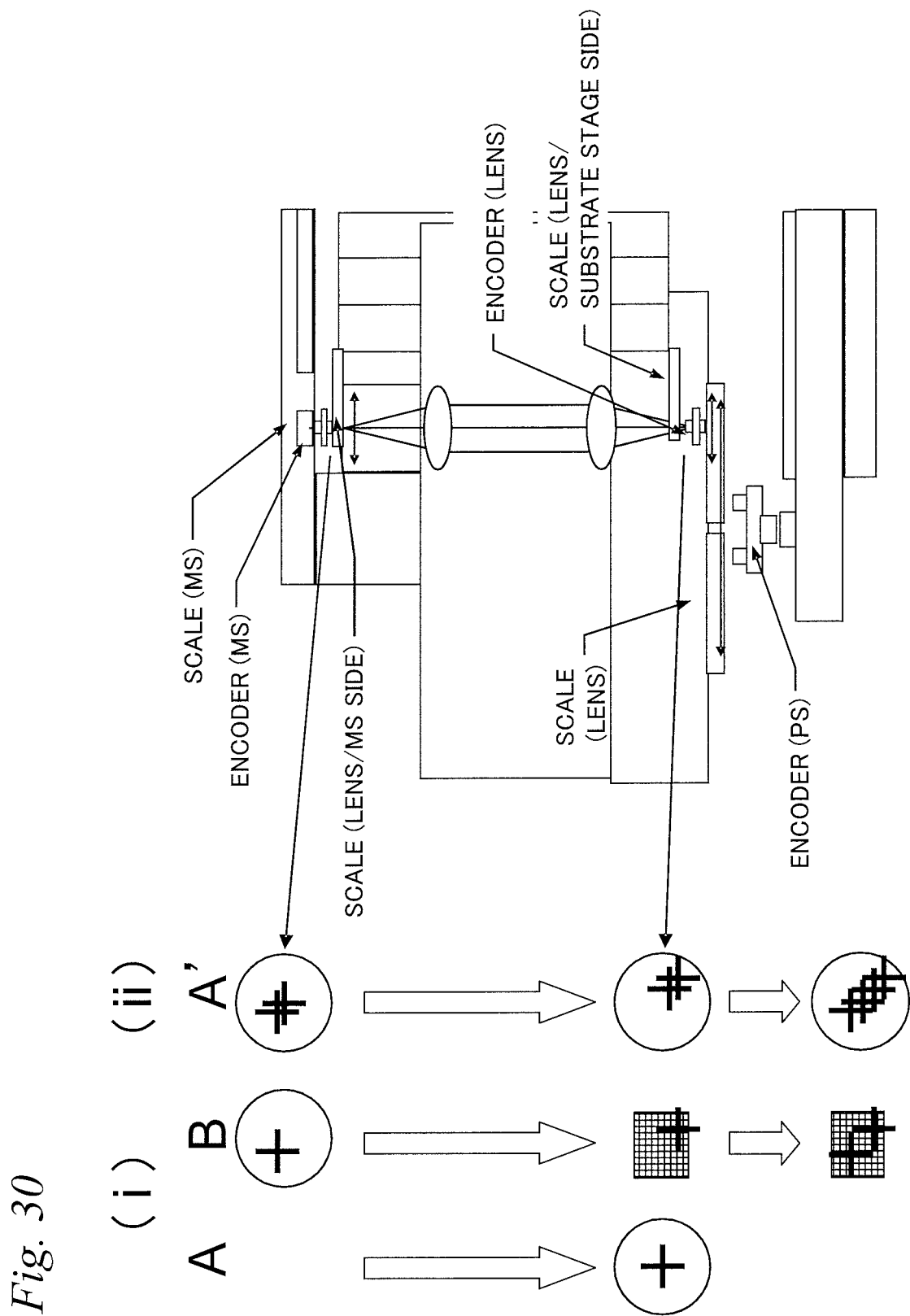
FIG. 30 is a view showing a concrete example of a relative position measurement system between a substrate encoder system and a mask encoder system, based on a third concept (No. 1).
Figure 31:
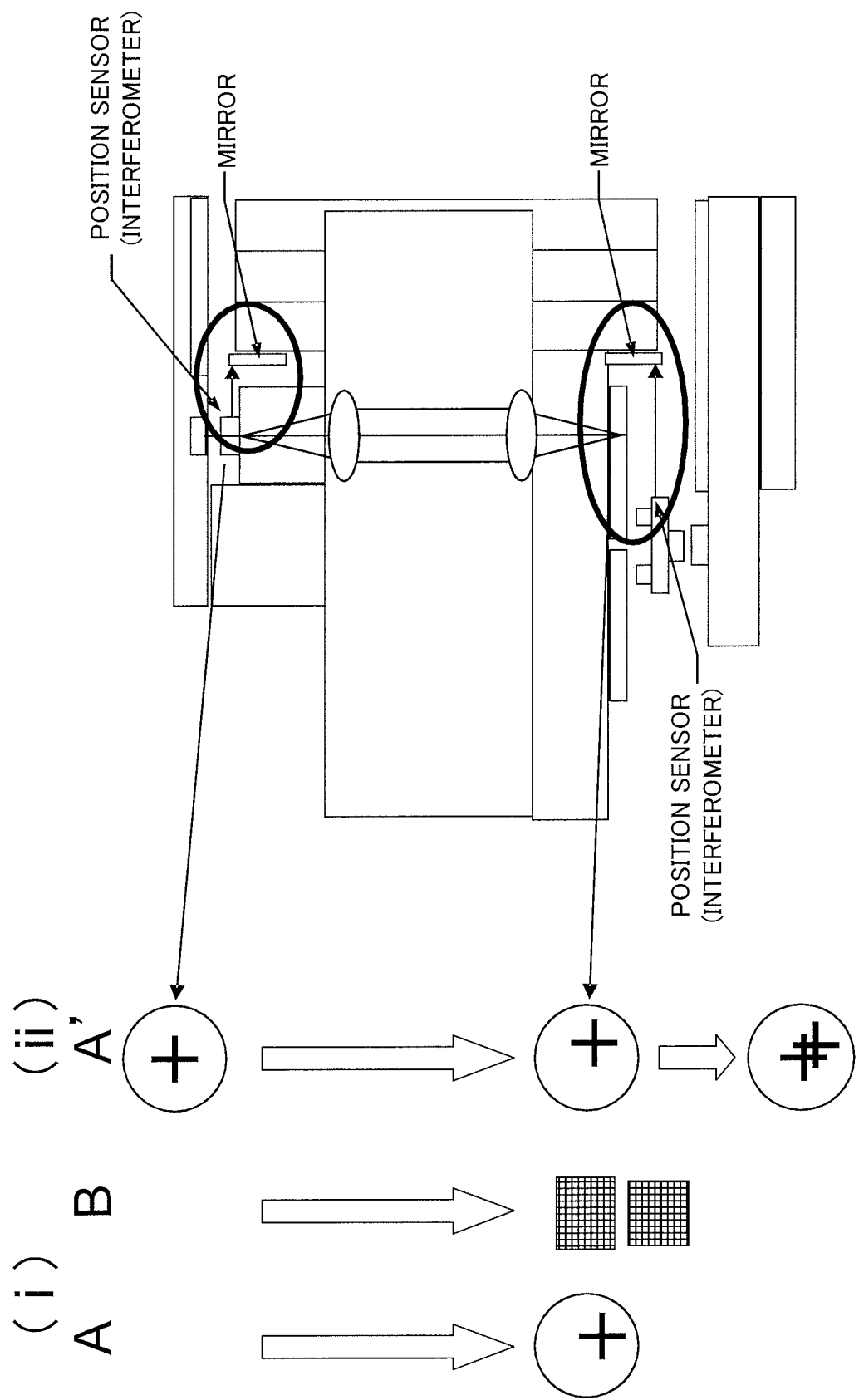
FIG. 31 is a view showing a concrete example of a relative position measurement system between the substrate encoder system and the mask encoder system, based on the third concept (No. 2).

FIGS. 30 and 31 show other specific examples of a relative position measurement system based on concept described above (refer to FIGS. 25A and 25B). The aspects shown in FIGS. 30 and 31 are a combination of the two aspects described above. As a procedure, similarly to the aspect shown in FIG. 26 described above, i) after the mark of the lens scale (substrate stage side) is observed, ii) difference between the mask stage encoder and the lens scale (substrate stage side) is observed. In procedure i) described above, A: the reference mark is observed, along with, B: observing the lens scale (refer to (i) in FIGS. 30 and 31). Also, in procedure ii) described above, a mark is also arranged and observed on the mask stage side (refer to (ii) in FIGS. 30 and 31).

Figure 32:
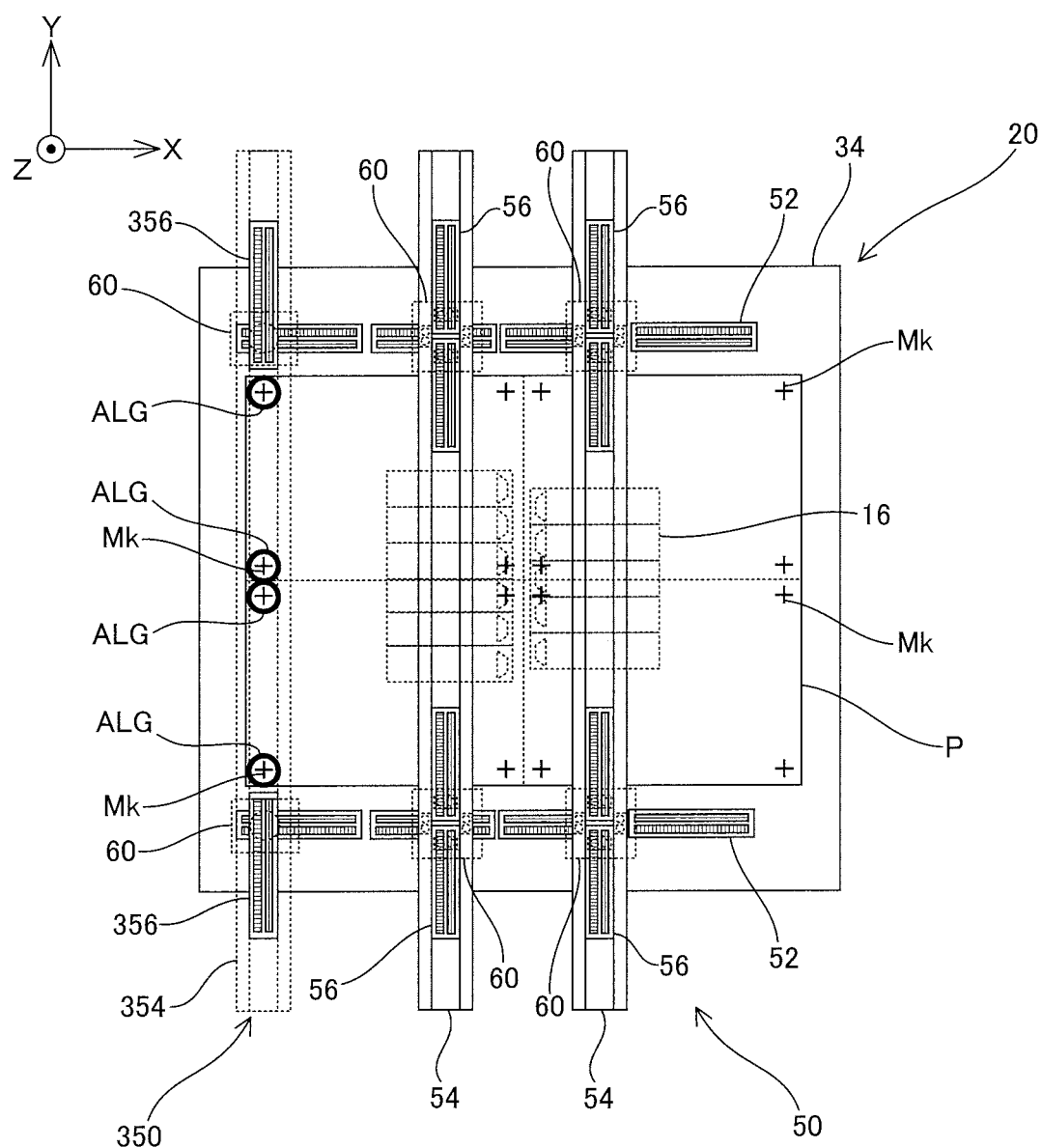
FIG. 32 is a view used to explain a structure of a substrate alignment measurement system.

Now, in liquid crystal exposure apparatus 10 (refer to FIG. 1), in upper mount section 18a (optical surface plate) supporting projection optical system 16, as is shown in FIG. 32, a plurality of alignment microscopes ALG system (hereinafter simply referred to as "ALG system") is provided to measure a plurality of alignment marks Mk (hereinafter simply referred to as "mark Mk") on substrate P. In the example of FIG. 32, four shot areas are set (the case of a so-called four-piece setting) on substrate P, mark MK (illuminated much larger than the actual size) is formed near the four corners in each of the four shot areas. A plurality of ALG systems is arranged in the Y-axis direction so that a plurality of marks Mk formed in the Y-axis direction on the substrate can be detected (measured) simultaneously. In FIG. 32, four ALG systems are lined in the Y direction and are provided fixed to upper mount section 18a via a base member 354 at a spacing according to the formed spacing of mark Mk, so that a total of four marks Mk formed within two shot areas lined in the Y-axis direction can be measured. Base member 354 is structured in almost the same manner as base member 54 described above, however, as is shown in FIG. 32, differs on the point that scale 356 (installed length in the Y-axis direction) is structured shorter than scale 56 installed on base member 54 described above. This is because when mark Mk is detected using the ALG systems, while the substrate is moved in the X direction to arrange each of the marks Mk within the observation field of each of the ALG systems, the substrate hardly has to be moved in the Y direction on the mark detection, and therefore is not that necessary to detect the movement of the substrate in the Y direction. Note that in FIG. 32, while ALG system is to be described being fixed to the lower surface of base member 354 provided at upper mount section 18a, the structure is not limited to this and the system may be fixed and provided directly at upper mount section 18a.

Base member 354 consists of a member extending in the Y-axis direction, and to the lower surface (illustrated in a solid line in FIG. 32 to facilitate understanding), four scales 356 are fixed. Of the four scales 356, the length in the Y-axis direction of the two scales on the inner side is shorter than that of the scales on the outer side. Note that in FIG. 32, while base member 354 is arranged on the −X side of the pair of encoder bases 54, the arrangement position is not limited in particular, and for example, the base member may be arranged on the +X side of the pair of encoder bases 54, may be arranged on both the +X side and the −X side of the pair of encoder bases 52, or may be arranged in between the pair of encoder bases 54.

Note that in the example shown in FIG. 32, scales 52 used for measurement in the X-axis direction are provided until the position where ALG systems are installed in X-axis direction, and at the position, head units 60 that irradiate scales 52 with measurement beams are provided. This is to prevent Abbe errors from occurring in position measurement performed by the encoder system (scales 52 and head units 60) on alignment measurement, in a relation with the mark detection position of ALG system. Therefore, in FIG. 32, the arrangement of scales 52 is not like the arrangement (in which the number or the length of scales 52 in the −X direction side and the +X direction side with projection optical system 16 in the center is almost symmetrical) shown in the first embodiment (FIG. 3A and FIG. 17B). In FIG. 32, as is illustrated, the number of scales 52 provided is larger (or scales 52 is longer as a whole) on one side (−X side) of the scanning direction side than on the other side (+X side).

Head unit 60 has the same structure as head unit 60 of substrate encoder system 50 described above (refer to FIG. 3A and the like for each part). By using this head unit 60 and scales 52 and 356, position information (X position and Y position) of substrate P is obtained in the manner similar to the embodiment described above. Also, detection operation of the plurality of marks Mk on stage substrate P is performed by moving substrate P in the X-axis direction, and appropriately positioning marks Mk directly below alignment microscopes ALG systems. Specifically, when mark Mk is captured within the visual field of each of the ALG systems, a positional relation between a predetermined position of each ALG system (e.g., center of field) and the center position of each mark Mk is detected for each of the ALG systems. Position information of each mark MK is obtained, based on the detection results of each of the ALG systems and the position information (X position and Y position) of substrate P obtained in the description above.

Note that in FIG. 32, while ALG systems were described being arranged fixed to upper mount section 18*a* (optical surface plate), the systems may be structured so that relative positional relation between the plurality of ALG systems is changeable. For example, of the plurality of ALG systems, a part of, or all of the systems is to be arranged movable in the Y direction on the optical surface plate by a drive system such as a motor or a belt, and a sensor (a distance measuring sensor, an interferometer or the like using the TOF (Time-of-Flight) method) that detects relative position change in the Y direction between ALG systems is to be provided at a movable ALG system or a fixed ALG system. This allows detection of mark Mk to be performed easily, even in a case of an arbitrary shot arrangement (mark arrangement), such as when performing a so-called six-piece setting (spacing between adjacent marks Mk in the Y-axis direction is smaller than the spacing shown in FIG. 32). Also, even in a case shot areas of different areas are included in the plurality of shot areas on one substrate P (a so-called composite setting), namely in the case marks Mk are not arranged regularly on substrate P, this can be coped with easily by controlling relative positional relation in the Y direction of the plurality of ALG systems. Note that position control of the movable ALG system in the Y-axis direction in this case is performed, based on shot map information (design coordinate position information of mark Mk) included in a recipe transmitted to the exposure apparatus by a user.

Figure 33:
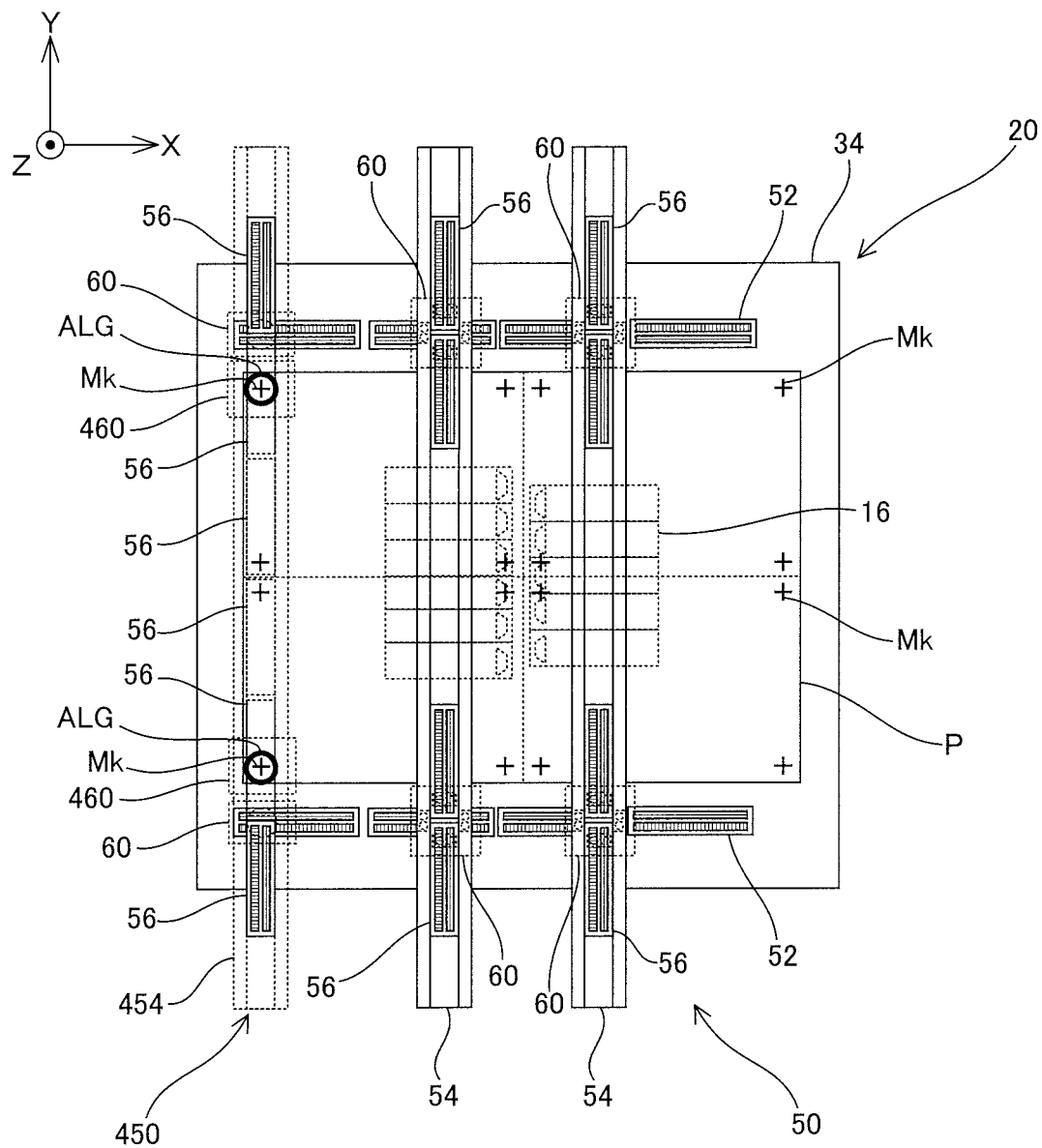
FIG. 33 is a view used to explain another structure of the substrate alignment measurement system.

Also, as an alignment microscope system movable in the Y-axis direction, a structure other than the structure shown in FIG. 32 can also be considered. Liquid crystal exposure apparatus 10 (FIG. 1) may have a substrate alignment mark measurement system 450 (hereinafter simply referred to as "ALG measurement system 450") as is shown in FIG. 33, in addition to substrate encoder system 50 described above. ALG measurement system 450 is a device that detects the plurality of marks Mk formed on substrate P. Note that while FIG. 33 is also described with four shot areas set on substrate P and with marks Mk formed in each of the four corners of the four shot areas similarly to FIG. 32, the number and arrangement position of marks Mk can be appropriately changed.

ALG measurement system 450 has a base member 454 and a pair of movable tables 460. Base member 454 is substantially the same member as encoder base 54 of substrate encoder system 50 described above (refer to FIG. 1 for each section) except for the point that the number of scales 56 is increased, and is fixed to the lower surface of upper mount section 18*a* of apparatus main section 18 (refer to FIG. 1 for each section). Base member 454 consists of a member extending in the Y-axis direction, and to the lower surface (illustrated in a solid line in FIG. 33 to facilitate understanding), more scales 356 (e.g., seven) are fixed than that of base 54. Note that while FIG. 33 is also described with base member 354 is arranged on the −X side of the pair of encoder bases 54 similarly to FIG. 32, the arrangement is not limited to this, and the base member may be arranged on the +X side of the pair of encoder bases 54, may be arranged on both the +X side and the −X side of the pair of encoder bases 52, or may be arranged in between the pair of encoder bases 54.

The pair of head units 60 arranged facing base member 454 shown in FIG. 33 is moved in the Y-axis direction synchronously with substrate holder 34 similarly to the embodiment described above, and the structure is also similar to the embodiment described above.

Furthermore, the example of FIG. 33 is equipped with a pair of movable tables 460 which is movable relatively at least on the Y direction with respect to the pair of head units 60. Movable table 460 has a structure the same as head unit 60 of substrate encoder system 50 (refer to FIG. 3A and the like for each section) described above, except for the point that movable table 460 has an alignment microscope (ALG system) including an imaging sensor instead of the four heads facing downward (the pair of X heads 66*x* and the pair of Y heads 66*y*; refer to FIG. 6). That is, movable table 460 is moved appropriately (integrally or independently) in the Y-axis direction in predetermined strokes below base member 454 by an actuator (not shown). Also, movable table 460 has four heads facing upward (the pair of X heads 64*x* and the pair of Y heads 64*y*; refer to FIG. 6). Position information of movable table 460 is obtained with high precision by an encoder system including the four heads facing upward described above and the corresponding scales 56. Note that while the number of movable tables 460 corresponding to one base member 454 is two in FIG. 33, the number is not limited in particular, and may be one, or three or more than three. Also, the movable range of movable table 460 may be larger than head unit 60, and the number of scales 54 should also be changed as appropriate.

Detection operation of the plurality of marks Mk on substrate P is performed by moving substrate P in the X-axis direction (control of X and Y positions of substrate holder 34 on this movement is performed based on the output of head unit 60 arranged facing base member 454) and appropriately positioning mark Mk directly below (within the visual field of) the ALG system, after positioning the ALG system according to the Y position (as is described above design coordinate position information of mark Mk) of mark Mk.

In ALG measurement system 450, since movable table 460, namely the Y position of ALG system can be changed arbitrarily, simultaneous detection of marks Mk can be performed easily, even if the spacing between adjacent marks Mk in the Y-axis direction changes. Accordingly, in the case, for example, spacing between adjacent marks Mk in the Y-axis direction is smaller than the case shown in FIG. 33, detection of marks Mk can be performed easily. Also, the case of the so-called composite setting can be coped easily, by appropriately controlling the Y position of movable table 360.

While the structure of the ALG system above was described based on the first embodiment described above, the structure is not limited to this, and the structure may also be applied to the second embodiment described above. Also, the structure may also be applied to the system shown in FIG. 17A described as a comparative example of the first embodiment described above.

Also, in the above mask encoder system 48 and substrate encoder system 50 of the first embodiment, the arrangement of the encoder heads and the scales may be reversed. That is, X linear encoder 92x and Y linear encoder 92y to obtain position information of mask holder 40 may have a structure in which an encoder head is attached to mask holder 40 and a scale is attached to encoder base 43. Also, X linear encoder 94x and Y linear encoder 94y to obtain position information of substrate holder 34 may have an encoder head attached to substrate holder 34 and a scale attached to Y slide table 62. In this case, it is favorable for the encoder heads attached to substrate holder 34 to have the structure in which a plurality of encoder heads are placed along the X-axis direction that can perform switching operation mutually. Similarly, X linear encoders 96x and Y linear encoders 96y for obtaining position information of Y slide table 62 may have the structure in which the scales are attached to Y slide table 62 and the encoder heads attached to encoder base 54 (apparatus main section 18). In this case, it is favorable for the encoder head attached to encoder base 54 to be a plurality of encoder heads placed along the Y-axis direction that can perform switching operation mutually. In the case the encoder heads are fixed to substrate holder 34 and encoder base 54, the scales fixed to Y slide table 62 may be shared.

Also in substrate encoder system 50, while the case has been described where a plurality of scales 52 extending in the X-axis direction are fixed to the substrate stage device 20 side and a plurality of scales 56 extending in the Y-axis direction are fixed to the apparatus main section 18 side (encoder base 54) side, the arrangement is not limited, and a plurality of scales extending in the Y-axis direction may be fixed to the substrate stage device 20 side and a plurality of scales extending in the X-axis direction may be fixed to the apparatus main section 18 side. In this case, head units 60 are driven in the X-axis direction synchronously with substrate holder 34 at the time of exposure operation of substrate P.

Also, while the case has been described where in mask encoder system 48, three scales 46 are placed apart in the X-axis direction, and in substrate encoder system 50, two scales 52 are placed apart in the Y-axis direction and four (or five) scales 56 are placed apart in the X-axis direction, the number of scales is not limited to this, and the number of scales can be appropriately changed, for example, according to the size of mask M, substrate P, or the moving strokes. Also, the plurality of scales do not necessarily have to be placed spaced apart, and for example, a longer single scale may be used (in the case of the above embodiments, for example, a scale having a length around three times as that of scale 46, a scale having a length around two times as that of scale 52, and a scale having a length around four times (or five times) as that of scale 56).

Also, in the case a plurality of scales is provided, the length of each of the scales may be different. For example, by setting the length extending in the X-axis direction longer than the length in the X-axis direction of the shot area, the linkage process performed at the time of scanning exposure operation can be avoided. The same can be said for the scales extending in the Y-axis direction. Furthermore, to cope with change in the number of shot areas (e.g., in the case of a four-piece setting and the case of a six-piece setting) the length may be different between a scale arranged on one side of projection optical system 16 and the other side of projection optical system 16.

Also, while the case has been described where X scales and Y scales are formed independently on the surface of each of the scales 46, 52, and 56, the scales are not limited to this, and XY two-dimensional scales may also be used. In this case, the encoder heads can also use the XY two-dimensional heads. Also, while the case has been described where the encoder system of a diffraction interference method is used, the system is not limited to this, and other encoders that employs a so-called pick-up method, or a magnetic encoder can be used, and a so-called scan encoder like the one disclosed in, for example, U.S. Pat. No. 6,639, 686 can also be used. Also, position information of Y slide table 62 may be acquired by a measurement system other than the encoder system (e.g., an optical interferometer system).

Figure 34:
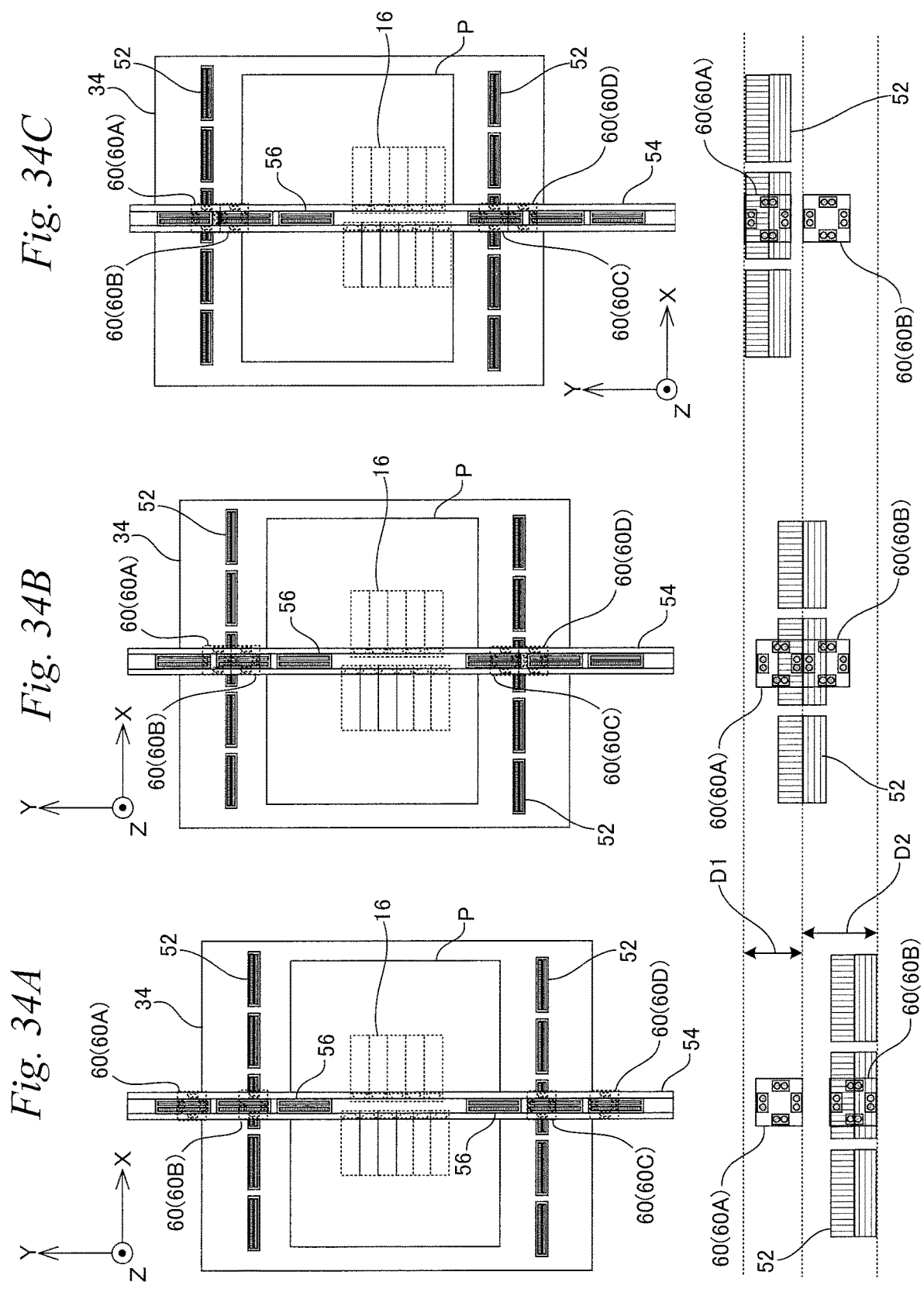
FIGS. 34A to 34C are views (No. 1 to No. 3) used to explain a structure of a modified example in a second embodiment.

Also, the same effect can be obtained as the effect of the second embodiment described above even in a structure shown in FIG. 34 (modified example 1) is employed, instead of the structure in the second embodiment (FIG. 18) described above. In FIG. 34 (modified example 1), one row of scales 52 is arranged in each of the areas vertical (the +Y side and the −Y side) to projection optical system 16 on substrate holder 34. Also, heads 60 that can each move in the Y-axis direction are arranged in a plurality of numbers (two each in FIG. 34) in each of the areas vertical (the +Y side and the −Y side) to projection optical system 16. FIGS. 34A to 34C show a transition from a state shown in FIG. 34A on a stepping movement of substrate holder 34 in the Y-axis direction. Also, the drawings in the lower part of each of the figures are views representatively showing a positional relation between scale 52 and head 60 during the stepping movement in the Y-axis direction, using the structure (heads 60A and 60B, and scale 52) illustrated on the upper side. Since the relation in the structure (heads 60C and 60D, and scale 52) illustrated on the lower side is equivalent to that of the structure illustrated on the upper side, the structure illustrated on the upper side will mainly be used in the description below.

In FIG. 34, one of the heads 60A (60C) of the pair of heads 60A and 60B (60C and 60D) is structured movable only by a range D1 in the Y-axis direction. The other head 60B (60D) is structured movable only by a range D2 in the Y-axis direction. This structure allows the movable range (D1+D2) in the Y-axis direction of scale 52 (substrate holder 34) to be covered by the pair of heads 60A and 60B. In other words, the range in which one movable head 60 moves in the Y-axis direction synchronously with the movement of scale 52 shown in the first embodiment (FIG. 3A) described above is to be covered shared by two movable heads 60A and 60B in the structure described in modified example 1. As is shown in FIG. 34A, when scale 52 moves in the range of D2 in the Y-axis direction, head 60B moves synchronously with scale 52. In the case scale 52 performs step movement to a position where scale 52 crosses over the border of range D1 and range D2, each of the two heads 60A and 60B simultaneously performs measurement of scale 52, as is shown in FIG. 34B. Based on the outputs of each of the heads 60A and 60B obtained by the simultaneous measurement, the head used for position measurement is switched from head 60B to head 60A (in other words, an initial value of the output of head 60A is set). After that, in the case stepping movement of scale 52 is performed further in the Y-axis direction, head 60A moves synchronously with scale 52. By employing the structure of the plurality of (the pair of) movable heads 60A and 60B as is described, the size of encoder base 54 can be reduced (the number of scales 56 reduced) in the Y-axis direction, and the movement range of each of the heads can be shortened.

Note that in the modified example 1 shown in FIG. 34, while the movable range (D1 and D2) in the Y-axis direction of the pair of heads 60A and 60B is structured continuously, the movable range may be structured in a partly overlapping manner.

Figure 35:
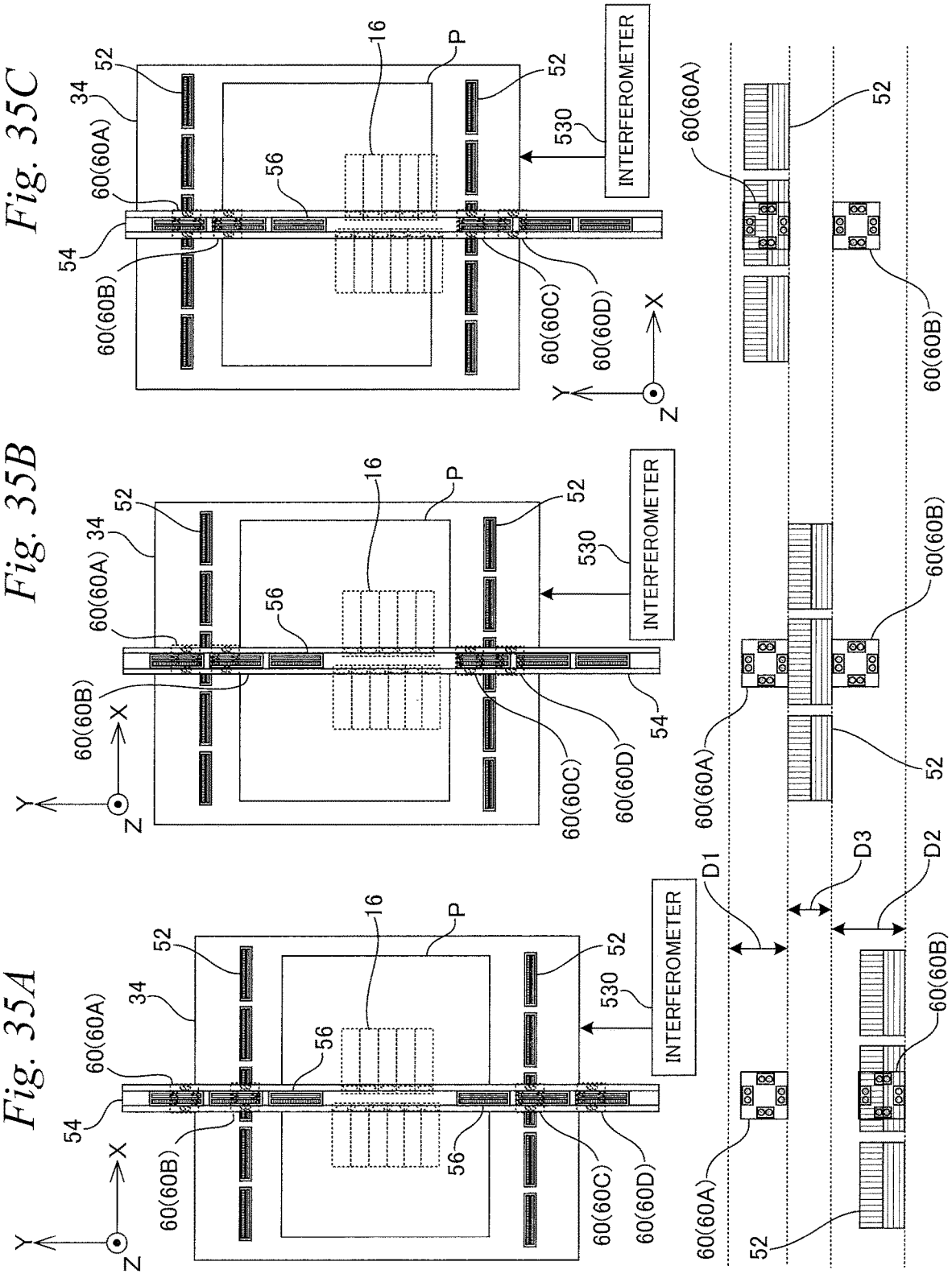
FIGS. 35A to 35C are views (No. 1 to No. 3) used to explain a structure of another modified example in the second embodiment.

Also, the same effect can be obtained as the effect of the second embodiment described above even in a structure shown in FIG. 35 (modified example 2) is employed, instead of the structure in the second embodiment (FIG. 18) described above. The difference between modified example 1 (FIG. 34) described above and this modified example 2 is that in modified example 1, while the movable range in the Y-axis direction of movable heads 60A and 60B is continuous or overlapping, in modified example 2, a range D3 exists to which neither of the movable heads 60A and 60B can move (are not positioned), and an interferometer 530 is provided which measures the position in the Y-axis direction of scale 52 (substrate holder 34). In the description below, the difference will be mainly described.

Of a pair of heads 60A and 60B (60C and 60D), one of the heads 60A (60C) is structured movable only by a range D1 in the Y-axis direction. The other head 60B (60D) is structured movable only by a range D2 in the Y-axis direction. However, a range D3 exists in which both heads 60A and 60B cannot follow the movement of scale 52. When scale 52 performs stepping movement in the Y-axis direction in this range D3, the position in the Y-axis direction of scale 52 is monitored using the output of interferometer 530. This structure allows the movable range (D1+D2+D3) in the Y-axis direction of scale 52 (substrate holder 34) to be covered by the pair of heads 60A and 60B and interferometer 530. In other words, the range in which one movable head 60 moves in the Y-axis direction synchronously with the movement of scale 52 shown in the first embodiment (FIG. 3A) described above is to be covered shared by two movable heads 60A and 60B and interferometer 530 in the structure described in modified example 1. As is shown in FIG. 35A, when scale 52 moves in the range of D2 in the Y-axis direction, head 60B moves synchronously with scale 52. When scale 52 performs stepping movement in range D3, position information of substrate holder 34 is obtained using the output of interferometer 530 and the output of head 60B of the latest measurement in range D2. When stepping movement of scale 52 is performed to range D1, an initial value of head 60A is set using the output of interferometer 530 and the output of head 60B of the latest measurement in range D2. After that, in the case stepping movement of scale 52 is performed further in the Y-axis direction, head 60A moves synchronously with scale 52. By employing the structure in this way, in addition to the effect of the second embodiment described above, by using the interferometer in a part of the stepping movement section, the movable range of each of the heads can be made shorter.

Note that while the plurality of heads 60A to 60D are of a movable type in modified example 2, by using the interferometer, the plurality of heads may also be of a fixed type. For example, the plurality of heads 60A to 60D may be arranged fixed to the optical surface plate at positions in the Y-axis direction decided in advance according to the shot size (shot map). As an example, head 60A may be arranged fixed to the upper edge of range D1 in FIG. 35, head 60B may be arranged fixed to the lower edge of range D2 in FIG. 35 (the state in FIG. 35A), and the length measurement range of interferometer 530 may almost be the total area of D1+D2+D3. The heads will not have to be of the movable type in this arrangement.

Note that in each of the embodiments described above, X scale (grating pattern for X-axis direction measurement shown in the drawings) and Y scale (grating pattern for Y-axis direction measurement shown in the drawings) are structured so that the X scale and the Y scale are provided on members for scales (e.g., a plurality of scale members arranged on the encoder base) which are independent from each other. However, the plurality of grating patterns may be formed on the same long member for scales separately in groups of grating patterns. Or the grating patterns may be continuously formed on the same long member for scales.

Also, on substrate holder 34, in the case a scale group (a row of scales) in which a plurality of scales is arranged in an extended manner via a gap of a predetermined spacing in the X-axis direction is arranged in a plurality of rows at different positions apart from one another in the Y-axis direction (e.g., a position on one side (+Y side) and a position on the other side (−Y side) with respect to projection optical system 16), in the plurality of rows, the position of the gap of a predetermined spacing described above may be arranged so that the position of the gap does not overlap in the X-axis direction. If the plurality of rows of scales is arranged in this manner, then the heads arranged corresponding to each of the row of scales do not move off of the measurement range simultaneously (in other words, both heads do not face the gap simultaneously).

Also, on substrate holder 34, in the case a scale group (a row of scales) in which a plurality of scales is arranged in an extended manner via a gap of a predetermined spacing in the X-axis direction is arranged in a plurality of rows at different positions apart from one another in the Y-axis direction (e.g., a position on one side (+Y side) and a position on the other side (−Y side) with respect to projection optical system 16), a structure may be employed in which the plurality of scale groups (the plurality of rows of scales) can be selected and used properly, based on the arrangement of shots on the substrate. For example, if the length of the plurality of rows of scales as a whole is different from one another in the rows of scales, different shot maps can be coped with, and changes in the number of shot areas formed on the substrate can also be coped with such as in the case of a four-piece setting and the case of a six-piece setting. Also, along with this arrangement, if the position of the gap of each of the row of scales is set to different positions in the X-axis direction, then the heads arranged corresponding to each of the plurality of rows of scales do not move off of the measurement range simultaneously, therefore, the number of sensors which is considered to be an undefined value in the linkage process can be reduced, which allows the linkage process to be performed with high precision.

Also, in a scale group (row of scales) in which a plurality of scales are arranged in an extended manner via a gap of a predetermined spacing in the X-axis direction on substrate holder 34, the length in the X-axis direction of one scale (pattern for measurement of the X-axis) may be a length in which measurement can be performed continuously only by a length of one shot area (the length in which a device pattern is irradiated and formed on the substrate when scanning exposure is performed while the substrate on the substrate holder is moved in the X-axis direction). When this is employed, connection control of the heads with respect to the plurality of scales will not have to be performed during the scanning exposure of the one shot area, which allows position measurement (position control) of substrate P (substrate holder) during the scanning exposure to be simplified.

Also, in the scale group (row of scales) in which a plurality of scales are arranged in an extended manner via a gap of a predetermined spacing in the X-axis direction on substrate holder 34, while scales of the same length are arranged in an extended manner in the embodiment described above, scales with lengths different from one another may be arranged in an extended manner. For example, in the row of scales on substrate holder 34, the length in the X-axis direction of the scales may be made physically longer in the scales arranged in the center than the scales arranged near both edges (scales arranged at each of the edges in the row of scales) in the X-axis direction.

Also, in the embodiment described above, in the scale group (row of scales) in which a plurality of scales are arranged in an extended manner via a gap of a predetermined spacing in the X-axis direction on substrate holder 34, distance between the plurality of scales (in other words, length of the gap), length of one scale, and two heads (heads that are arranged facing each other inside one head unit 60, e.g., two heads 66x shown in FIG. 6) that relatively move with respect to the row of scales are arranged so that a relation of "one scale length>distance between heads arranged facing each other>distance between scales" is satisfied. This relation is satisfied not only by the scales provided on substrate holder 34 and heads 60 corresponding to the scales, but is also satisfied by scales 56 provided on encoder base 54 and heads 60 corresponding to scales 56.

Also, in each of the embodiments described above (e.g., refer to FIG. 6), while the pair of X heads 66x and the pair of Y heads 66y are arranged lined in the X-axis direction each forming a pair (X head 66x and Y head 66y are arranged at the same position in the X-axis direction), the heads can be shifted and arranged relatively in the X-axis direction.

Also, in each of the embodiments described above (e.g., refer to FIG. 6), while X scale 53x and Y scale 53y are formed in the same length in the X-axis direction within scale 52 formed on substrate holder 34, the length may be made different from each other. Also, both X scale 53x and Y scale 53y may be arranged relatively shifted in the X-axis direction.

Note that on relative movement in the X-axis direction of an arbitrary head 60 and the corresponding row of scales (a row of scales arranged in which a plurality of scales is arranged in an expanding manner in a predetermined direction via a predetermined gap), in the case the pair of heads (e.g., X head 66x and Y head 66y in FIG. 6) within head 60 faces another scale simultaneously (in the case heads 66x and 66y move off to irradiate another scale), after simultaneously facing the gap between the scales described above, the measurement initial values of the heads that have moved off has to be calculated. At the time, the initial values of the heads that have moved off may be calculated on the movement, using the outputs of the remaining pair of heads (66x and 66y) within head 60 separate from the heads that have moved off, and yet another head (a head arranged apart in the X-axis direction as well as at a position whose distance with the head moving away is shorter than the scale length). The another head described above may be a head used for position measurement in the X-axis direction or a head used for position measurement in the Y-axis direction.

Also, in each of the embodiments described above, while there is a situation in which head 60 is described to move synchronously with substrate holder 34, this means that head 60 is moved in a state roughly maintaining the relative positional relation with respect to substrate holder 34, and is not limited to the case in which the movement is performed in a state with the positional relation, movement direction, and movement speed between head 60 and substrate holder 34 being an exact match.

Also, the substrate encoder system according to each of the embodiments described above may have a scale for substrate exchange provided at substrate stage device 20 or at another stage device to obtain position information of substrate stage device 20 while the substrate stage device is moved to a substrate exchange position of the substrate loader, and a head facing downward (such as X head 66x) may be used to obtain the position information of substrate stage device 20. Or, the position information of substrate stage device 20 may be obtained by providing a head used for substrate exchange at substrate stage device 20 or at another stage device, and measuring scale 56 or a scale used for substrate exchange.

Also, the mask encoder system according to each of the embodiments described above may have a scale for mask exchange provided at mask stage device 14 or at another stage device to obtain position information of mask stage device 14 while the mask stage device is moved to a mask exchange position of the mask loader, and head unit 44 may be used to obtain the position information of mask stage device 14. Or, a position measurement system other than the encoder system (e.g., a mark on a stage and an observation system to observe the mark) may be provided to perform exchange position control (management) of the stages.

Also, while encoder base 54 having the plurality of scales 56 was structured being directly attached to the lower surface of upper mount section 18a (optical surface plate), the embodiments are not limited to this, and a predetermined base member may be arranged suspended in a state placed apart from the lower surface of upper mount section 18a, and encoder base 54 may be attached to the base member.

Also, substrate stage device 20 only has to drive at least substrate P along a horizontal plane in long strokes, and in some cases, does not have to perform fine positioning in directions of six degrees of freedom. The substrate encoder system according to each of the embodiments described above can be suitably applied, even to such two-dimensional stage devices.

Also, in the embodiments described above, while substrate holder 34 was described as having a structure movable in the X-axis direction and the Y-axis direction to move substrate P on substrate holder 34 in the X-axis direction and the Y-axis direction, the structure is not limited to this. For example, substrate holder 34 can be structured so that substrate P is supported in a non-contact manner (e.g., air levitation support). Substrate P is structured to be held by a holding member integrally movable with substrate holder 34 while being supported by levitation by substrate holder 34, so that substrate P can be moved synchronously moved with the movement of substrate holder 34. Also, a second substrate drive system is structured separately that relatively moves the holding member with respect to substrate holder 34 while supporting substrate P on substrate holder 34 in a non-contact manner. And, a structure is employed in which the holding member moves synchronously with substrate holder 34 in one of the axial directions of the X-axis direction and the Y-axis direction, and moves relatively with respect to substrate holder 34 as for the other axial direction. When the exposure apparatus is structured in the manner described so far, on moving substrate P supported by levitation on substrate holder 34 in a two-dimensional direction, the holding member is moved using substrate holder 34 when moving substrate P in one of the axial directions (e.g., the X-axis direction), and the holding member is moved using the second substrate drive system when moving substrate P in the other axial direction (e.g., the Y-axis direction).

Also, in the embodiments described above, while the structure is employed of obtaining position information (X position information and Y position information) of substrate P (substrate holder 34), based on the output of the encoder system (e.g., scale 52 and heads 66$x$ and 66$y$ in FIG. 6) that measures the movement of substrate holder 34 and the output of the encoder system (e.g., scale 56 and heads 64$x$ and 64$y$ in FIG. 6) that measures the movement of head unit 60 with respect to apparatus main section (optical surface plate 18$a$), a separate measurement system other than the encoder system such as a measurement system like an optical interferometer system may be used as one of the encoder systems to obtain the position information. Also, the substitute for the measurement system is not limited to an optical interferometer system, and measurement systems of other methods (laser distance meter, a sonar range finder and the like) may also be used, as long as the system can measure the X, the Y, and the θz of the measuring object (head unit 60 and substrate holder 34) while the object is being moved.

Also, the illumination light may be an ultraviolet light such as an ArF excimer laser beam (wavelength 193 nm) or a KrF excimer laser beam (wavelength 248 nm), or a vacuum ultraviolet light such as an $F_2$ laser beam (wavelength 157 nm). Also, as the illumination light, a harmonic wave may be used, which is a single-wavelength laser beam in the infrared or visual region oscillated from a DFB semiconductor laser or a fiber laser as vacuum ultraviolet light that is amplified by a fiber amplifier doped by, e.g. erbium (or both erbium and ytterbium), and then is subject to wavelength conversion into ultraviolet light using a nonlinear crystal. Also, a solid laser (wavelengths: 355 nm, 266 nm) may also be used.

Also, while the case has been described where projection optical system 16 is a projection optical system of a multiple lens method equipped with a plurality of optical systems, the number of projection optical systems is not limited to this, and one or more will be fine. Also, the projection optical system is not limited to the projection optical system of a multiple lens method, and may also be an Offner type projection optical system which uses a large mirror. Also, as projection optical system 16, a magnifying system or a reduction system may also be used.

Also, the exposure apparatus is not limited to the exposure apparatus for liquid crystals which transfers the liquid crystal display device pattern onto a square-shaped glass plate, and may also be widely applied to an exposure apparatus for manufacturing organic EL (Electro-Luminescence) panels, an exposure apparatus for manufacturing semiconductors, or to an exposure apparatus for manufacturing thin film magnetic heads, micromachines, and DNA chips. Also, the above embodiments can be applied not only to an exposure apparatus for manufacturing microdevices such as semiconductors, but also to an exposure apparatus that transfers a circuit pattern onto a glass substrate or a silicon wafer to manufacture a mask or a reticle used in an optical exposure apparatus, an EUV exposure apparatus, an X-ray exposure apparatus, and an electron-beam exposure apparatus.

Also, the object subject to exposure is not limited to a glass plate, and may also be other objects such as a wafer, a ceramic substrate, a film member, or a mask blank. Also, in the case the exposure object is a substrate for a flat panel display, the thickness of the substrate is not limited in particular, and includes a film-like substrate (a sheet-like member having flexibility). Note that the exposure apparatus of the embodiment is especially effective in the case when the exposure object is a substrate whose length of one side or diagonal length is 500 mm or more.

Electronic devices such as liquid crystal display devices (or semiconductor devices) are manufactured through the steps such as; a step for performing function/performance design of a device, a step for making a mask (or a reticle) on the basis of this design step, a step for making a glass substrate (or a wafer), a lithography step for transferring a pattern of a mask (reticle) onto the glass substrate by the exposure apparatus and the exposure method described in each of the embodiments described above, a development step for developing the glass substrate which has been exposed, an etching step for removing by etching an exposed member of an area other than the area where the resist remains, a resist removing step for removing the resist that is no longer necessary since etching has been completed, a device assembly step, and an inspection step. In this case, in the lithography step, because the device pattern is formed on the glass substrate by carrying out the exposure method previously described using the exposure apparatus of the embodiments described above, a highly integrated device can be manufactured with good productivity.

Note that the disclosures of U.S. Patent Applications Publications and U.S. Patents related to the exposure apparatus and the like quoted in the embodiments above, in their entirety, are incorporated herein by reference as apart of the present specification.

INDUSTRIAL APPLICABILITY

As is described so far, the exposure apparatus of the present invention is suitable for exposing an object. Also, the flat panel display manufacturing method of the present invention is suitable for producing flat panel displays. Also, the device manufacturing method of the present invention is suitable for manufacturing microdevices.

REFERENCE SIGNS LIST

10 . . . liquid crystal exposure apparatus,
14 . . . mask stage device,
20 . . . substrate stage device,
34 . . . substrate holder,
40 . . . mask holder,
44 . . . head unit,
46 . . . scale,
48 . . . mask encoder system,
50 . . . substrate encoder system,
52 . . . scale,
56 . . . scale,
60 . . . head unit,
90 . . . main controller,
M . . . mask,
P . . . substrate.

The invention claimed is:

1. An exposure apparatus that irradiates an object held by a first movable body which moves in a first direction and a second direction orthogonal to each other with an illumination light via an optical system, while the first movable body is moving in the first direction, comprising:
   a first measured section measured based on movement of the first movable body in the first direction, the first measured section being provided on the first movable body;
   a first measuring section measuring the first measured section while relatively moving in the first direction with respect to the first measured section, based on movement of the first movable body in the first direction;
   a plurality of second measured sections arranged at different positions in the first direction, being measured based on movement of the first movable body in the second direction;
   a plurality of second measuring sections arranged at each of the plurality of second measured sections that measures the second measured sections while relatively moving in the second direction with respect to the second measured section, based on movement of the first movable body in the second direction;
   a holding member, at which the plurality of second measured sections are provided, that holds the optical system; and
   a second movable member that holds the first measuring section and the plurality of second measuring sections and that moves the first measuring section and the plurality of second measuring sections integrally in the second direction and between the first movable body and the holding member, wherein
   the first measuring section comprises a first measuring section unit and a second measuring section unit arranged at different positions in the first direction, each being configured to irradiate the first measured section with a measurement beam, and
   the measurement beam irradiated by one of the first measuring section unit and the second measuring section unit moves off the first measured section, while the second measuring sections measure the second measured sections and the other of the first measuring section unit and the second measuring section unit irradiates the first measured section with the measurement beam.

2. The exposure apparatus according to claim 1, wherein position information of the first movable body in the first direction and the second direction is obtained, based on an output of the first measuring section and an output of the plurality of second measuring sections.

3. The exposure apparatus according to claim 1, wherein position information in the first direction is obtained
   based on an output of the first measuring section and the plurality of second measuring sections on the relative movement with respect to the first measured section, based on movement of the first movable body in the first direction, and
   position information in the second direction is obtained based on an output of the first measuring section and the plurality of second measuring sections on the relative movement with respect to the plurality of second measured sections, based on movement of the first movable body in the second direction.

4. The exposure apparatus according to claim 3, wherein the first measured section includes a first grating member in which a plurality of grating areas is arranged separately in the first direction,
   the first measuring section includes a head irradiating the first grating member with a measurement beam,
   at least one of the plurality of second measured sections includes a second grating member in which a plurality of grating areas is arranged separately in the second direction, and
   at least one of the plurality of second measuring sections includes a head irradiating the second grating member with a measurement beam.

5. The exposure apparatus according to claim 1, wherein the plurality of second measured sections is arranged at separate positions in the first direction.

6. The exposure apparatus according to claim 1, wherein the optical system comprises a plurality of lens modules including a plurality of projection lenses arranged side by side in the second direction that irradiates a substrate with the illumination light,
   the plurality of lens modules is arranged separately in the first direction, and
   the plurality of second measured sections is arranged so that positions in the first direction overlap with respect to each of the plurality of lens modules.

7. The exposure apparatus according to claim 1, wherein the apparatus has a mark measurement system that measures a mark formed on a substrate,
   the optical system includes a projection optical system that irradiates the substrate with the illumination light, and
   the plurality of second measured sections is arranged so that positions in the first direction overlap with respect to each of the mark measurement system and the projection optical system.

8. The exposure apparatus according to claim 7, wherein of the plurality of second measured sections, a second measured section corresponding to the mark measurement system is structured so that a length in the second direction is shorter than that of a second measuring section corresponding to the projection optical system.

9. The exposure apparatus according to claim 7, wherein the mark measurement system is provided in a plurality of numbers arranged apart in the second direction, and with relative spacing between at least two mark measurement systems being changeable.

10. The exposure apparatus according to claim 1, wherein a predetermined pattern is formed on the object using an energy beam as the illumination light.

11. The exposure apparatus according to claim 1, wherein the object is a substrate used in a flat panel display.

12. The exposure apparatus according to claim 11, wherein
    the substrate has at least one of a length of a side and a diagonal length that is 500 mm or more.

13. A making method of a flat panel display, comprising:
    exposing the object using the exposure apparatus according to claim 1, and
    developing the object which has been exposed.

14. A device manufacturing method, comprising:
    exposing the object using the exposure apparatus according to claim 1; and
    developing the object which has been exposed.

* * * * *